(12) United States Patent
Shimizu

(10) Patent No.: US 6,910,262 B2
(45) Date of Patent: Jun. 28, 2005

(54) ELECTRIC-COMPONENT HANDLING DEVICE

(75) Inventor: Koji Shimizu, Nukata-gun (JP)

(73) Assignee: Fuji Machine MFG. Co., Ltd., Chiryu (JP)

( * ) Notice: Subject to any disclaimer, the term of this patent is extended or adjusted under 35 U.S.C. 154(b) by 659 days.

(21) Appl. No.: 09/941,679

(22) Filed: Aug. 30, 2001

(65) Prior Publication Data

US 2002/0031279 A1 Mar. 14, 2002

(30) Foreign Application Priority Data

Sep. 13, 2000 (JP) ........................................ 2000-277902

(51) Int. Cl.⁷ .............................................. B23P 19/00
(52) U.S. Cl. ............................. 29/743; 29/740; 29/741; 29/721; 29/712; 29/DIG. 44; 29/834
(58) Field of Search ......................... 29/739–743, 721, 29/712, DIG. 44, 832–834; 294/2, 64.1; 414/783, 787, 754; 901/47, 40, 17; 382/291

(56) References Cited

U.S. PATENT DOCUMENTS

| | | | | |
|---|---|---|---|---|
| 5,541,834 A | * | 7/1996 | Tomigashi et al. ............ 700/59 |
| 5,667,129 A | * | 9/1997 | Morita et al. ................ 228/102 |
| 5,878,484 A | * | 3/1999 | Araya et al. ................... 29/740 |
| 5,908,282 A | * | 6/1999 | Onodera ...................... 414/783 |
| 5,911,456 A | * | 6/1999 | Tsubouchi et al. ............. 29/833 |
| 6,076,394 A | * | 6/2000 | Tsuda et al. .................... 73/37 |
| 6,718,626 B2 | * | 4/2004 | Kawada ........................ 29/740 |
| 6,739,036 B2 | * | 5/2004 | Koike et al. ................... 29/743 |

FOREIGN PATENT DOCUMENTS

JP   A 11-40996   2/1999

OTHER PUBLICATIONS

U.S. Appl. No. 09/947,363, filed Sep. 7, 2001, Kawada.
U.S. Appl. No. 09/948,583, filed Sep. 10, 2001, Koike et al.

* cited by examiner

Primary Examiner—Minh Trinh
(74) Attorney, Agent, or Firm—Oliff & Berridge, PLC

(57) ABSTRACT

An electric-component handling device includes a suction nozzle, fiducial mark, an image-taking device, a relative-movement device and an image data processing device. The electric-component handling device is operable to handle an electric component.

8 Claims, 23 Drawing Sheets

70 NEGATIVE-PRESSURE SOURCE (VACUUM SOURCE)
82 POSITIVE-PRESSURE SOURCE

70 NEGATIVE-PRESSURE SOURCE (VACUUM SOURCE)
82 POSITIVE-PRESSURE SOURCE

ELECTRIC-COMPONENT HANDLING DEVICE

This application is based on Japanese Patent Application No. 2000-277902 filed on Sep. 13, 2000, the contents of which are incorporated hereinto by reference.

BACKGROUND OF THE INVENTION

1. Field of the Invention

The present invention relates to a suction nozzle for holding electric components (including electronic components) by suction under a negative or reduced pressure (under vacuum), a method of detecting the position of the electric component as held by the suction nozzle, a method of detecting a bending of a suction pipe of the suction nozzle, a method of determining the angular position of the suction nozzle, a method of compensating the angular position of the suction nozzle, and a device arranged to handle the electric components.

2. Discussion of Related Art

For instance, a suction nozzle is used in an electric-component mounting system arranged to mount electronic components and other electric components on printed-wiring boards. In this instance, the suction nozzle is moved relative to an electric-component supply device and the printed-wiring board, for receiving the electric components from the electric-component supply device, and is operated to mount or place the electric components on the printed-wiring board. Generally, an image of the electric component held by suction by the suction nozzle is taken during a movement of the electric component from the electric-component supply device to the printed-wiring board, to detect the position of the electric component (as held by the suction nozzle) relative to the suction nozzle holding the electric component (hereinafter referred to as "hold position of the electric component"). Where the position to which the suction nozzle is moved is defined with respect to an axis of a nozzle holder which holds the suction nozzle, for example, the hold position of the electric component is defined as a relative position between the center of the electric component in a plane perpendicular to the axis of the nozzle holder, and the axis of the nozzle holder. Where the suction nozzle is adapted to hold the electric component such that the center of the electric component is aligned with the axis of the nozzle holder, the relative position between the center of the electric component and the axis of the nozzle holder represents an error of the hold position of the electric component held by the suction nozzle. If the error of the hold position of the electric component is detected, the hold position is compensated to eliminate the error, so that the electric component can be mounted on the printed-wiring board, as required.

From the standpoint of detecting the hold position of the electric component, it is desirable that an image of each electric component as held by the suction nozzle be taken while the electric component is held stationary with respect to an image-taking device. In this case where each electric component is stopped for taking its image, however, the required time from the moment at which the electric component is sucked to the moment at which the electric component is mounted on the printed-wiring board is inevitably increased, so that the efficiency of mounting of the electric components on the printed-wiring boards is accordingly lowered. In view of this drawback, it may be considered to take the image of the electric component without stopping the electric component, that is, while the electric component is in the process of moving. Where a nozzle moving device provided to move the electric components uses servomotors as the drive device, for example, the image of each electric component as held by the suction nozzle is taken by activating a strobe light or opening a shutter of the image-taking device, at the moment when the angles of rotation of the servomotors as detected by encoders have increased to predetermined values at which the suction nozzle is brought to a predetermined image-taking position at which the axis of the nozzle holder is located at the center of an imaging area of the image-taking device, for instance.

In the case indicated above, however, the image of the electric component is not necessarily taken when the axis of the nozzle holder is actually located at the center of the imaging area of the image-taking device. Where the image-taking device is activated when the outputs of the encoders have reached the predetermined values, for instance, there generally arises a delay between the moment at which the outputs of the encoders have reached the predetermined values and the moment at which the image of the electric component is actually taken by the image-taking device, so that the image of the electric component is taken when the axis of the nozzle holder is actually located apart from the center of the imaging area of the image-taking device. However, the hold position of the electric component held by the suction nozzle is calculated on an assumption that the axis of the nozzle holder is aligned with the center of the imaging area of the image-taking device, so that the error of the hold position as calculated includes a deviation of the axis of the nozzle holder from the center of the imaging area, resulting in deterioration of the accuracy of detection of the hold position of the electric component. The amount of the deviation of the axis of the nozzle holder with respect to the center of the imaging area increases with an increase in the speed of movement of the suction nozzle (nozzle holder), so that the amount of this deviation can be reduced by reducing the speed of movement of the suction nozzle. However, the reduction of the speed of movement of the electric component results in an increase in the time required for moving the electric component from the electric-component supply device to the printed-wiring board, and consequent reduction in the efficiency of mounting of the electric component.

SUMMARY OF THE INVENTION

It is therefore an object of the present invention to make it possible to assure highly accurate detection of the hold position of the electric component as held by the suction nozzle, while the suction nozzle is being moved at a sufficiently high speed.

The above object may be achieved according to any one of the following modes of the present invention in the form of a suction nozzle, a method of detecting the hold position of an electric component, a method of detecting a bending of a suction pipe of the suction nozzle, a method of determining the angular position of the suction nozzle, a method of compensating the angular position of the suction nozzle, or a device for handling the electric component. Each of the following modes of the invention is numbered like the appended claims and depends from the other mode or modes, where appropriate, to indicate and clarify possible combinations of elements or technical features. It is to be understood that the present invention is not limited to the technical features or any combinations thereof which will be described for illustrative purpose only. It is to be further understood that a plurality of elements or features included in any one of the following modes of the invention are not necessarily provided all together, and that the invention may be embodied without some of the elements or features described with respect to the same mode.

(1) A suction nozzle for holding an electric component by suction, comprising:
a nozzle body;
a suction pipe disposed on the nozzle body and operable to hold the electric component by suction under a negative pressure at a sucking end thereof; and
a fiducial mark disposed on the nozzle body and located at a position at which an image of the fiducial mark can be taken concurrently with an image of the electric component held by said suction pipe, in a longitudinal direction of the suction pipe toward the sucking end.

To permit the image of the fiducial mark to be taken concurrently with the image of the electric component, the following three conditions must be satisfied: (a) An image-taking device can be focused on both of the electric component held by the suction nozzle and the fiducial mark, so as to permit clear imaging of the electric component and the fiducial mark; (b) A distance between the suction pipe and the fiducial mark in a direction perpendicular to the centerline of the suction pipe is determined to permit the images of the fiducial mark and the electric component to be located within an imaging area of the image-taking device; and (c) The fiducial mark is not hidden by the electric component held by the suction pipe.

From the standpoint of focusing of the image-taking device, the fiducial mark is desirably located close to the bottom surface of the electric component held by the suction pipe, in the longitudinal direction of the suction pipe. From the standpoint of avoiding an interference of the fiducial mark (a portion of the nozzle body at which the fiducial mark is disposed) with any member near the fiducial mark, on the other hand, the fiducial mark is desirably spaced from the sucking end face of the suction pipe in the longitudinal direction of the suction pipe away from the sucking end face toward the nozzle body. Accordingly, the fiducial mark is desirably located close to the sucking end face of the suction pipe but spaced from the sucking end face by a suitable distance in the longitudinal direction of the suction pipe away from the sucking end face toward the nozzle body, for instance, by a distance slightly larger than a difference between the largest and smallest height dimensions of a plurality of kinds of the electric components to be mounted by the suction nozzle on a circuit substrate such as a printed-wiring board. According to this arrangement, the fiducial mark will not interfere with the electric components already mounted on the circuit substrate such as a printed-wiring board, where the suction nozzle is used to hold the electric component, for mounting the electric component on the circuit substrate. Where different kinds of the suction nozzle are used to mount different kinds of electric components having different height dimensions on the same circuit substrate, some of the electric components which have already been mounted on the circuit substrate by some of the suction nozzles have larger height dimensions than the height dimension of the electric component to be mounted by the suction nozzle in question. In this case, there is a comparatively high possibility of an interference of the fiducial mark with the already mounted electric components having the larger height dimensions. Actually, however, different kinds of the electric components are usually mounted in a predetermined order such that the electric component having a comparatively small size or height dimension is mounted before the electric component having a comparatively large size or height dimension. Accordingly, where the electric components having respective different height dimensions are mounted using a certain kind of the suction nozzle, the height dimensions of all of the electric components which have been mounted are usually smaller than the largest one of the height dimensions of the electric components which are to be mounted with the above-indicated kind of the suction nozzle.

The image of the fiducial mark disposed on the nozzle body of the suction nozzle can be utilized to detect a relative position between the electric component and a nominal position of the suction pipe, detect a bending of the suction pipe, determine or detect the angular position of the suction nozzle, and correct the angular position of the suction nozzle, for instance, according to methods according to the following modes (4)–(10) of the present invention which will be described. When the electric component is held by suction by the suction pipe, the image of the sucking end face of the suction pipe is not obtained, but the image of the fiducial mark disposed on the nozzle body together with the suction pipe is obtained. Since the relative position between the fiducial mark and the nominal position of the suction pipe is known, the nominal position of the suction pipe can be determined on the basis of the position of the fiducial mark and the known relative position. Since the image of the fiducial mark is obtained together with the image of the electric component, the position of the electric component relative to the nominal position of the suction pipe can be detected with high accuracy. The fiducial mark has further functions such as a function as a reference mark for determining the angular position of the suction nozzle. These functions of the fiducial mark permit the above-indicated methods to be practiced.

The suction nozzle may be arranged such that the fiducial mark is retracted toward the nozzle body or accommodated within the nozzle body when the electric component is mounted on the substrate body. This arrangement eliminates a need of determining the position of the fiducial mark upon imaging of the fiducial mark, so as to avoid an interference of the fiducial mark with the electric components already mounted on the circuit substrate when the electric component is mounted on the circuit substrate. For instance, the above-indicated position of the fiducial mark may be determined such that the fiducial mark is located near or aligned with the sucking end face of the suction pipe (with the bottom surface of the electric component held by the suction pipe) in the axial direction of the suction pipe, so that the image-taking device can take clear images of the sucking end face of the suction pipe or the electric component and the fiducial mark.

The term "suction pipe" is interpreted to mean any generally elongate hollow member having a passage formed therethrough for establishing the negative pressure at the sucking end. The suction pipe is not limited to a pipe having a constant diameter, but may include a tapered pipe having the smallest diameter at the sucking end the suction pipe is not limited to a hollow member having a circular cross sectional shape, but may be a hollow member whose cross sectional shape is not circular.

(2) A suction nozzle according to the above mode (1), wherein the fiducial mark is provided at an end of a pin which extends from said nozzle body in parallel with the suction pipe.

Where the fiducial mark is provided at the end of a pin, it is possible to avoid an interference of the fiducial mark with the electric components already mounted on the circuit substrate, while permitting the fiducial mark to be located as close as possible to the bottom surface of the electric component held by the suction pipe, but spaced from the end face of the suction pipe in the direction away from the end face toward the nozzle holder, when the electric component held by the suction nozzle is mounted on the circuit substrate. Preferably, the pin has a smaller surface area in transverse cross section than the electric component, so that the pin can be interposed between the electric component held by the suction nozzle and mounted on the circuit substrate, and the adjacent electric component already mounted on the circuit substrate, and can be advanced to a position between the upper or top surfaces of those adjacent electric components and the surface of the circuit substrate on which the electric components are mounted. In this respect, it is noted that when each electric component is mounted on the circuit substrate, the suction nozzle is required to be placed in a suitable angular position at which the electric component is placed in a predetermined mounting angular position about its centerline parallel to the axis of the suction pipe and at which the pin can be located between the above-indicated adjacent electric components. To this end, the angular position of the suction nozzle at which the electric component received from a component supply device is held by the suction pipe is determined, for example, such that the suction nozzle by which the electric component has been held is rotated through a predetermined angle to an angular position at which the electric component is placed in the predetermined mounting angular position while the pin can be advanced in between the adjacent electric components. Thus, the pin having the fiducial mark at its end can be advanced in between the adjacent electric components on the circuit substrate, so that the length of the pin, that is, the position of the fiducial mark in the axial direction of the suction pipe is less limited by the height dimensions of the electric components already mounted on the circuit substrate. Accordingly, the distance between the fiducial mark provided at the end of the pin and the bottom surface of the electric component held by the suction nozzle can be minimized, enabling the image-taking device to take a clearer image of the fiducial mark. In addition, the fiducial mark provided at the end of the pin increases a freedom in the order in which the electric components are mounted on the circuit substrate.

(3) A suction nozzle according to the above mode (2), wherein the fiducial mark is defined by an end face formed at the end of the pin.

(4) A method of detecting a position of an electric component held by suction by a suction nozzle under a negative pressure, relative to a nominal position of a suction pipe of the suction nozzle, by processing an image of the electric component taken in a longitudinal direction of the suction pipe toward a sucking end of the suction pipe, the method comprising the steps of:

providing a fiducial mark near the suction pipe;

moving the electric component held by the suction pipe, and the fiducial mark, such that the electric component and the fiducial mark pass a field of vision of an image-taking device;

activating the image-taking device to concurrently take images of the electric component and the fiducial mark during movements thereof; and processing the images taken by the image-taking device, to obtain a relative position between the fiducial mark and the electric component, and obtaining the position of the electric component relative to the nominal position of the suction pipe, on the basis of the obtained relative position between the fiducial mark and the electric component, and a known relative position between the fiducial mark and the nominal position of the suction pipe.

Where the suction pipe is rotated to establish the predetermined mounting angular position of the electric component and to compensate the angular position of the electric component for an angular positioning error thereof, it is convenient to determine the position of the axis of rotation of the suction pipe as the nominal position of the suction pipe. Where the suction pipe is not rotated, the nominal position of the suction pipe is suitably determined when it is designed. The fiducial mark is preferably disposed on a nozzle body of the suction pipe from which the suction pipe extends.

For example, the position of the electric component is interpreted to mean at least one of the position of the center of the electric component as seen in a plane perpendicular to the axis of the suction pipe, and the angular position of the electric component about the centerline passing the above-indicated center. The center position of the electric component is defined relative to the nominal position of the suction pipe, for example, and the angular position is represented by an angle about its centerline with respect to a predetermined nominal angular position of the electric component, for example.

The relative position between the fiducial mark and the nominal position of the suction pipe may be a nominal relative position suitably determined when the suction nozzle and the fiducial mark are designed, or may be an actually detected relative position. Where this relative position is actually detected, the detection is effected only once for the suction nozzle of the same kind, if the suction nozzle including the suction pipe can be held by a nozzle holder with high reproducibility in the positioning accuracy, that is, if the center position and the angular position of the suction pipe relative to the nozzle holder can be held substantially consistent upon repeated attachment and removal of the suction nozzle to and from the nozzle holder. If the reproducibility in the positioning accuracy is low or absent, the relative position between the fiducial mark and the nominal position of the suction pipe is detected each time the suction nozzle is mounted on the nozzle holder.

When the electric component is held by suction by the suction pipe, the opening at the sucking end of the suction pipe is entirely or almost entirely closed by the electric component, so that the electric component can be held with a high degree of vacuum. In this state, the end face of the suction pipe is entirely or almost entirely hidden by the electric component, so that no part or substantially no part of the end face can be imaged. However, the electric component and the fiducial mark are imaged, so that the nominal position of the suction pipe can be obtained or determined on the basis of the image of the fiducial mark and the known relative position between the fiducial mark and the nominal position of the suction pipe, whereby the position of the electric component relative to the nominal position of the suction pipe can be obtained. Further, the images of the fiducial mark and the electric component are concurrently taken. This concurrent imaging of the fiducial mark and the electric component assures the same amount of deviation of the actual positions of the images of the fiducial mark and electric component with respect to the nominal positions in the imaging area of the image-taking device, which deviation may take place due to delayed timing of imaging of the fiducial mark and electric component. Accordingly, the position of the image of the electric component relative to the nominal position of the suction pipe which is determined on the basis of the image of the fiducial mark does not include an error due to the delayed timing of the imaging. Therefore, it is possible to take the image of the electric component during a movement of the electric component at a relatively high speed, while assuring accurate detection of the position of the electric component as held by the suction pipe.

The features according to the above modes (2) and (3) of the present invention are applicable to the method of detecting the position of the electric component as held by the suction nozzle according to the above mode (4). To take the image of the electric component in the longitudinal direction of the suction pipe toward the suction end of the suction pipe, the image-taking device need not be positioned so as to face in the longitudinal direction of the suction pipe toward the sucking end of the suction pipe. That is, the direction of propagation of a light generated by the image-taking device can be suitably changed by a suitable waveguide or other optical device such as a reflecting mirror, so that the image-taking device per se can be oriented or positioned as desired.

(5) A method of detecting a position of an electric component held by suction by a suction nozzle under a negative pressure, relative to a nominal position of a suction pipe of the suction nozzle, by processing an image of the electric component taken in a longitudinal direction of the suction pipe toward a sucking end of the suction pipe, the method comprising the steps of:

providing a fiducial mark near the suction pipe;

taking an image of an end face of the sucking end of the suction pipe and an image of the fiducial mark;

processing the images to detect a relative position between the end face of the suction pipe and the fiducial mark;

holding the electric component by suction on the sucking end of the suction pipe, and taking images of the electric component held by the suction pipe and the fiducial mark; and processing said images of said electric component held by said suction pipe and said fiducial mark, for determining a peripheral profile of said end face of said suction pipe which partially projects beyond a peripheral profile of said electric component, on the basis of the detected relative position between said end face and said fiducial mark, and for obtaining said position of said electric component relative to said nominal position of said suction pipe, while taking account of the determined peripheral profile of said end face of said suction pipe.

The images of the end face of the suction pipe and the fiducial mark may be taken while the suction pipe is moving or while it is stationary. The images of the end face of the suction pipe and the fiducial mark may be taken concurrently or at different times. Even where the images are taken at different times, the peripheral profile of the end face of the suction pipe which partially projects beyond the peripheral profile of the electric component can be determined in the same manner as where the images are taken concurrently, on the basis of the images of the electric component and the fiducial mark and known image-taking positions of the suction pipe relative to the image-taking device, at which the respective images have been taken.

The peripheral profile of the end face of the suction pipe projects beyond the peripheral profile of the electric component in the radial direction of the suction pipe where the cross sectional size of the suction pipe is larger than a relatively small size of the electric component, or may project beyond the peripheral profile of the electric component where the cross sectional size of the suction pipe is only slightly smaller than the size of the electric component. In the latter case, the end face of the suction pipe may partially project from the peripheral profile of the electric component, upon holding of the electric component by the suction pipe, due to a positioning error of the suction pipe (e.g., a positioning error of the suction nozzle including the suction pipe) relative to the nozzle holder, a deviation of the end face of the suction pipe from the nominal position due to bending of the suction pipe, or a positioning error of the electric component as accommodated in the component supply device. As a result of the partial projection of the peripheral profile of the end face of the suction pipe from the peripheral profile of the electric component, the electric component is imaged such that the peripheral profile of the electric component is partially hidden by the projecting part of the end face of the suction pipe, or partially replaced by the projecting part of the peripheral profile of the end face. Even in this case, only the peripheral profile of the electric component can be obtained in the method according to the above mode (5) wherein the peripheral profile of the end face of the suction pipe which partially projects from the peripheral profile of the electric component is determined, to eliminate the determined peripheral profile of the end face from the image of the electric component, for thereby making it possible to accurately detect the relative position of the electric component relative to the nominal position of the suction pipe.

In the absence of the bending of the suction pipe, that is, where there is established the nominal relative position between the fiducial mark and the end face of the suction pipe, the peripheral profile of the end face of the suction pipe partially projecting beyond the peripheral profile of the electric component can be determined on the basis of the above-indicated nominal relative relationship or an actually detected relative position between the fiducial mark and the end face. Actually, however, the suction pipe usually has a some amount of bending, and the amount of the bending increases with an increase in the cumulative number of the electric components which have been held by the suction pipe. That is, the relative position between the fiducial mark and the end face of the suction pipe tends to vary during the use of the suction pipe. Accordingly, it is necessary to detect the relative position between the fiducial mark and the end face of the suction pipe, by taking the images of the end face and the fiducial mark before the electric component is held by the suction pipe. While this detection may be effected each time the electric component is held by the suction pipe, it may be effected when a predetermined condition is satisfied, for instance, when the suction nozzle is held by the nozzle holder, when a predetermined number of the electric components have been held by the suction pipe, or when the suction pipe fails to correctly hold the electric component. The peripheral profile of the end face of the suction pipe which partially projects the peripheral profile of the electric component can be determined with higher accuracy, by timely updating the relative position between the fiducial mark and the end face of the suction pipe.

Where the suction nozzle including the suction pipe and provided with the fiducial mark is not rotated, the relative position between the end face of the suction pipe and the fiducial mark is kept constant, and the detected relative position therebetween can be used. Even where the suction pipe is rotated, the peripheral profile of the end face of the suction pipe can be determined on the basis of the relative position between the end face and the fiducial mark, which is detected at different angular positions of the suction pipe, provided the following positions are known: the relative position (angle and direction) between the angular position of the suction pipe at which the relative position between the end face of the suction pipe and the fiducial mark is detected, and the angular position of the suction pipe at which the electric component is held by the suction pipe; and the position of the axis of rotation of the suction pipe.

The peripheral profile of the end face of the suction pipe partially projecting the peripheral profile of the electric component can be determined on the basis of the obtained relative position between the fiducial mark and the end face of the suction pipe, if the angular position of the suction nozzle at which the above-indicated relative position is obtained is the same as the angular position of the suction pipe at which the electric component is held by the suction pipe and the electric component and the fiducial mark are imaged, or if the relationship between these two angular positions (angle and axis of rotation) is known.

(6) A method of detecting a bending of a suction pipe extending from a nozzle body of a suction nozzle arranged to hold an electric component by suction at a sucking end of the suction pipe under a negative pressure, the method comprising the steps of:

providing a fiducial mark near the suction pipe;

taking an image of an end face of the sucking end of the suction pipe and an image of the fiducial mark in a longitudinal direction of the suction pipe toward the sucking end; and processing the images of the end face and the fiducial mark, to obtain a relative position between the fiducial mark and the end face, and detecting the bending of the suction pipe on the basis of the obtained relative position between the fiducial mark and the end face.

The foregoing description of the method according to the above mode (5) applies to the detection of the relative position between the fiducial mark and the end face of the suction pipe. The detection of the bending of the suction pipe includes an operation to determine whether the amount of the bending is larger than a predetermined upper limit, and an operation to detect the amount of the bending, for example.

For instance, the bending of the suction pipe is defined by a deviation of the center of the end face of the suction pipe with respect to the centerline of the suction nozzle or a deviation of the same with respect to the centerline of a nozzle holder provided to hold the suction nozzle. The former deviation is necessary to determine whether the expected service life of the suction pipe has been reached due to an excessive amount of bending thereof, for example, while the latter deviation is necessary to determine whether the suction pipe is capable of correctly holding the electric component, for example. Where there is a misalignment between the fixed end of the suction pipe and the nozzle body of the suction nozzle, the amount of deviation of the center of the end face of the suction pipe with respect to the centerline of the suction nozzle (centerline of the nozzle body) is precisely a sum of the amount of bending of the suction pipe and the amount of misalignment between the fixed end of the suction pipe and the nozzle body. Practically, however, it is not significant to distinguish the bending of the suction pipe and the misalignment of the fixed end of the suction pipe with respect to the nozzle body. Accordingly, the amount of deviation of the center of the end face of the suction pipe with respect to the centerline of the suction nozzle can be considered to represent the amount of bending of the suction pipe. The same may be true for an error in the relative position between the centerline of the suction nozzle and the centerline of the nozzle holder provided to hold the suction nozzle. For instance, the amount of deviation of the center of the end face of the suction pipe with respect to the centerline of the nozzle holder can be considered to represent the amount of bending of the suction pipe, where the relative position between the centerline of the suction nozzle and the centerline of the nozzle holder is established by engagement of an engaging portion of the suction nozzle with an engaging portion of the nozzle holder.

The amount and direction of the suction pipe can be obtained by moving the nozzle holder to an image-taking position at which the centerline of the nozzle holder is aligned with a center of an imaging area of an image-taking device, taking an image of the end face of the suction pipe, and obtaining the position of the end face of the suction pipe relative to the center of the imaging area. However, the centerline of the nozzle holder may be misaligned with the center of the imaging area, due to thermal expansion of a ballscrew of a nozzle moving device provided to move the suction nozzle with the nozzle holder, and the centerline of the suction nozzle may be misaligned with the center of the imaging area, due to an error of mechanical positioning of the suction nozzle relative to the nozzle holder when the suction nozzle is newly mounted on the nozzle holder. Such misalignment is detected as a bending of the suction pipe. In other words, the accuracy of detection of bending of the suction pipe may be deteriorated by such misalignment.

On the other hand, the relative position between the end face of the suction pipe and the fiducial mark is not influenced by the thermal expansion of the ballscrew or the mechanical positioning error of the suction nozzle relative to the nozzle holder, if the fiducial mark and the suction pipe are fixedly disposed on the nozzle body of the suction nozzle, or on the same movable or stationary member. Accordingly, the bending of the suction pipe can be accurately detected on the basis of the relative position of the fiducial mark and the end face of the suction pipe.

Where the suction nozzle is rotated, the axis of rotation of the suction nozzle can be obtained by taking images of the fiducial mark or the end face of the suction pipe at two different angular positions of the suction nozzle, and processing the obtained images. In this case, the position of the center of the end face of the suction pipe relative to a straight line passing the center of the fiducial mark and the axis of rotation of the suction nozzle is obtained, for example, on the basis of the position of the fiducial mark and the relative position between the end face of the suction pipe and the axis of rotation of the suction nozzle. Thus, the amount and direction of bending of the suction pipe with respect to the axis of rotation of the suction nozzle (axis of rotation of the nozzle holder) can be accurately detected. Accordingly, the position of the suction nozzle at which the electric component is held by the suction nozzle or mounted on the circuit substrate can be accurately compensated for the detected amount and direction of bending of the suction pipe, so that the electric component can be correctly held by the suction nozzle or accurately mounted at a predetermined mounting position on the circuit substrate.

Where the suction nozzle is not rotated, the axis of rotation of the suction nozzle or nozzle holder is determined on the basis of the obtained image of the fiducial mark and a know relative position of the fiducial mark and the axis of rotation of the suction nozzle or nozzle holder, and the bending of the suction pipe is detected with respect to the determined axis of rotation of the suction nozzle or nozzle holder.

The bending of the suction pipe is detected at a predetermined point of time or under a predetermined condition, while the electric component is not held by the suction pipe. For example, the bending is detected just before the electric component is held by the suction nozzle, when a predetermined number of electric components have been held by the suction nozzle, or when the suction nozzle fails to correctly hold the electric component. The failure of the suction nozzle to correctly hold the electric component includes a failure to hold the electric component at all, or a failure to hold the electric component within a predetermined tolerable range of positioning error of the electric component relative to the suction nozzle.

(7) A method according to the above mode (6), wherein a plurality of fiducial marks are disposed at respective positions near the suction pipe, and the bending of the suction pipe is detected by processing images of the plurality of fiducial marks and the end face of the suction pipe.

Where the suction nozzle is not rotated in the above mode (7) of this invention, the amount and direction of bending of the suction pipe can be detected on the basis of the relative position between the plurality of fiducial marks and the end face of the suction pipe. Where the suction nozzle is rotated, too, the amount and direction of bending of the suction pipe can be detected by taking only once the images of the plurality of fiducial marks and the end face of the suction pipe.

(8) A method of determining an angular position of a suction nozzle about an axis of rotation thereof, the suction nozzle including a nozzle body rotatable about the axis of rotation, and a suction pipe disposed on the nozzle body so as to be substantially coaxial with the nozzle body and operable to hold an electric component by suction at a sucking end thereof under a negative pressure, the method comprising the steps of:

providing a fiducial mark at a position spaced from the axis of rotation of the suction nozzle;

taking an image of the fiducial mark in a longitudinal direction of the suction pipe toward the sucking end; and determining the angular position of the suction nozzle by processing the image of the fiducial mark.

The step of determining the angular position of the suction nozzle is interpreted to mean a step of determining the actual angular position of the suction nozzle, or alternatively a step of obtaining angular position data that can be used to determine the actual angular position of the suction nozzle. For instance, the step of determining the angular position of the suction nozzle consists of an operation to determine an angle of rotation of the suction nozzle with respect to a nominal angular position of the suction nozzle, or an operation to determine or set the nominal angular position of the suction nozzle. The nominal angular position may be an absolute position, or a position which satisfies a predetermined condition. The nominal angular position of the suction nozzle may be a reference or 0-degree angular position of the suction nozzle per se, or an angular position of the suction nozzle which corresponds to a reference or 0-degree angular position of a nozzle holder provided to hold the suction nozzle. Reference angular positions may be provided for a plurality of individual suction nozzles, respectively. Alternatively, a common reference angular position may be provided for all of the individual suction nozzles. This common reference angular position may be considered as an absolute reference angular position. The reference angular position of the nozzle holder may be used commonly for the individual suction nozzles. Where the suction nozzle is positioned relative to the nozzle holder in the radial and circumferential directions with high reproducibility in the positioning accuracy, it is effective to determine the absolute reference angular position of the nozzle holder, by using a standard suction nozzle held by the nozzle holder, hold the individual suction nozzles by the nozzle holder placed in the absolute reference angular position, obtain an error of the actual angular position of each suction nozzle with respect to the absolute reference angular position, on the basis of the position of the fiducial mark when each suction nozzle is held by the nozzle holder, and store the obtained error of the actual angular position of each suction nozzle in a memory. Each time the specific suction nozzle is held by the nozzle holder, the reference angular position of the suction nozzle is compensated for the stored error, to determine the angular position of the suction nozzle. The standard suction nozzle may be one of the individual suction nozzles to be held by the nozzle holder, or a special suction nozzle exclusively used to determine the reference angular position of each of the individual suction nozzles. For example, the above-indicated "position which satisfies a predetermined condition" may be a position at which the suction nozzle is held by the nozzle holder.

For instance, the suction nozzle is rotated to compensate the angular position of the electric component for a positioning error with respect to the suction pipe, or to rotate the electric component from its holding position to the mounting position in which the electric component is mounted on the circuit substrate. Where a sucking portion of the suction pipe at which the electric component is held by suction has a non-circular shape in transverse cross section, it is necessary to determine or detect the actual angular position of the suction nozzle or the nozzle holder, so that the non-circular sucking portion has a predetermined attitude or posture. Where the required accuracy of mounting of the electric component on the circuit substrate is relatively high, it may also be necessary to determine the actual angular position of the nozzle holder. To permit rotation of the suction nozzle and axial movements of the suction nozzle toward and away from the circuit substrate, the nozzle holder may be connected to and supported by a rotary sleeve such that a portion of the nozzle holder sidably engages a bore of the rotary sleeve so that the nozzle holder is axially movable relative to the rotary sleeve and rotatable together with the rotary sleeve. In this case, the centerline of the bore of the rotary sleeve which engages the nozzle holder may be slightly inclined with respect to the axis of rotation of the rotary sleeve, so that the point of intersection between the centerline of the nozzle holder and the surface (usually the horizontal surface) of the circuit substrate may be shifted on the surface of the circuit substrate as the rotary sleeve and the nozzle holder are rotated together. Namely, the position at which the electric component held by the suction pipe of the suction nozzle held by the nozzle holder is mounted on the circuit substrate may change depending upon the angular position of the suction nozzle. Where the required accuracy of mounting of the electric component at the predetermined position on the circuit substrate is comparatively high, it is necessary to determine the actual angular position of the rotary sleeve and the nozzle holder and to compensate for the component-mounting position of the suction nozzle (at which the electric component is mounted on the circuit substrate), depending upon the angular position of the rotary sleeve (nozzle holder or suction nozzle).

Where the centerline of the suction nozzle is accurately aligned with the centerline of the nozzle holder holding the suction nozzle, the angular position of the suction nozzle can be accurately detected by taking the image of the fiducial mark only once. Where the suction nozzle is positioned relative to the nozzle holder in the circumferential direction with high reproducibility in the angular positioning accuracy, too, the angular position of the nozzle holder can be accurately detected by taking the image of the fiducial mark only once.

Where the relative position between the suction nozzle and the nozzle holder (between their centerlines) varies depending upon the specific suction nozzle held by the nozzle holder, the images of the fiducial mark are taken at two or more angular positions of the suction nozzle (nozzle holder) when the specific suction nozzle is newly attached to the nozzle holder, and the position of the axis of rotation of the suction nozzle (centerline of the nozzle holder) is obtained on the basis of the images of the fiducial mark. Then, the angular position of the suction nozzle is determined on the basis of the obtained position of the axis of rotation of the suction nozzle, and a straight line passing the axis of rotation of the suction nozzle and the center of the fiducial mark. Where the alignment between the centerlines of the suction nozzle and the nozzle holder is obtained with high reproducibility, but the suction nozzle is not positioned relative to the nozzle holder in the circumferential direction with high reproducibility in the angular positioning accuracy, the image of the fiducial mark is taken when the specific suction nozzle is newly attached to the nozzle holder, and the angular position of the suction nozzle is determined. In the above two cases, the angular position of the nozzle holder can be determined on the basis of the angular position of the suction nozzle as long as the specific suction nozzle is held by the nozzle holder, or until the specific suction nozzle is removed from the nozzle holder.

To detect the reference angular position of the suction nozzle or nozzle holder, a drive source of a rotary drive device provided to rotate the suction nozzle (nozzle holder), or a movable member (usually, a rotatable member) of a rotary-motion transmitting device connected to the rotary drive device is conventionally provided with a sensed portion, and a reference-position switch is disposed along a path of movement (usually, a rotary movement) of the sensed portion, for detecting the sensed portion during the movement of the sensed portion to thereby detect the reference angular position of the suction nozzle. The angular position of the suction nozzle or nozzle holder is determined with respect to the thus detected reference angular position. However, the above arrangement requires the reference-position switch and the sensed portion, and a system including this arrangement is accordingly complicated in construction and available at an increased cost.

In the method according to the above mode (8) of the present invention, however, the angular position of the suction nozzle or nozzle holder can be detected or determined on the basis of the position of the fiducial mark, so that the conventionally required reference-position switch and sensed portion can be eliminated. Accordingly, a system including the suction nozzle and the nozzle holder is available at a comparatively low cost.

The features according to any desired ones of the modes (4) through (8) which have been described may be suitably combined with each other.

(9) A method according to the above mode (8), wherein an image of an end face of the sucking end of the suction pipe is taken as well as the image of the fiducial mark, and the angular position of the suction nozzle is determined on the basis of a position of the fiducial mark and a position of the end face of the suction pipe.

Where the center of the end face of the suction pipe is accurately aligned with the centerline of the suction nozzle or nozzle holder, the angular position of the suction nozzle can be accurately determined on the basis of the positions of the fiducial mark and the center of the end face of the suction pipe. Where the required accuracy of determination of the angular position of the suction nozzle is not so high, the angular position may be determined while ignoring a misalignment between the center of the end face of the suction pipe and the centerline of the suction nozzle or nozzle holder. The amount of misalignment between the center of the end face of the suction pipe and the centerline of the suction nozzle or nozzle holder is usually considerably small as compared with a distance between the center of the end face of the suction pipe and the center of the fiducial mark, so that the angular position of the suction nozzle can be usually determined with considerably high accuracy even when the above-indicated misalignment is ignored.

(10) A method of establishing a predetermined nominal angular position of a suction nozzle on the basis of an actual angular position of the suction nozzle determined according to a method according to the above mode (8).

Where the sucking portion of the suction pipe at which the electric component is held has a non-circular shape in transverse cross section, it is necessary to determine or detect the actual angular position of the suction nozzle or nozzle holder, for establishing a predetermined nominal angular position of the suction nozzle on the basis of the detected actual angular position so that the non-circular sucking portion has a predetermined attitude or posture, as described above.

Where the required accuracy of mounting of the electric component on the circuit substrate is relatively high, it is required to determine the actual angular position of the nozzle holder. In this case, too, the predetermined nominal angular position of the nozzle holder must be established before the electric component is mounted on the circuit substrate, in order to determine the amount and direction of compensation of the component-mounting position of the nozzle holder depending upon the actual angular position of the suction nozzle.

(11) An electric-component handling device comprising:
a suction nozzle including (a) a nozzle body, and (b) a suction pipe extending from the nozzle body;
a fiducial mark disposed at a predetermined position relative to the suction pipe;
an image-taking device operable to take an image of an electric component held by suction by the suction pipe, and an image of the fiducial mark, in a longitudinal direction of the suction pipe;
a relative-movement device operable to move the image-taking device and the suction nozzle relative to each other, in at least a direction intersecting the longitudinal direction of the suction pipe, so as to pass a relative position therebetween at which the electric component held by the suction pipe and the fiducial mark are concurrently located within a field of vision of the image-taking device; and
an image data processing device operable to process the images of the electric component and the fiducial mark taken by the image-taking device, for obtaining a relative position between the fiducial mark and the electric component, and to obtain a position of the electric component relative to a nominal position of the suction pipe, on the basis of the obtained relative position between the fiducial mark and the electric component, and a known relative position between the fiducial mark and the nominal position of the suction pipe.

The fiducial mark may be disposed on the suction nozzle, or on a member other than the suction nozzle.

The electric-component handling device according to the above mode (11) of this invention can be suitably used to practice the method of detecting the position of the electric component according to the above mode (4).

(12) An electric-component handling device comprising:

a suction nozzle including (a) a nozzle body, and (b) a suction pipe extending from the nozzle body and a sucking end;

a fiducial mark disposed at a predetermined position relative to the suction pipe;

an image-taking device operable to take a set of images of an end face of the sucking end of the suction pipe and the fiducial mark, and a set of images of an electric component held by the suction pipe and the fiducial mark, in a longitudinal direction of the suction pipe;

a relative-movement device operable to move the image-taking device and the suction nozzle relative to each other, in at least a direction intersecting the longitudinal direction of the suction pipe, to a relative position therebetween at which the suction nozzle and the image-taking device are opposed to each other; and an image data processing device operable to process the images of the end face of the suction pipe and the fiducial mark taken by the image-taking device, for detecting a relative position between the end face and the fiducial mark, and to process the images of the electric component and the fiducial mark, for determining a peripheral profile of the end face of the suction pipe which partially projects beyond a peripheral profile of the electric component, on the basis of the detected relative position between the end face and the fiducial mark, and obtaining a position of the electric component relative to a nominal position of the suction pipe, while taking account of the determined peripheral profile of the end face of the suction pipe.

The electric-component handling device according to the above mode (12) of this invention can be suitably used to practice the method of detecting the position of the electric component according to the above mode (5).

(13) An electric-component handling device comprising:

a suction nozzle including (a) a nozzle body, and (b) a suction pipe extending from the nozzle body and a sucking end;

a fiducial mark disposed at a predetermined position relative to the suction pipe;

an image-taking device operable to take an image of an end face of the sucking end of the suction pipe and the fiducial mark, in a longitudinal direction of the suction pipe;

a relative-movement device operable to move the image-taking device and the suction nozzle relative to each other, in at least a direction intersecting the longitudinal direction of the suction pipe, to a relative position therebetween at which the suction nozzle and the image-taking device are opposed to each other; and an image data processing device operable to process the images of the end face of the suction pipe and the fiducial mark taken by the image-taking device, to obtain a relative position between the fiducial mark and the end face, and to detect a bending of the suction pipe on the basis of the obtained relative position between the fiducial mark and the end face.

The electric-component handling device according to the above mode (13) of this invention can be suitably used to practice the method of detecting bending of the suction pipe according to the above mode (6).

(14) An electric-component component handling device comprising:

a suction nozzle including (a) a nozzle body, and (b) a suction pipe extending from the nozzle body and a sucking end;

a fiducial mark disposed at a predetermined position relative to the suction pipe;

an image-taking device operable to take an image of the fiducial mark in a longitudinal direction of the suction pipe;

a relative-movement device operable to move the image-taking device and the suction nozzle relative to each other, in at least a direction intersecting the longitudinal direction of the suction pipe, to a relative position therebetween at which the suction nozzle and the image-taking device are opposed to each other; and an image data processing device operable to process the image of the fiducial mark taken by the image-taking device, to determine an angular position of the suction pipe.

The electric-component handling device according to the above mode (14) of this invention can be suitably used to practice the method of detecting the angular position of the electric component according to the above mode (8). The features of the above modes (9) and (10) are applicable to the present electric-component handling device.

The electric-component handling device according to any one of the above modes (11)–(14) may be combined with an electric-component supply device and a substrate support device, to constitute an electric-component mounting system capable of mounting to mount an electric component on a circuit substrate such a printed-wiring board. The electric-component supply device is arranged to supply the electric-component handling device with electric components one after another, and the substrate support device supports the circuit substrate. In this electric-component mounting system, the electric-component handling device is preferably arranged to receive each electric component, transfer the electric component to a mounting position on the circuit substrate supported by the substrate support device, and mount the electric component on the circuit substrate.

The features according to according to any desired ones of the modes (11) through (14) which have been described may be suitably combined with each other, and the features according to the above modes (2) and (3) are applicable to the electric-component handling devices according to the above modes (11)–(14). It is also noted that a plurality of fiducial marks may be provided for one suction nozzle. For instance, two fiducial marks are disposed at respective two positions which are symmetrical with each other with respect to the axis or centerline of the suction pipe. Alternatively, a plurality of fiducial marks are disposed along a circle having a center on the axis or centerline of the suction pipe. Where a plurality of fiducial marks are disposed at irregular angular intervals along the circle, it is possible to determine the angular position or nominal center position of the suction nozzle, on the basis of the positions of the fiducial marks.

(15) An electric-component handling device according to any one of the above modes (11)–(14), wherein the fiducial mark is disposed on the nozzle body such that the fiducial mark is spaced from the suction pipe in a radial direction of the suction pipe.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
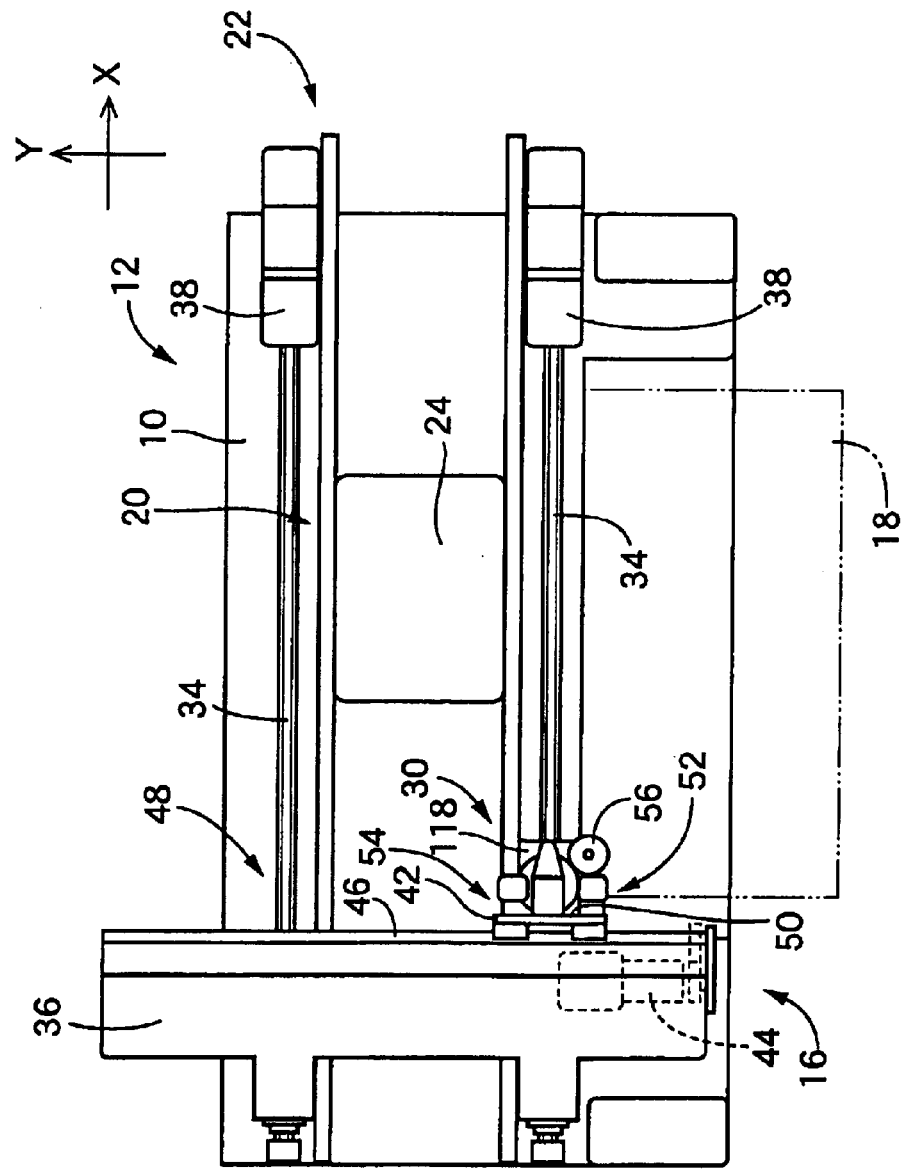
FIG. 1 is a plan view schematically showing an electric-component mounting system which includes a suction nozzle and an electric-component mounting apparatus both constructed according to embodiments of this invention, and which is arranged to practice methods of the invention.

Referring first to FIG. 1, reference numeral 10 denotes a machine base of an electric-component mounting system 12. The electric-component mounting system 12 includes an electric-component mounting device 16, an electric-component supply device 18 and a printed-wiring-board transferring device 20 (hereinafter abbreviated as "PWB transferring device 20"), which devices 16, 18 and 20 are mounted on the machine base 10. The PWB transferring device 20 includes a printed-wiring-board conveyor 22 (hereinafter abbreviated as "PWB conveyor 22") extending in an X-axis direction (in the horizontal direction as seen in FIG. 1), and a printed-wiring-board support device (not shown) and a printed-wiring-board clamping device (not shown), which are disposed within a longitudinal dimension of the PWB conveyor 22. A printed-wiring substrate in the form of a printed-wiring board 24 is transferred and positioned at a predetermined component mounting position by the PWB conveyor 22, and is supported by the printedwiring-board support device. On one side of the PWB conveyor 22 is fixedly disposed the electric-component supply device 18. No further description of this electric-component supply device 18 is deemed necessary, since this device 18 does not directly relate to the present invention.

Figure 2:
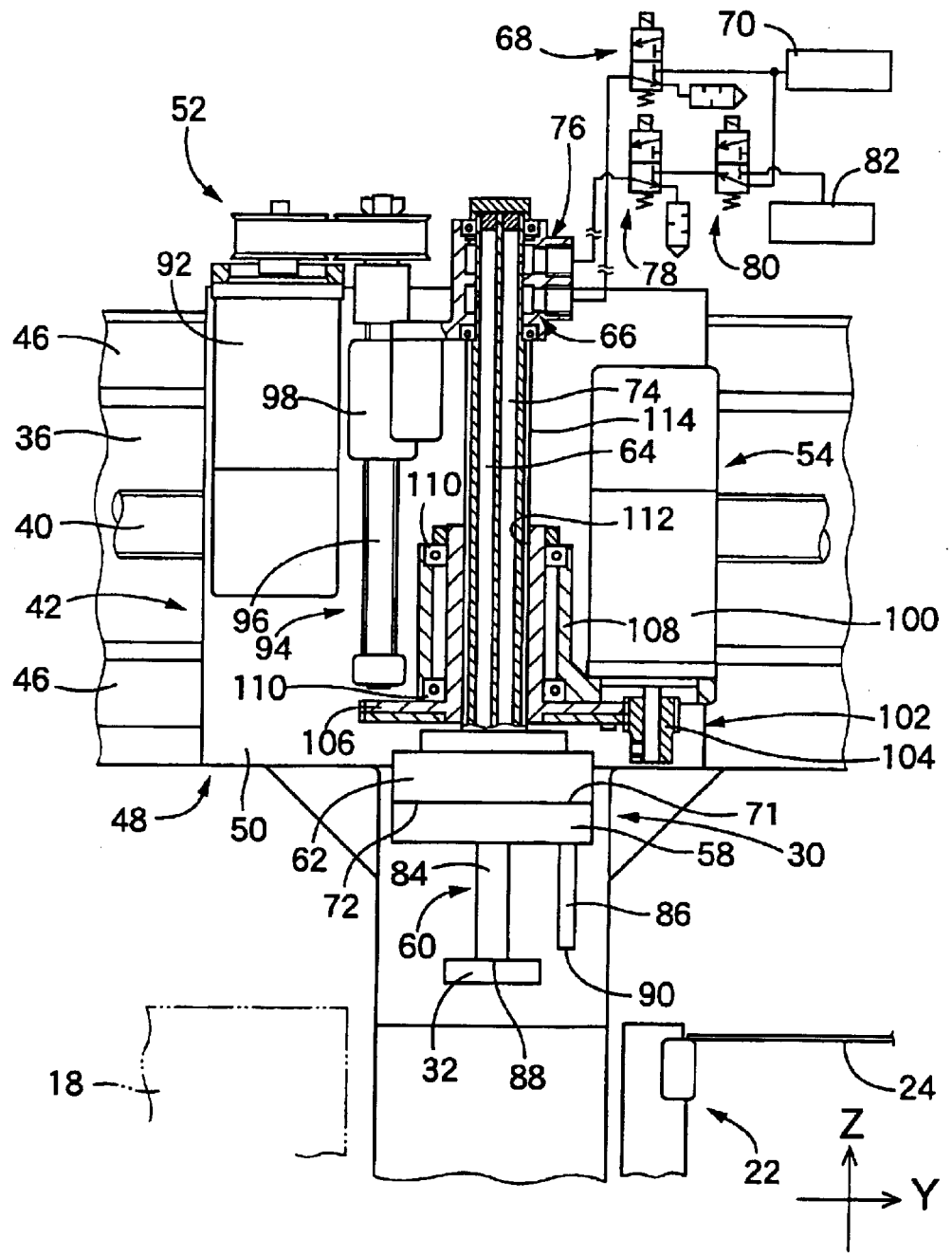
FIG. 2 is a side elevational view showing an electric-component mounting head and its vicinity of the mounting the electric-component mounting apparatus.
Figure 3:
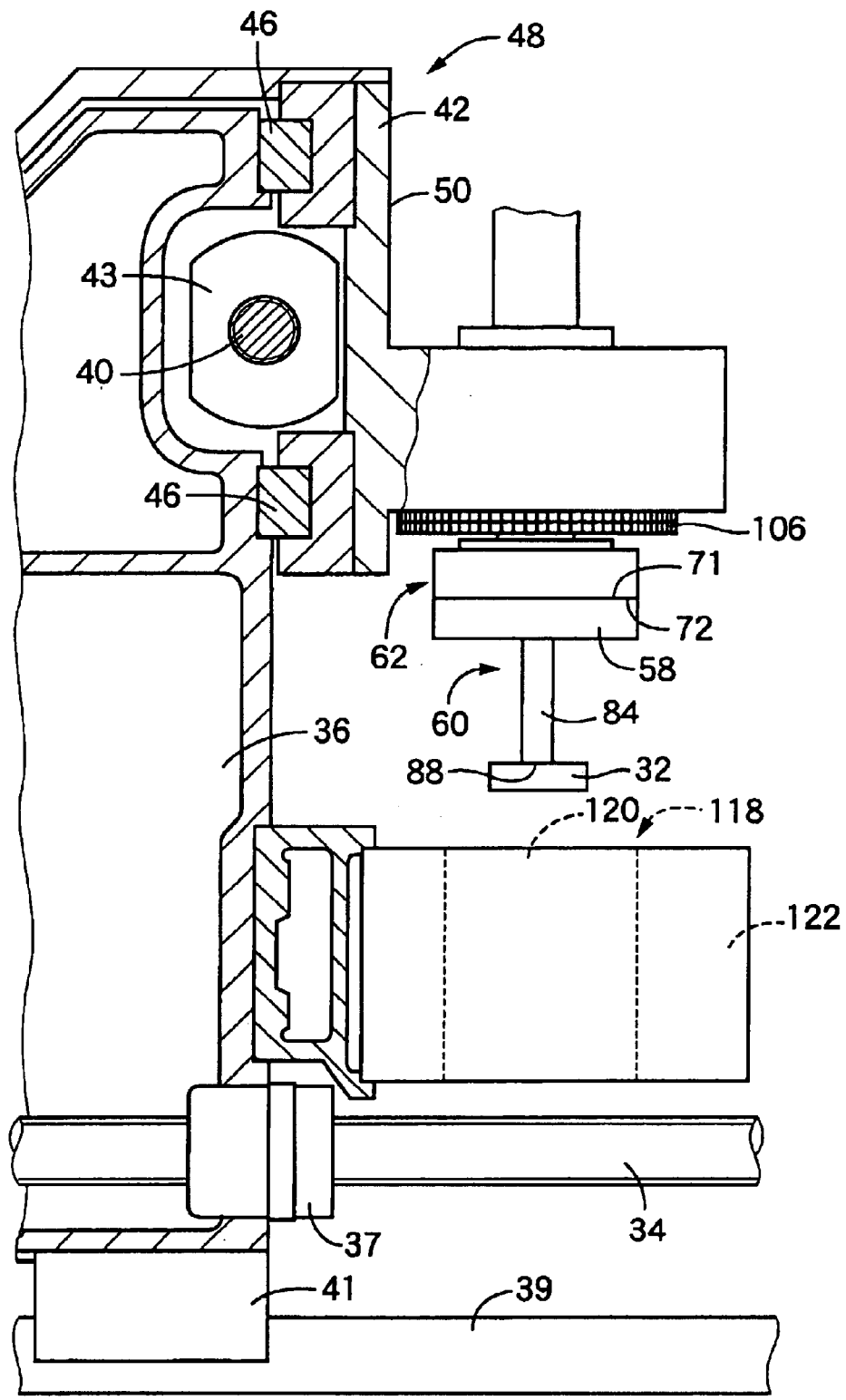
FIG. 3 is a front elevational view partly in cross section showing the electric-component mounting head and its vicinity of the electric-component mounting apparatus.

The electric-component mounting device 16 will be described first. As shown in FIG. 2, this electric-component mounting device 16 includes a component mounting head 30 which is movable in the above-indicated X-axis direction and an Y-axis direction which are perpendicular to each other. In operation, the component mounting head 30 (hereinafter referred to "mounting head 30") is linearly moved in a direction having an X-axis component and an Y-axis component, for transferring an electric component 32 (typically an electronic component) to an appropriate position in the XY coordinate system, and mounting the electric component 32 on a surface of the printed-wiring board 24. For movements of the mounting head 30, the machine base 10 is provided with two feedscrews 34 disposed on respective opposite sides of the PWB conveyor 22 such that the two feedscrews 34 extend in the X-axis direction and are spaced apart from each other in the Y-axis direction. The feedscrews 34 are held in engagement with respective nuts 37 (only one of which is shown in FIG. 3) fixed to an X-axis slide 37, and are rotated by respective X-axis drive motors 38 shown in FIG. 1 (also indicated in FIG. 4), so that the X-axis slide 36 is moved in the X-axis direction. In the present embodiment, each feedscrew 34 engages the corresponding nut 37 through steel balls, and the feedscrew 34 and the nut 37 cooperate to constitute a ball screw-nut mechanism. A similar ball screw-nut mechanism is used in other parts of the present electric-component mounting system 12. The machine base 10 is further provided with a pair of guide members in the form of two guide rails 39 disposed below the respective two feedscrews 34, as shown in FIG. 3, and the X-axis slide 36 has guide blocks 41 slidably engaging the respective guide rails 39, so that the X-axis slide 36 is moved in the X-axis direction while being slidably guided by the guide rails 39.

The X-axis slide 36 is provided with a feedscrew 40 extending in the Y-axis direction, as shown in FIG. 3, and an Y-axis slide 42 is mounted on the X-axis slide 36 such that a nut 43 fixed to the Y-axis slide 42 is held in engagement with the feedscrew 40. The Y-axis slide 42 is moved in the Y-axis direction while being guided by a pair of guide members in the form of two guide rails 46, with the feedscrew 40 being rotated by an Y-axis drive motor 44 shown in FIG. 1 (also indicated in FIG. 3). An XY robot 48 is principally constituted by the nut 37, feedscrew 34, X-axis slide 36, X-axis drive motor 38, nut 437 feedscrew 40, Y-axis slide 42 and Y-axis drive motor 44, which have been described.

The Y-axis slide 42 has a vertically extending side surface 50 on which is mounted the mounting head 30, as shown in FIGS. 1 and 2, such that the mounting head 30 is vertically movable and rotatable about its axis. On the side surface 50, there are also mounted a vertical drive device 52 operable to move the mounting head 30 in the vertical direction, a rotary drive device 54 operable to rotate the mounting head 30 about its axis, and a CCD camera 56 operable to take images of a fiducial mark and other objects provided on the printed-wiring board 24. The Y-axis slide 42 further carries an illuminating device (not shown) operable to illuminate the objects whose images are taken by the CCD camera 56.

As shown in FIG. 2, the mounting head 30 includes a suction nozzle 60 operable to hold the electric component 32 by suction under a negative pressure, and a nozzle holder 62 provided to removably hold the suction nozzle 60. The nozzle holder 60 is movable by the XY robot 48 to a desired position in the horizontal plane (in the XY plane or XY coordinate system). The suction nozzle 60 includes a nozzle body 58, a suction pipe 84, and a fiducial mark 90. The suction pipe 84 is fixedly fitted in a central portion of the nozzle body 5 such that the suction pipe 84 is aligned with the centerline of the nozzle body 58. In the present embodiment, the fiducial mark 90 is provided by the free or lower end face of a pin 86 fixed to the nozzle body 58 such that the pin 86 is spaced apart from the suction pipe 84 and offset from the centerline of the nozzle body 58, in the radial direction of the suction pipe 84 or nozzle body 58, by a relatively short distance.

The pin 68 has a circular shape in transverse cross section, and extends in the longitudinal or axial direction of the suction pipe 84. The pin 68 has a length which is smaller than the length of the suction nozzle 60. More specifically described, the lower end face of the pin 68 which functions as the fiducial mark 90 is spaced from a free or lower end face 88 of the suction pipe 84 of the suction nozzle 60, by a distance slightly larger than a difference between the smallest and largest height dimensions of the electric components 32 to be held by the suction nozzle 60. The lower end face 88 defines a sucking end of the suction pipe 84 at which the electric component 32 is held by the suction pipe 88. When an image of the electric component 32 held by the suction nozzle 60 and an image of the fiducial mark 90 are taken by an image-taking device 118 (which will be described), the image-taking device 118 is focused on the electric component 32. Since the above-indicated difference of the largest and smallest dimensions of the electric components 32 is relatively small, the fiducial mark 90 is well within the field of depth of the image-taking device 118, even while the image-taking device 118 is focused on the electronic component 32. Accordingly, clear images of the fiducial mark 90 as well as the electric component 32 can be taken by the image-taking device 118. The pin 90 is positioned in the radial direction of the suction pipe 84 so that the image of the fiducial mark 90 can be taken by the image-taking device 118, concurrently with the image of the electric component 32, that is, so that the fiducial mark 90 is located radially outwardly of the periphery of the largest one of the electric components 32 to be held by the suction nozzle 60 and to be mounted on the printed-wiring board 24 by the mounting head 30, whereby the fiducial mark 90 is not hidden by the electric component 32 having the largest size as measured in the XY plane.

The suction nozzle 60 is held by suction under a negative pressure by the nozzle holder 62. To this end, the nozzle holder 62 is connected to a negative-pressure source (vacuum source) 70 through an air passage 64, a rotary valve 66 and a solenoid-operated directional control valve 68, as shown in FIG. 2. With the directional control valve 68 being switched between two positions, the nozzle holder 62 can be selectively brought into communication with the negative-pressure source 70 or the atmosphere, so that the suction nozzle 60 can be selectively drawn onto or released from the nozzle holder 62. The nozzle body 58 has an upper surface 71 perpendicular to its axis, while the nozzle holder 62 has a lower surface 72 onto which the nozzle body 58 is drawn at its upper surface 71 when the negative pressure is applied to the nozzle holder 62, so that the suction nozzle 60 is held by suction by the nozzle holder 62. In the present embodiment, the suction nozzle 60 is held by the nozzle holder 62 such that the longitudinal direction of the suction pipe 84 is parallel to the vertical direction, namely, such that the suction pipe 84 extends downwards. The suction nozzle 60 is not positioned relative to the nozzle holder 62 in the radial and circumferential directions, since the surfaces 71 and 72 contact with each other in a plane, so that the centerline of the nozzle body 58 may have an misalignment with respect to the axis of rotation of the nozzle holder 62 in the radial direction or in the above-indicated plane.

The suction nozzle 60 is also connected to the negative-pressure source 70 and a positive-pressure source 82 through an air passage 74, a rotary valve 76 and solenoid-operated directional control valves 78, 80, as also shown in FIG. 2. With the directional control valves 78, 80 being suitably switched, the suction nozzle 60 is selectively brought into communication with one of the negative-pressure source 70, the positive-pressure source 82 and the atmosphere. The suction pipe 84 is held in communication with the air passage 74 through a passage formed through the nozzle body 58, so that the electric component 32 is held by suction by the suction pipe 84 when the suction pipe 84 is communicated with the negative-pressure source 70, and is removed from the suction pipe 84 when the suction pipe 84 is communicated with the positive-pressure source 82.

The vertical drive device 52 for moving the mounting head 30 in the vertical direction includes a vertical drive motor 92 as a drive device, and a motion converting device 94, as shown in FIG. 2. The motion converting device 94 is operable to convert a rotary motion of the vertical drive motor 92 into a vertical motion of the mounting head 30. The motion converting device 94 includes a feedscrew 96 rotatable by the vertical drive motor 92, and a nut 98 which is fixed to the nozzle holder 60 of the mounting head and which engages the feedscrew 96. When the feedscrew 96 is rotated by the vertical drive motor 92, the nut 98 is moved to move the nozzle holder 62 in the vertical direction, so that the suction nozzle 60 is moved in the vertical direction toward and away from the printed-wiring board 24.

The rotary drive device 54 for rotating the mounting head 30 includes a rotary drive motor 100, and a rotary-motion transmitting device 102, as also shown in FIG. 2. The rotary-motion transmitting device 102 is operable to transmit a rotary motion of the rotary drive motor 100 to the nozzle holder 62. The rotary-motion transmitting device 102 includes a drive gear 104 rotated by the rotary drive motor 100, and a driven gear 104 which engages the drive gear 104 and which is connected to the nozzle holder 62 such that the driven gear 104 is axially movable relative to the nozzle holder 62 and is rotatable with the nozzle holder 62. Described in detail, the driven gear 106 is supported by a support member 108 through bearings 110. The support member 108 is fixed to the Y-axis slide 42 such that the driven gear 106 is rotatable about its vertical axis relative to the support member 108. The driven gear 106 has a splined bore 112, while the nozzle holder 62 is provided with a splined shaft 114 having a splined outer circumferential surface which is held in engagement with the splined bore 112 of the driven gear 106, so that the driven gear 106 is axially slidably movable relative to the splined shaft 114 and is rotatable with the splined shaft 114. This arrangement of the rotary drive device 54 and the nozzle holder 62 permits the rotary motion of the rotary drive device 54 to be transmitted to the nozzle holder 62, while permitting the nozzle holder 62 to be vertically moved relative to the rotary drive device 54. In the present embodiment, the driven gear 106 takes the form of a rotatable sleeve with the splined bore 112.

With the drive gear 104 and driven gear 106 being rotated by the rotary drive motor 100, the nozzle holder 62 is rotated about its axis, so that the nozzle body 58 and the suction pipe 84 of the suction nozzle 60 are rotated about the axis of the nozzle holder 62. Thus, the axis of rotation of the nozzle body 58 and suction pipe 84 is aligned with the axis of the nozzle holder 62, which is used as a reference position of the suction pipe 84 in the XY plane. As indicated above, the present embodiment is arranged such that the suction nozzle 60 is not positioned relative to the nozzle holder 62 in the radial and circumferential directions when the suction nozzle 60 is held by the nozzle holder 62, so that the centerline of the suction pipe 84 may be offset from its axis of rotation (axis of rotation of the nozzle holder 62). The axis of rotation of the suction pipe 84 of the suction nozzle 62 will be referred to as "nozzle axis", which should be distinguished from the centerline of the suction pipe 84.

Figure 6:
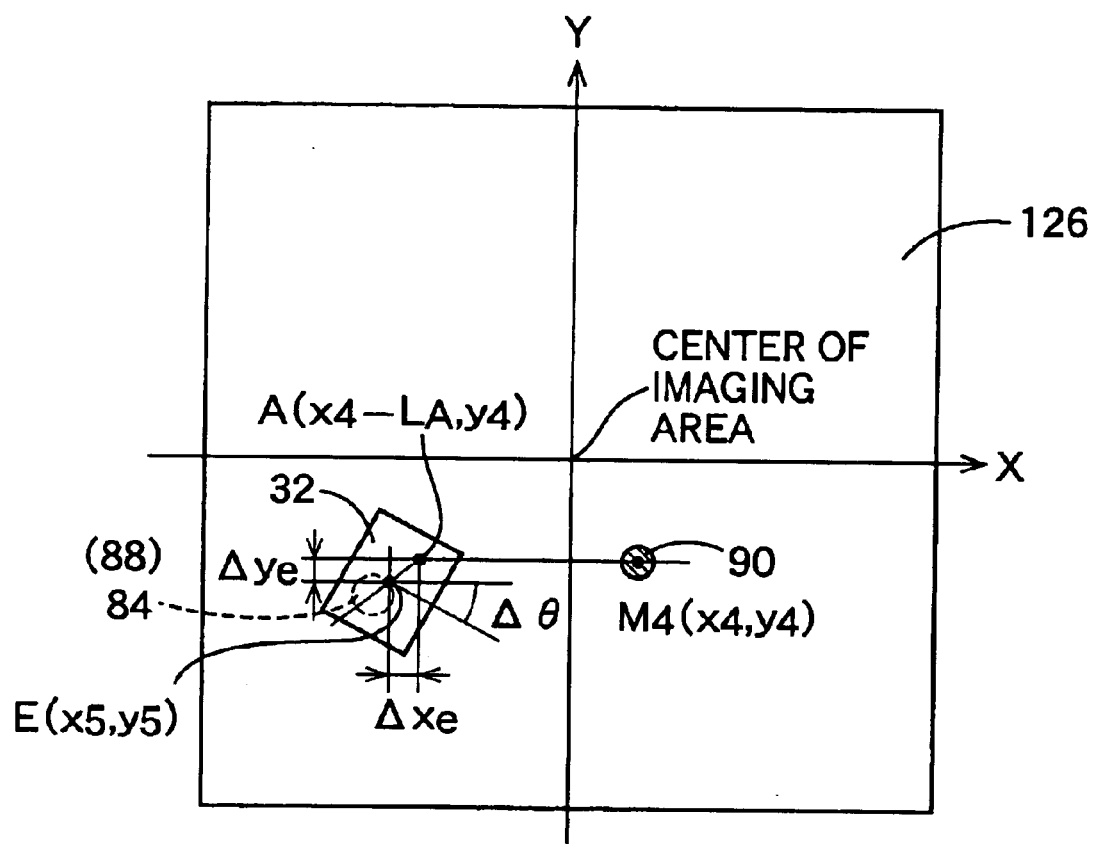
FIG. 6 is a view for explaining a manner of obtaining an error in the hold position of an electric component by the suction nozzle.

The X-axis slide 36 further carries the above-indicated image-taking device 118 and an illuminating device in the form of a strobe light 122, which are disposed below the Y-axis slide 42, and between the electric-component supply device 18 and the PWB transferring device 20 in the Y-axis direction, as shown in FIGS. 1 and 3. The image-taking device 118, which functions as an object recognition device, is arranged to take an image of the electric component 32 as held by the suction nozzle 60, and an image of the fiducial mark 90. The image-taking device 118 is provided with a CCD camera 120 which is positioned upwards such that its optical axis is parallel to the longitudinal direction of the suction pipe 84, which is parallel to the vertical direction. The CCD camera 120 includes as imaging elements a multiplicity of charge-coupled devices (CCD) which are arranged in a matrix and which cooperate with each other to define an imaging area 126 as indicated in FIG. 6, so that images are formed in the imaging area 126. As described above, the image-taking device 118 is focused on the electric component 32 held by the suction nozzle 60. In the electric-component mounting system 12 according to the present embodiment, the suction nozzle 60 is used to hold different kinds of the electric component 32 having respective different height dimensions. However, the maximum difference of the height dimensions of the different kinds of the electric component 32 is relatively small. The image-taking device 118 is focused, for example, at a position which is spaced downwards from the lower end face 88 of the suction pipe 84 by a distance equal to an average of the height dimensions of the electric components 32, when the suction nozzle 60 is located at its uppermost position. However, the image-taking device 118 may be focused at the lower or bottom surface of the electric component 32 having the largest or smallest height dimension, at which the electric component 32 is mounted on the printed-wiring board 24. In any case, the fiducial mark 90 is located within the field of depth of the image-taking device 118, so that a clear image of the fiducial mark 90 can be obtained by the image-taking device 118, together with a clear image of the electric component 32 or the lower end face 88 of the suction pipe 84.

A nozzle storage device (not shown) is disposed above the PWB conveyor 22, and at a position spaced from the printed-wiring-board support device of the PWB transferring device 20. The nozzle storage device accommodates different kinds of the suction nozzle 60 having respective different diameters. In the present embodiment, the suction pipes 84 of the different kinds of the suction nozzle 60 have different diameters, but have the same length, and are used to hold the different kinds of the electric component 32 having respective different sizes in the XY plane. The suction nozzle 60 of each kind has its fiducial mark 90 which is disposed as described above by reference to FIG. 2, so that when the suction nozzle 60 is held by the nozzle holder 2 the fiducial mark 90 is positioned in the axial direction of the suction pipe 84, so as to be located within the field of depth of the image-taking device 118, whereby a clear image of the fiducial mark 90 can be obtained by the image-taking device 118.

The nozzle storage device, which is constructed as disclosed in JP-B2-2824378, has a nozzle supporting surface which faces upwards and on which there is supported each suction nozzle 60 at a portion thereof located radially outwardly of the suction pipe 84 and pin 86. Each suction nozzle 60 supported on the nozzle supporting surface is positioned in the radial direction. When the suction nozzle 60 is accommodated in the nozzle storage device, the suction nozzle 60 is supported at its lower surface by the nozzle supporting surface of the nozzle storage device, and then the negative pressure is removed from the nozzle holder 62, and the nozzle holder 62 is communicated with the atmosphere, so that the suction nozzle 60 is removed from the nozzle holder 62. When the desired suction nozzle 60 accommodated in the nozzle storage device is mounted onto the nozzle holder 62, the suction nozzle 60 is first positioned such that the upper surface 71 of the nozzle body 58 of the suction nozzle 60 is in contact with the lower surface 72 of the nozzle holder 62, and then the negative pressure is applied to the nozzle body 58 so that the suction nozzle 60 is drawn at its upper surface 71 onto the lower surface 72 of the nozzle holder 62, whereby the suction nozzle 60 is transferred from the nozzle storage device onto the nozzle holder 62.

Figure 4:
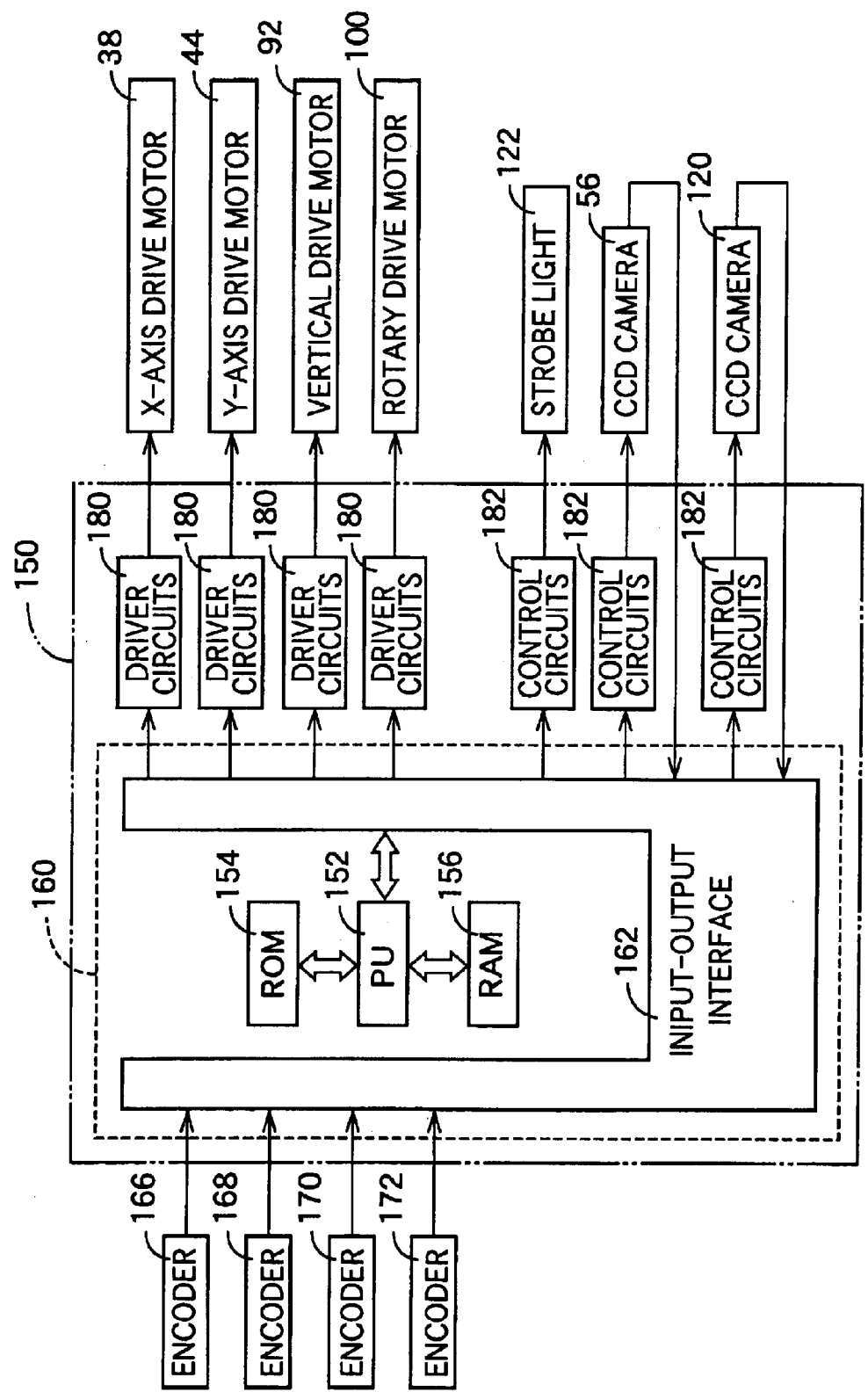
FIG. 4 is a block diagram schematically illustrating a control device of the electric-component mounting system.

The present electric-component mounting system 12 includes an image data processing device, such as control device 150 shown in the block diagram of FIG. 4. The control device is principally constituted by a computer 160 incorporating a processing unit (PU) 152, a read-only memory (ROM) 154, a random-access memory (RAM) 156 and a bus interconnecting those devices 152, 154, 156. To the bus of the computer 150, there is connected an input-output interface 162 which in turn is connected to the CCD cameras 56, 120, encoders 166, 168, 170, 172, and other devices. The encoders 166–172 are rotary position detecting devices arranged to detect the angles of the rotation of the X-axis drive motor 38, Y-axis drive motor 44, vertical drive motor 92 and rotary drive motor 100, respectively. In the present embodiment, the encoders 166–172 are of absolute type.

To the input-output interface 162, there are also connected through respective driver circuits 180 the various actuators such as the X-axis drive motor 38, and through respective control circuits 182 the CCD cameras 56, 120 and the strobe light 122. The X-axis drive motor 38 and the other drive motors 44, 92, 100 serve as drive devices in the form of electric motors. While the motors 38, 44, 92, 100 are servomotors in the present embodiment, they may be replaced by stepping motors or other electric motors which can be controlled in the angle of rotation. The driver circuits 180 and control circuits 182 cooperate with the computer 160 to constitute the control device 150. The ROM 154 stores various programs such as those for executing a main routine, and a relative-position obtaining routine illustrated in the flow chart of FIG. 9. The control device 150 in the present embodiment is arranged to: obtain a relative position between the fiducial mark 90 and the nozzle axis, on the basis of the image of the fiducial mark 90 taken by the image-taking device 118; obtain a relative position between the electric component 32 and the nozzle axis; obtain an error of the hold position of the electric component 32 relative to the suction nozzle 60; compensate the hold position for the obtained error; detect a bending of the suction pipe 84; compensate the position of the suction nozzle 60 for the detected bending of the suction pipe 84; detect or determine an amount of partial projection of the lower end face 88 of the suction pipe 84 from the periphery of the electric component 32 in the radial direction of the suction pipe 84; and compensate the hold position of the electric component 32 for the detected amount of partial projection of the lower end face 88. For easier understanding of the present embodiment, those operations will be described one by one.

When the electric component 32 is mounted onto the printed-wiring board 24, the printed-wiring board 24 is fed by the PWB conveyor 22 onto the printed-wiring-board support device of the PWB transferring device 20, so that the printed-wiring board 24 is supported by the support device, and clamped by the printed-wiring-board clamping device of the PWB transferring device 20. In this state, the mounting head 30 is moved by the XY robot 48, so that the mounting head 30 receives the electric component 32 from the electric-component supply device 18, and so that the electric component 32 is then moved to a predetermined position on the printed-wiring board 24, and mounted on the board 24 at the predetermined position. The path along which the mounting head 30 is moved to transfer the electric component 32 from the electric-component supply device 18 to the printed-wiring board 24 is determined such that a portion of the path is located right above the CCD camera 120 disposed on the X-axis slide 36. Namely, the suction nozzle 60 is moved so as to pass a position at which the electric component 32 held by the suction nozzle 60 and the fiducial mark 90 are concurrently positioned within the imaging area 126 of the CCD camera 120. The CCD camera 120 takes the images of the electric component 32 and the fiducial mark 90 simultaneously, in the vertical direction (parallel to the centerline of the suction pipe 84) toward the lower end face 88 of the suction pipe 84. The control device 150 obtains the hold position of the electric component 32 relative to the lower end face 88 of the suction nozzle 60, and other information, on the basis of image data which are received from the CCD camera 120 and which represent the images of the electric component 32 and the fiducial mark 90.

In the present embodiment, the hold position of the electric component 32 includes the center and axis of rotation of the electric component 32 in the XY plane perpendicular to the axis of rotation of the electric component 32. In the present embodiment, the position of the suction nozzle 60 is represented by the axis of rotation or centerline of the nozzle holder 62, while the center of the electric component 32 is defined with respect to the nozzle axis (axis of rotation of the suction pipe 84). Further, the angular position of the electric component 32 is represented by an angle of rotation of the electric component 32 about its center with respect to a nominal angular position. In the present embodiment, this nominal angular position is a position in which the two opposite short sides of the rectangular periphery of the electric component 32 as held by the suction pipe 84 such that a straight line passing the center of the fiducial mark 90 and the nozzle axis is parallel to the X-axis direction are parallel to the X-axis direction, while the two opposite long sides of the rectangular periphery of the electric component 32 are parallel to the Y-axis direction. Where the electric component 32 has a square peripheral profile, the nominal angular position is a position in which the two adjacent mutually perpendicular sides of the square periphery of the electric component 32 are parallel to the X-axis and Y-axis directions, respectively. In the present embodiment, the electric component 32 is normally or theoretically held by the suction pipe 84 such that the center of the electric component 32 is aligned with the nozzle axis, while the electric component 32 is placed in its nominal angular position. Actually, however, the center of the electric component 32 as held by the suction pipe 84 may be offset from the nozzle axis, and the actual angular position of the electric component 32 may deviate from the nominal angular position. In view of this, the actual position of the center of the electric component 32 and the actual angular position of the electric component 32 are obtained to obtain an error of the hold position of the electric component 32 relative to the suction nozzle 60, more specifically, an error of the actual center position and an error of the actual angular position of the electric component 32, in order to compensate the actual center position and angular position of the electric component 32 for the obtained errors, so that the electric component 32 is mounted on the printed-wiring board 24, so as to establish the nominal center position and the nominal angular position.

Figure 9:
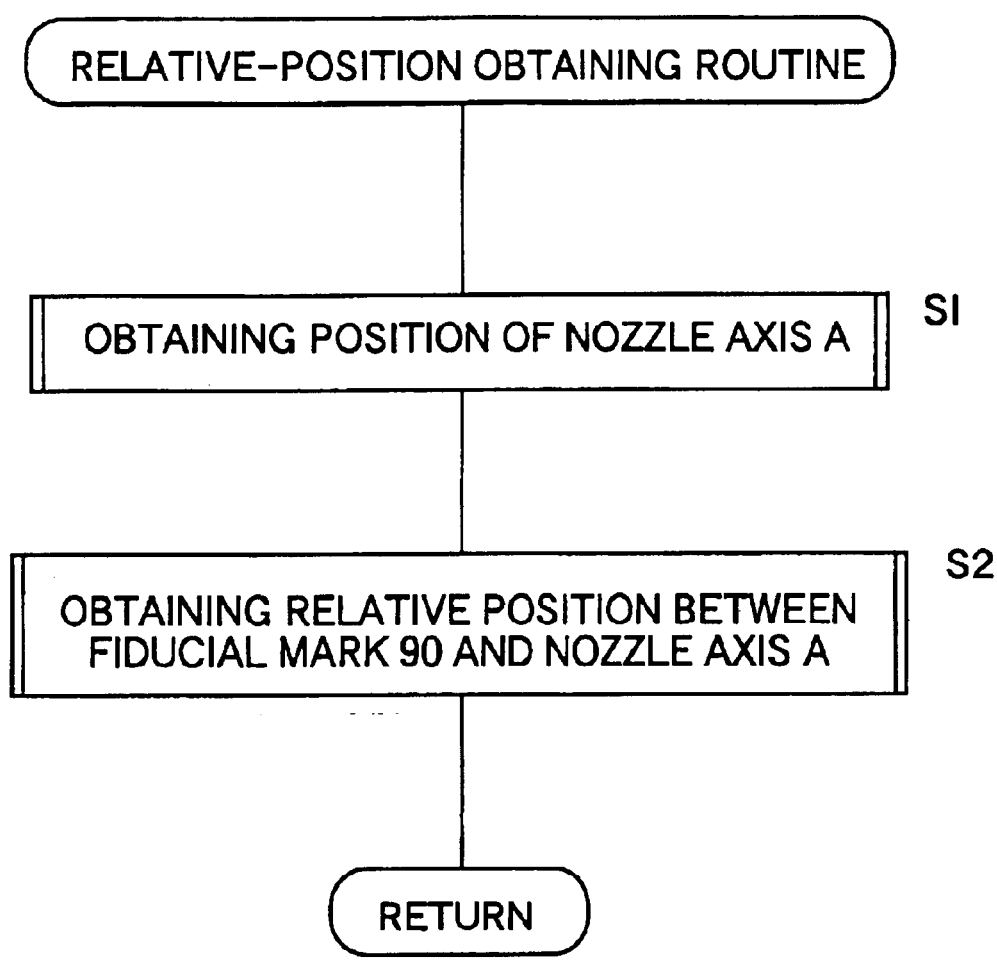
FIG. 9 is a flow chart illustrating a routine for obtaining the relative position between the fiducial mark and the axis of rotation of the suction nozzle, which routine is executed according to a program stored in a ROM of a computer of the control device indicated above.

The relative position between the electric component 32 and the nozzle axis is obtained on the basis of a relative position between the fiducial mark 90 and the nozzle axis, which relative position is obtained according to the relative-position obtaining routine illustrated in the flow chart of FIG. 9. To obtain the position of the electric component 32 relative to the nozzle axis, the fiducial mark 90 is utilized. The relative-position obtaining routine is executed to obtain the relative position between the nozzle axis and the fiducial mark 90 when each of the different kinds of the suction nozzle 60 is mounted on the nozzle holder 62, and before the electric component 32 is mounted on the printed-wiring board 24. As described above, the suction nozzle 60 is not positioned relative to the nozzle holder 62 in the radial and circumferential directions, so as to establish the nominal angular and center positions. Accordingly, the actual relative position between the nozzle axis and the fiducial mark 90 when the suction nozzle 60 is held by the nozzle holder 62 may vary from the nominal relative position. The relative-position obtaining routine of FIG. 9 is initiated with step S1 to obtain the position of the nozzle axis.

When the suction nozzle 60 which has been used is replaced by the new suction nozzle 60 to be used next for mounting the electric component 32 on the printed-wiring board 24, the nozzle holder 62 is moved to the nozzle storage device to return the used suction nozzle 60 to the nozzle storage device, and receives from the nozzle storage device the new suction nozzle 60 to be used next. Since the electric components 60 are accommodated at the predetermined radial positions in the nozzle storage device, the new suction nozzle 60 can be held by the nozzle holder 62 in the predetermined radial position, without a deviation of the center position of the suction nozzle 60 with respect to the axis of rotation of the nozzle holder 62.

After the new suction nozzle 60 has been held by the nozzle holder 62, the nozzle holder 62 is first rotated by the rotary drive motor 100 until the angle of rotation as detected by the encoder 172 is zeroed. At this time, the suction nozzle 60 is placed at its uppermost position. In this state, the nozzle holder 62 holding the suction nozzle 60 is moved to a predetermined image-taking position right above the CCD camera 120, and the strobe light 122 is activated to enable the image-taking device 118 to take images of the lower end face 88 of the suction pipe 84 and the fiducial mark 90. In the present embodiment, the image-taking position is a position in which the nozzle axis which is the axis of rotation of the nozzle holder 62 is aligned with the center of the imaging area 126 of the CCD camera 120 (with the center of the CCD matrix 126). This image-taking position is established by the relative movement device (not shown) which moves the XY robot 48 by operating the X-axis and Y-axis drive motors 34, 44 until the angular positions represented by the output signals of the encoders 166 168 have reached predetermined values corresponding to the image-taking position. When the XY robot 48 is stopped with the motors 34, 44 being turned off, however, the axis of the nozzle holder 62 thus positioned in the XY plane more or less deviates from the center of the imaging area 126 of the CCD camera 120, due to manufacturing and assembling errors of the electric-component mounting system 12. Accordingly, the nozzle axis A (axis of rotation of the suction pipe 84) more or less deviates from the center of the imaging area 126, as indicated in FIG. 5A.

Figure 5A:
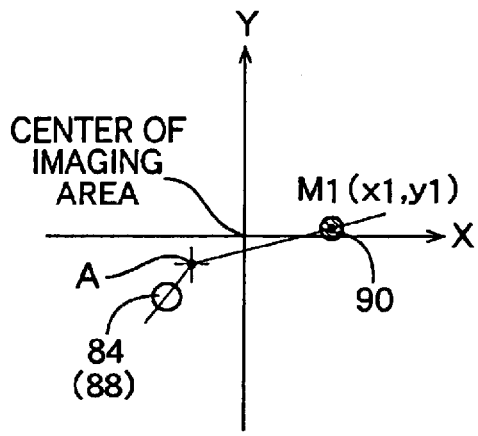
FIGS. 5A–5D are views for explaining a manner of obtaining the position of an axis of rotation of the suction nozzle of the electric-component mounting system, and a manner of obtaining a relative position between a fiducial mark and the axis of rotation of a suction pipe.
Figure 5C:
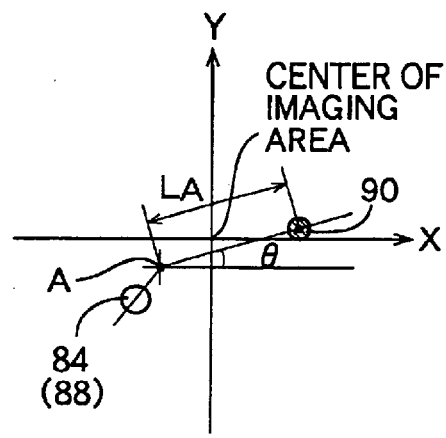
Figure 5B:
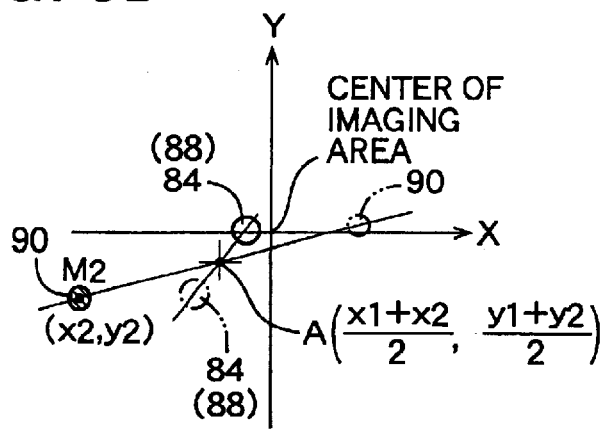
Figure 5D:
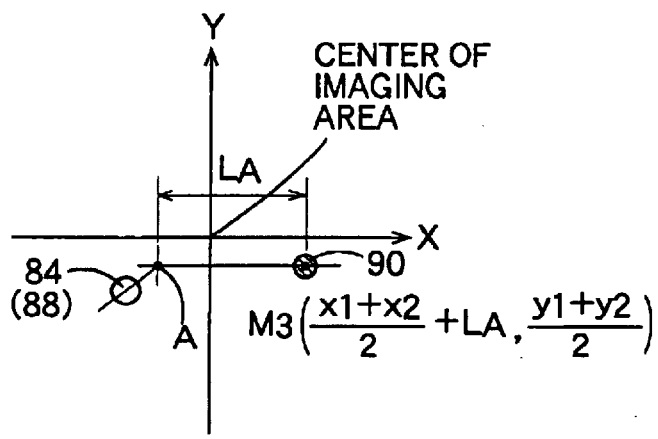

To obtain the amount of deviation of the nozzle axis A from the center of the imaging area 126, the coordinate values of the nozzle axis A in the XY coordinate system are obtained by taking images of the lower end face 88 of the suction pipe 84 and the fiducial mark 90, at two circumferential or angular positions of the nozzle holders 62 indicated in FIGS. 5A and 5B. In the angular position of FIG. 5A, the angle of rotation as represented by the output signal of the encoder 172 is 0°. In the angular position of FIG. 5B, the angle of rotation as represented by the output signal of the encoder 172 is 180°. The coordinate values of the nozzle axis A are obtained by processing image data representative of the images taken by the CCD camera 120. This processing of the image data is effected according to a pattern matching method as well known in the art and as disclosed in JP-A-11-211420 by way of example. Suppose the center position M1 of the fiducial mark 90 whose image is taken in the angular position of FIG. 5A is represented by coordinate values x1 and y1, while the center position M2 of the fiducial mark 90 whose image is taken in the angular position of FIG. 5B is represented by coordinate values x2 and y2, the nozzle axis A located between these two center positions M1, M2 is represented by coordinate values (x1+x2)/2, and (y1+y2)/2, as indicated in FIG. 5B.

After the coordinate values of the nozzle axis A have been obtained in step S1, the control flow goes to step S2 to calculate a distance LA between the center position M1 of the fiducial mark 90 and the nozzle axis A, as indicated in FIG. 5C, on the basis of the coordinate values x1 and y1 of the center position M1 (obtained in the angular position of FIG. 5A when the angle of rotation as represented by the output signal of the encoder 172 is 0°), and the coordinate values (x1+x2)/2, and (y1+y2)/2 of the nozzle axis A. The calculated distance LA is stored in the RAM 156. Step S2 is further formulated to calculate an angle θ between a first straight line passing the center position M1 of the fiducial mark 90 and the nozzle axis A, and a second straight line which passes the nozzle axis A and which is parallel to the X-axis, as also indicated in FIG. 5C. More precisely described, the angle θ is formed between the first straight line and a portion of the second straight line which is the positive side of the nozzle axis A. The angle θ is obtained together with a plus or minus sign depending upon whether the first straight line is on the clockwise or counterclockwise side of the second straight line as viewed in the direction of rotation about the nozzle axis A. The sign of the angle θ represents the direction of rotation of the nozzle holder 62. The calculated angle θ is also stored in the RAM 156.

Then, the nozzle holder 62 is rotated by the angle θ from the angular position of FIG. 5A (in which the angle as represented by the output signal of the encoder 172 is 0°) so that a third straight line passing the center position of the fiducial mark 90 and the nozzle axis A is parallel to the X-axis, as indicated in FIG. 5C. After the rotation of the nozzle holder 62, the angle as represented by the output signal of the encoder 172 is calculated and stored in the RAM 156. In this state, the Y-axis coordinate value (y1+y2)/2 of the center position M3 of the fiducial mark 90 is equal to that of the nozzle axis A, while the X-axis coordinate value {(x1+x2)/2+LA} of the center position M3 is a sum of the X-axis coordinate value (x1+x2)/2 of the nozzle axis A and the distance LA. When the third straight line passing the center of the fiducial mark 90 and the nozzle axis A is parallel to the X-axis while the fiducial mark 90 is located on the positive side of the nozzle axis A, the suction nozzle 60 is placed in its nominal circumferential or angular position. In this nominal angular position of the suction nozzle 60, the relative position between the fiducial mark 90 and the nozzle axis A is represented or defined by the distance LA therebetween. While the angular position of the fiducial mark 90 may vary when the angle of rotation as represented by the output signal of the encoder 172 is 0, the fiducial mark 90 is always located on the positive side of the nozzle axis A when the suction nozzle 60 is placed in the nominal angular position. The fiducial mark 90 may be located on the negative side of the nozzle axis A when the suction nozzle 60 is placed in its nominal angular position.

Figure 10:
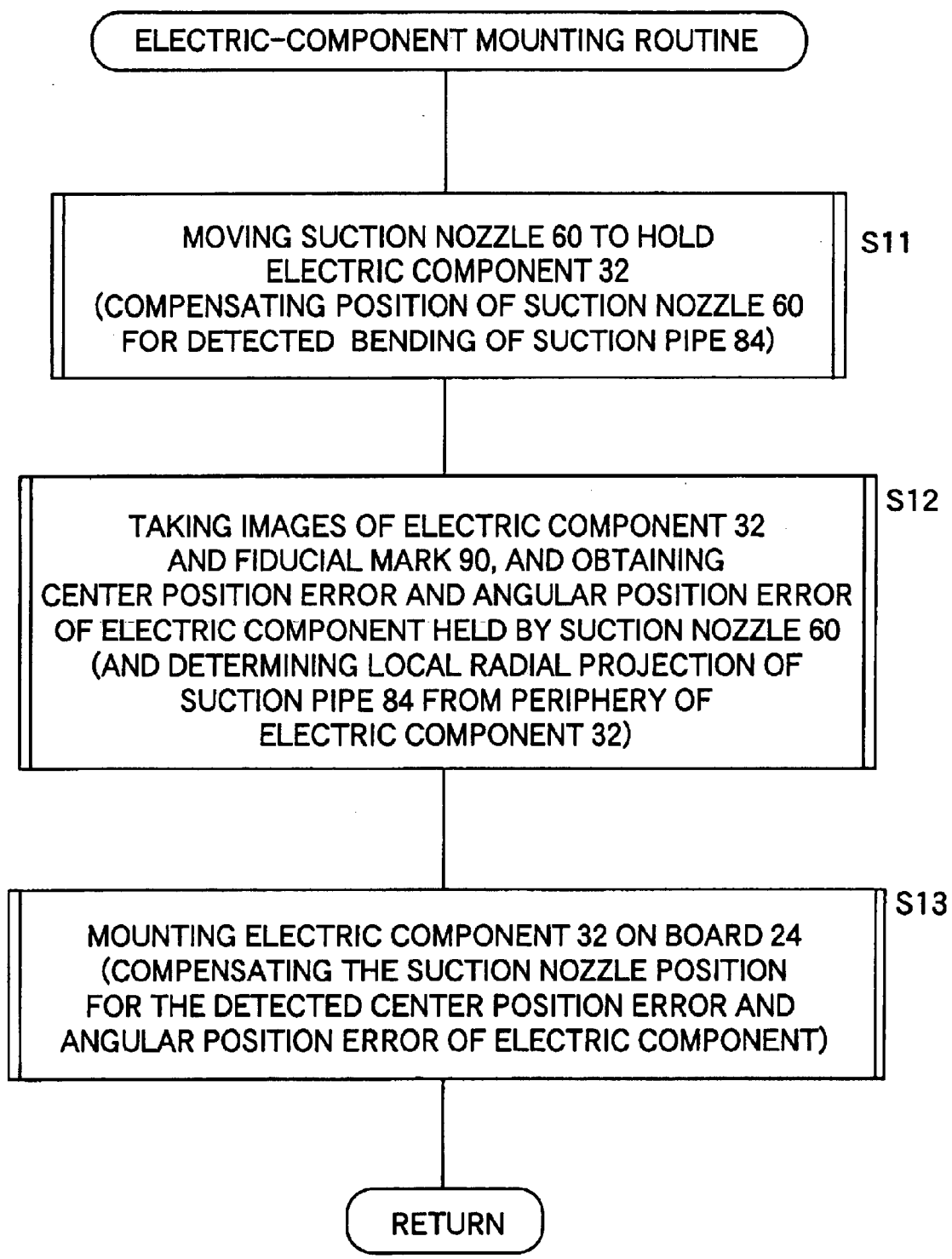
FIG. 10 is a flow chart illustrating an electric-component mounting routine executed according to a program stored in the ROM of the computer.

After the relative position between the fiducial mark 90 and the nozzle axis has been obtained, the electric component 32 is mounted on the printed-wiring board 24, according to an electric-component mounting routine illustrated in the flow chart of FIG. 10. This routine is initiated with step S11 in which the suction nozzle 60 is moved to the electric-component supply device 18, to hold the electric component 32 under the negative pressure. That is, the suction nozzle 60 is first placed in its nominal angular position, and is then lowered by the vertical drive device 52, to hold the electric component 32. After the suction nozzle 60 holds the electric component 32, the suction nozzle 60 is moved to its uppermost position, and is moved toward the printed-wiring board 24. During the movement of the suction nozzle 60 to the printed-wiring board 24, the suction nozzle 62 is instantaneously located right above the CCD camera 120. AT this time, step S12 is implemented for the CCD camera 120 to take the images of the electric component 32 and the fiducial mark 90, that is, to obtain image data representative of the images, and to obtain the relative position of the electric component 32 relative to the nozzle axis A, on the basis of the image data.

The images of the electric component 32 and the fiducial mark 90 are taken without stopping the movement of the nozzle holder 62 (of the suction nozzle 60), that is, during the movement of the nozzle holder 62, more precisely, when the nozzle holder 62 has reached the predetermined image-taking position. The movement of the nozzle holder 62 is effected with the suction nozzle 60 placed in its uppermost position, by operations of the X-axis drive motor 34 and the Y-axis drive motor 44. At the moment when the outputs of the encoders 166, 168 representative of the operating amounts of the motors 34, 44 have reached the predetermined values corresponding the image-taking position, the strobe light 122 is energized to illuminate the electric component 32 and the fiducial mark 90 while at the same time the CCD camera 120 instantaneously takes the images of the electric component 32 and the fiducial mark 90 simultaneously. Accordingly, the images of the electric component 32 and the fiducial mark 90 are formed in the imaging area 126 of the CCD camera 120, as indicated in FIG. 6. Since the fiducial mark 90 is located well within the field of depth of the CCD camera 120, the obtained image of the fiducial mark 90 is sufficiently clear.

An image of the suction pipe 84 (more precisely, its lower end face 88) is not taken, since the electric component 32 is held on the lower end face 88 of the suction pipe 84. However, the image of the fiducial mark 90 is taken together with the image of the electric component 32. Since the relative position between the fiducial mark 90 and the nozzle axis A when the suction nozzle 60 is placed in the nominal angular position is known, the position of the nozzle axis A can be obtained from the known position of the fiducial mark 90. That is, the coordinate values (x4−LA) and y4 of the nozzle axis A can be calculated on the basis of the coordinate values x4 and y4 of the center point M4 of the fiducial mark 90 and the distance LA between the center point M4 and the nozzle axis A.

Coordinate values x5 and y5 of a center E of the electric component 32 can be obtained on the basis of the obtained image of the electric component 32. Since the electric component 32 is normally held by the suction pipe 84 such that the center E is aligned with the axis of the nozzle holder 62 (namely, nozzle axis A), the position of the center E relative to the position of the nozzle axis A represent positioning errors $\Delta xe$ and $\Delta ye$ of the center E of the electric component 32 with respect to the nozzle axis A. The positioning errors $\Delta xe$ and $\Delta ye$ of the center E are calculated as (x4−LA−x5) and (y4−y5), respectively, on the basis of the coordinate values of the center E and the coordinate values of the nozzle axis A.

Further, the angular position of the electric component 32 is obtained on the basis of the obtained image of the electric component 32, and an angular positioning error $\Delta\theta$ is obtained. In the present embodiment, the angular position of the electric component 32 is defined with respect to a nominal angular position about the center E of the electric component 32. In the nominal angular position of the electric component 32 when the suction nozzle 60 (nozzle holder 62) is placed in its nominal angular position, the opposite short sides and the opposite long sides of the rectangle of the peripheral profile of the obtained image of the electric component 32 are parallel to the X-axis and the Y-axis, respectively. For instance, the actual angular position of the electric component 32 is represented by an angle of a straight line which passes the center E of the rectangle and which is parallel to the short sides of the rectangle, with respect to the X-axis, and a sign of the angle (direction of inclination of the angle). The thus obtained actual angular position represents the angular positioning error $\Delta\theta$ of the electric component 32 with respect to the nominal angular position in which the electric component 32 is normally held by the suction pipe 84. The nominal angular position of the electric component 32 is an angular position in which the straight line passing the center of the fiducial mark 90 and the nozzle axis A is parallel to the X-axis. The actual angular position of the electric component 32 about the nozzle axis A is obtained on the basis of the relative position between the fiducial mark 90 and the nozzle axis A.

The control flow then goes to step S13 in which the electric component 32 is mounted at a predetermined mounting position on the printed-wiring board 24. Before the electric component 32 is mounted on the printed-wiring board 24, the position of the electric component 32 is corrected to eliminate the positioning errors $\Delta xe$ and $\Delta ye$ of the center E and the angular positioning error $\Delta\theta$ of the electric component 32. The positioning errors $\Delta xe$ and $\Delta ye$ can be eliminated by compensating the distances of movements of the suction nozzles 60 in the X-axis and Y-axis directions to the predetermined mounting position on the printed-wiring board 24, and the angular positioning error $\Delta\theta$ can be eliminated by rotating the suction nozzle 60 by the angle $\Delta\theta$. The amounts of compensation of the movement distances of the suction nozzle 60 are determined on the basis of not only the positioning errors $\Delta xe$ and $\Delta ye$, but also X-axis and Y-axis positioning errors of the mounting position on the printed-wiring board 24, and a positioning error of the center E of the electric component 32 which is caused by the rotation of the suction nozzle 60 to eliminate the angular positioning error $\Delta\theta$. When the suction nozzle 60 is lowered by the vertical drive device 52 to mount the electric component 32 on the printed-wiring board 24, the fiducial mark 90 is lowered with the suction nozzle 60. Since the fiducial mark 90 is spaced from the lower end face 88 of the suction pipe 88 in the direction away from the printed-wiring board 24, the fiducial mark 90 is prevented from contacting or interfering with the electric components 32 which have already been mounted on the board 24. In the present embodiment, different kinds of the electric components 32 are mounted in a predetermined order such that the electric component 32 having a comparatively small size or height dimension is mounted before the electric component 32 having a comparatively large size or height dimension. Accordingly, where the electric components 32 having respective different height dimensions are mounted on the printed-wiring board 24, using a certain kind of the suction nozzle 60, the height dimensions of the electric components 32 which have been mounted on the board 24 are all smaller than the largest one of the height dimensions of the electric components 32 which are to be mounted with the above-indicated kind of the suction nozzle 60. This arrangement prevents an interference of the fiducial mark 90 with the already mounted electric components 32.

As described above, the image of the suction pipe 84 is not taken when the image of the electric component 32 is taken, but the image of the fiducial mark 90 is taken together with the image of the electric component 32. Since the relative position between the fiducial mark 90 and the nozzle axis A is known, the position of the nozzle axis A can be obtained from the position of the fiducial mark 90, and the positioning errors of the electric component 32 as held by the suction nozzle 60 can be obtained on the basis of the position of the electric component 32 relative to the nozzle axis A. Since the image of the electric component 32 is taken without interrupting the movement of the suction nozzle 60, that is, during the movement of the suction nozzle 60, the moment at which the image of the electric component 32 is taken may be delayed. However, the positioning errors of the electric component 32 as held by the suction nozzle 60 can be accurately detected. The position of the nozzle axis A when the electric component 32 is imaged may deviate from the center of the imaging area 126 of the CCD camera 120, as indicated in FIG. 6, due to the delayed imaging of the electric component 32 as well as the various manufacturing and assembling errors of the electric-component mounting system 12. The amount of this deviation increases with an increase in the speed of the movement of the suction nozzle 60. In the present embodiment wherein the image of the fiducial mark 90 is obtained together with the image of the electric component 32, however, the amount of deviation of the actual position of the image of the electric component 32 formed in the imaging area 126 from the nominal position is equal to the amount of deviation of the actual position of the image of the fiducial mark 90 formed in the imaging area 126 from the nominal position, even where those deviations take place due to the delayed imaging of the electric component 32 and the fiducial mark 90. In the nominal position, the nozzle axis A lies on the center of the imaging area 126. Therefore, the relative position between the electric component 32 and the position of the nozzle axis A which is obtained on the basis of the obtained image of the fiducial mark 90 does not include an error due to the delayed imaging. Accordingly, the present arrangement permits accurate detection or determination of the positioning errors of the center E and the angular positioning error of the electric component 32 on the basis of the images of the electric component 32 and the fiducial mark 90 which are obtained during the movement of the suction nozzle 60 at a comparatively high speed. Thus, the present electric-component mounting system 12 is capable of mounting the electric component 32 at the predetermined mounting position on the printed-wiring board 24, with a high degree of accuracy, with the electric component 32 placed in the predetermined nominal posture, while assuring a high degree of mounting efficiency of the electric component 32 owing to the comparatively high speed of movement of the suction nozzle 60 to the printed-wiring board 24. The present mounting system 12 is further arranged to hold the electric component 32 on the suction nozzle 60 and take the image of the electric component 32, with the suction nozzle 60 placed in the nominal angular position in which the straight line passing the fiducial mark 90 and the nozzle axis A is parallel to the X-axis direction. This arrangement makes it possible to obtain the position of the nozzle axis A on the basis of the image of the fiducial mark 90 taken in the nominal circumferential or angular position of the suction nozzle 60 (nozzle holder 62).

Figure 7:
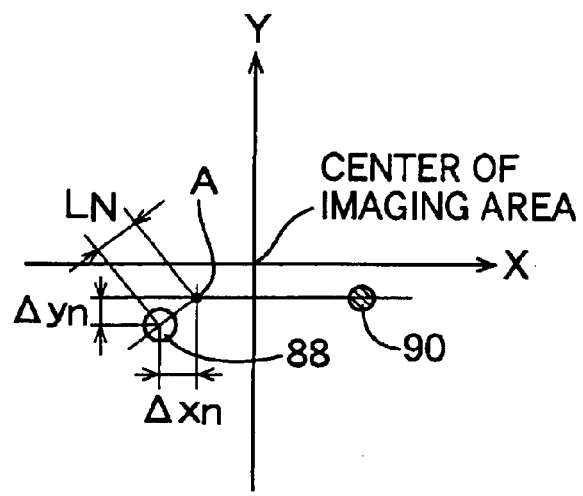
FIG. 7 is a view for explaining a manner of obtaining an amount and a direction of bending of a suction pipe of the suction nozzle.

Then, the detection of a bending of the suction pipe 84 will be described. The present embodiment is adapted to obtain, as an amount of bending of the suction pipe 84, a deviation of the center of the lower end face 88 of the suction pipe 84 with respect to the nozzle axis A. This deviation is defined by the amount and direction of the deviation which correspond to the amount and direction of the bending of the suction pipe 84, respectively. The deviation amount is represented by a distance LN between the center of the lower end face 88 of the suction pipe 84 and the nozzle axis A, as indicated in FIG. 7, while the deviation direction is represented by an angle formed between a straight line passing the nozzle axis A and the center of the lower end face 88, and a straight line passing the nozzle axis A and the center of the fiducial mark 90. The bending of the suction pipe 84 is detected when the electric component 32 is not held by the suction nozzle 60.

Figure 11:
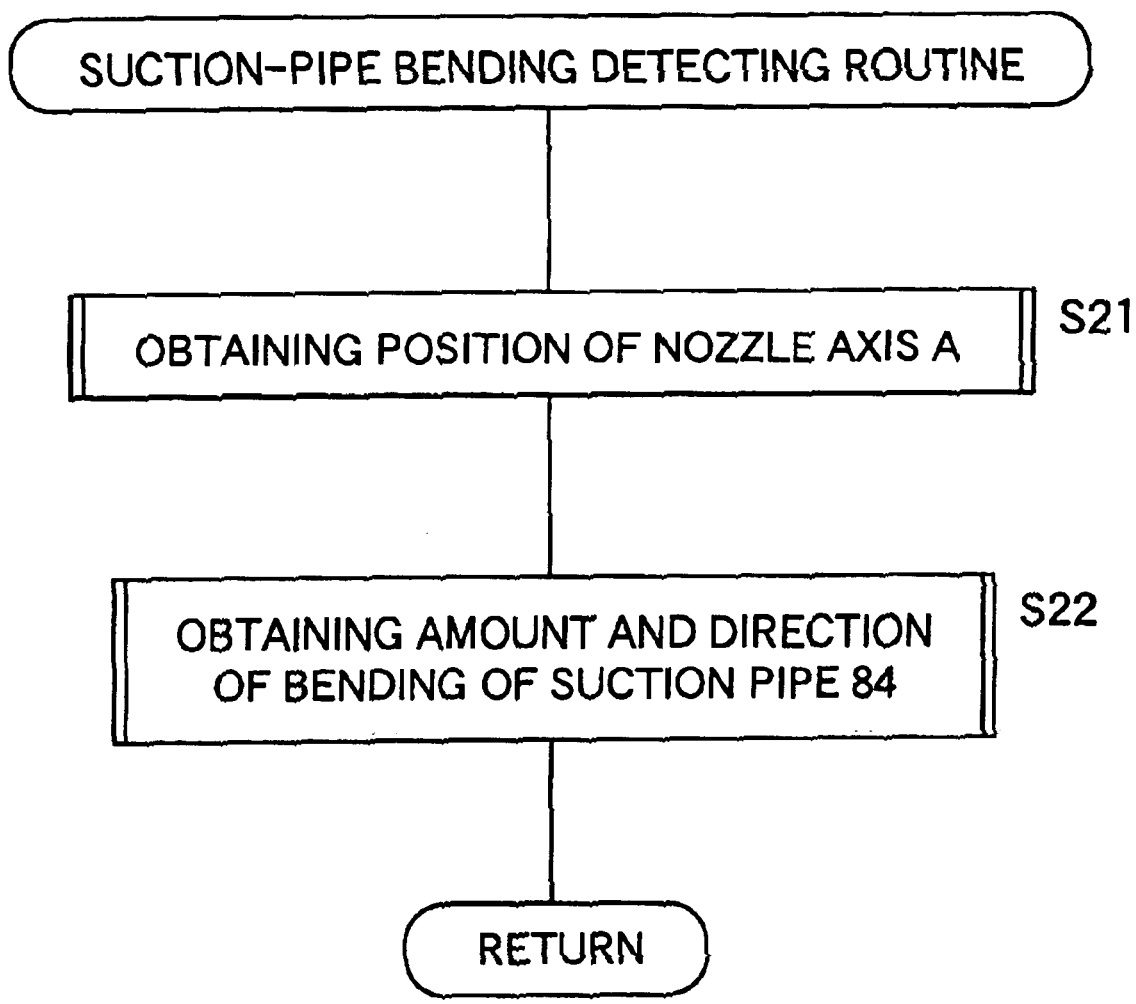
FIG. 11 is a flow chart illustrating a routine for detecting bending of the suction nozzle, which routine is executed according to a program stored in the ROM of the computer.

The bending of the suction pipe 84 is detected according to a suction-pipe bending detecting routine illustrated in the flow chart of FIG. 11. This routine is initiated with step S21 to obtain the position of the nozzle axis A in the same manner as in step S1 of the flow chart of FIG. 9. That is, the suction nozzle 60 is rotated to take the images of the fiducial mark 90 in the two angular positions of 0° and 180°. On the basis of the obtained images of the fiducial mark 90, the coordinates of the position of the nozzle axis A are calculated. The images of the lower end face 88 of the suction pipe 88 are obtained concurrently with the images of the fiducial mark 90 which are taken in the two angular positions to obtain the position of the nozzle axis A. On the basis of the images of the lower end face 88, the relative position between the lower end face 88 and the nozzle axis A is obtained.

In the present embodiment wherein the electric component 32 is held by the suction nozzle 60 while the suction nozzle 60 is placed in the nominal angular position described above, the amount and direction of the bending of the suction pipe 84 are obtained also when the suction nozzle 60 is placed in the nominal angular position. To this end, step S22 is implemented to obtain the position of the center of the lower end face 88 in the angular position of the suction nozzle 60 in which the angle as detected by the encoder 172 is 0°, and to obtain the angle θ formed between the straight line passing the nozzle axis A and the center of the fiducial mark 90, and the X-axis. On the basis of the obtained angle θ, there are calculated the coordinate values of the center position of the lower end face 88 in the nominal angular position of the suction nozzle 60. Further, distances Δxn and Δyn of deviation of the center of the lower end face 88 with respect to the nozzle axis A in the X-axis and Y-axis directions are obtained together with their signs, as indicated in FIG. 7. The obtained deviation distances Δxn and Δyn are stored in the RAM 154 as the values representative of the amount and direction of the bending of the suction pipe 84. Thus, the coordinate values of the position of the lower end face 88 of the suction pipe 84 is obtained in the angular position in which the straight line passing the nozzle axis A and the center of the fiducial mark 90 is parallel to the X-axis direction. The amount and direction of the bending of the suction pipe 84 with respect to the nozzle axis A are detected on the basis of the relative position among the fiducial mark 90, the lower end face 88 of the suction pipe 84 and the nozzle axis A. The position of the nozzle axis A obtained to obtain the relative position between the fiducial mark 890 and the nozzle axis A may be used to detect the bending of the suction pipe 84.

The bending of the suction pipe 84 is obtained each time the suction nozzle 60 is mounted on the nozzle holder 62, and the position of the suction nozzle 60 at which the electric component 32 is held by the suction nozzle 60 in step S11 of the electric-component mounting routine of FIG. 10 is compensated for the deviation distances Δxn and Δyn. The suction nozzle 60 may have some degree of bending due to an error of its manufacture and/or its repeated use for holding the electric component 32. Where the surface area of the lower end face 88 is considerably larger than that of the electric component 32, the lower end face 88 does not have a risk of partial radial projection beyond the periphery of the electric component 32. Where the electric component 32 is relatively small so that the difference between the surface areas of the lower end face 88 and the electric component 32 is not so large, the lower end face 88 is relatively likely to partially project beyond the periphery of the electric component 32 in the radial direction, when the suction pipe 84 has some amount of bending. In the present embodiment wherein the position of the suction nozzle 60 is compensated for the deviation distances Δxn and Δyn due to the bending of the suction pipe 84, the lower end face 88 of the suction pipe 84 is relatively unlikely to project beyond the periphery of the electric component 32, even if the suction pipe 84 is bent and the electric component 32 is relatively small. In the present embodiment, the suction nozzle 60 is not positioned relative to the nozzle holder 62 in the radial and circumferential directions to establish predetermined center position and angular position of the suction nozzle 60, when the suction nozzle 60 is drawn onto the nozzle holder 62. Accordingly, the center of the lower end face 88 of the suction pipe 84 may deviate from the nozzle axis A due to not only the bending of the suction pipe 84 but also the misalignment of the centerline of the suction pipe 84 with respect to the axis of the nozzle holder 60 upon mounting of the suction nozzle 60 onto the nozzle holder 62. The deviation of the center of the lower end face 88 with respect to the nozzle axis A may also take place due to an error upon mounting of the suction pipe 84 onto the nozzle body 58 of the suction nozzle 60. However, the compensation of the position of the suction nozzle 60 for the bending of the suction pipe 84 assures accurate holding of the electric component 32 on the lower end face 88 of the suction pipe 84, irrespective of the deviation of the suction nozzle 60 with respect to the nozzle holder 62, and even where the electric component 32 held by the suction nozzle 60 has a relatively small size.

The amount of bending of the suction pipe 84 tend to increase with an increase in the cumulative number of the electric components 32 which have been mounted on the printed-wiring board 24, with that suction pipe 84. In view of this tendency, the bending of the suction pipe 84 is detected when a predetermined condition satisfied after the initiation of mounting of the electric components 32 with the suction pipe 84 after the last detection of the bending of the suction pipe 84 when the suction nozzle 60 was mounted on the nozzle holder 62. The predetermined condition may be satisfied when a predetermined number of the electric components 32 have been mounted on the printed-wiring board 24 with the same suction nozzle 60, or when the electric component 32 cannot be correctly held by the suction pipe 84, that is, when any one of holding failures of the electric component 32 has occurred. The holding failures of the electric component 32 include: a complete failure of the suction nozzle 60 to hold the electric component 32: holding of the electric component 32 with an excessive large amount of positional deviation of the component 32 with respect to the lower end face 88 of the suction pipe 88 so that the position of the suction nozzle 60 cannot be compensated to remove the positional deviation; and holding of the electric component 32 in an upright posture with one of its four side faces in contact with the lower end face 88. Such holding failures of the electric component 32 can be recognized on the basis of image data obtained by the CCD camera 120. It is noted that the bending of the suction pipe 84 is also detected while the suction nozzle 60 is placed in its nominal angular position, without the electric component 32 held on the suction pipe 84. Where the detection of the bending of the suction pipe 84 is effected two or more times with the suction nozzle 60 kept mounted on the nozzle holder 62, the position of the nozzle axis A obtained in the first detection may be used in the second and subsequent detections.

The amount and direction of the bending of the suction pipe 84 may be detected when the suction nozzle 60 is placed in an angular position other than the nominal angular position. In this case, the angular positions of the suction nozzle 60 in which the electric component 32 is held by the suction nozzle 60 and mounted on the printed-wiring board 24 are obtained with respect to the angular position in which the bending of the suction pipe 84 is detected, so that the amount and direction of the bending of the suction pipe 84 when the electric component 32 is held by the suction nozzle 60 and mounted on the board 24 can be calculated on the basis of the obtained angular positions, so that the positions of the suction nozzle 60 when the electric component 32 is held by the suction nozzle 60 and mounted on the board 24 can be compensated for the calculated amount and direction of the bending of the suction pipe 84.

Figure 8:
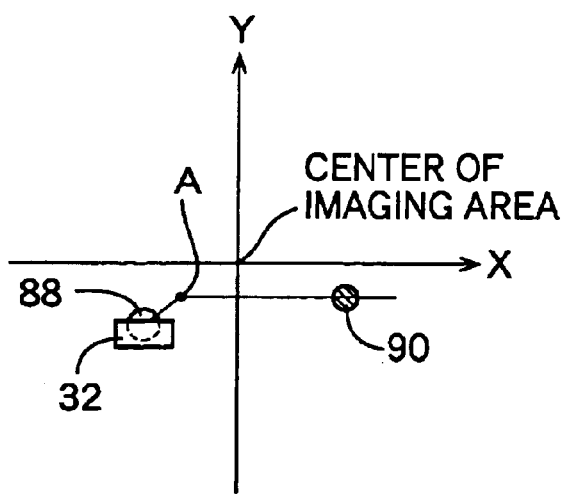
FIG. 8 is a view for explaining a manner of processing of image data where the end face of the suction pipe of the suction nozzle is partially located outside the profile of the electric component.

There will next be described a manner of determining the partial radial projection of the lower end face 88 of the suction pipe 84 from the periphery of the electric component 32. Even where the lower end face 88 of the suction pipe 84 partially projects from the periphery of the electric component 32 in the radial direction of the suction pipe 84, the periphery of the electric component 32 can be accurately obtained on the basis of the image data of the electric component 32, and the obtained relative position among the center of the fiducial mark 90, the center of the lower end face 88 and the position of the nozzle axis A. For instance, the lower end face 88 may partially project from the periphery of the electric component 32 even after the position of the suction nozzle 60 is compensated before holding the electric component 30, where the suction pipe 84 has some amount of bending and where the electric component 32 has a relatively small size, with a relatively small difference between the sizes of the lower end face 88 and the electric component 32, even if the surface area of the lower end face 88 is smaller than that of the electric component 32. In some cases, the size of the electric component 32 is smaller than that of the lower end face 88, so that the lower end face 88 inevitably partially projects from the periphery of the electric component 32. In such cases, the image taken by the CCD camera 120 includes a part of the lower end face 88 of the suction pipe 84, as indicated in FIG. 8.

The relative position among the fiducial mark 90, the lower end face 88 and the nozzle axis A can be obtained, for example, with the suction nozzle 60 placed in the nominal circumferential or angular position, in the same manner as in the case of detecting the bending of the suction pipe 84. Based on the obtained relative position, the deviation distances Δxn and Δyn of the center of the lower end face 88 with respect to the nozzle axis A are obtained. In the present embodiment, these deviation distances Δxn and Δyn are obtained according to the suction-pipe bending detecting routine. In step S 12 of the electric-component mounting routine of FIG. 10 which is implemented after the electric component 32 has been held by the suction nozzle 60, the position of the nozzle axis A is obtained on the basis of the image data of the fiducial mark 90 and the relative position between the fiducial mark 90 and the nozzle axis A, and the position of the center of the lower end face 88 is obtained on the basis of the relative position between the nozzle axis A and the lower end face 88. Since the diameter of the lower end face 88 of the suction pipe 84 is known, the peripheral profile or outline of the lower end face 88 is determined on the basis of the obtained center position of the lower end face 88 and the known diameter. The peripheral outline of the electric component 32 can be obtained by subtracting the peripheral outline of the radially projecting part of the lower end face 88 from the outline which consists of the outline of the component 32 and the outline of the radially projecting part of the lower end face 88. Based on the thus obtained outline of the electric component 32, the center position of the electric component 32 is obtained, so that the positioning error of the center of the component 32 can be obtained with high accuracy. Accordingly, the present arrangement prevents the holding failure or defect of the electric component 32 or a processing error of the image data obtained by the CCD camera 120.

It is noted that it is not essential to obtain the position of the nozzle axis A, provided that the relative position between the fiducial mark 90 and the lower end face 88 is obtained. Where the operation to obtain the relative position between the fiducial mark 90 and the lower end face 88, the operation to hold the electric component 32 on the suction nozzle 60 and the operation to take the image of the electric component 32 are necessarily performed in the same angular position of the suction nozzle 60, the position of the lower end face 88 can be determined on the basis of the position of the fiducial mark 90 obtained from its image, and the obtained relative position between the fiducial mark 90 and the lower end face 88. The same is true where the electric component 32 is mounted on the printed-wiring board 24, without rotation of the suction nozzle 60.

It will be understood from the foregoing description of the present first embodiment of this invention that the electric-component mounting device 16 constitutes an electric-component handling device operable to handle the electric component 32, while the XY robot 48 constitutes a first relative-movement device for moving the suction nozzle 60 and the image-taking device 118 relative to each other. It will also be understood that a portion of the control device 150 assigned to implement steps S1 and S2 constitutes a fiducial-mark/nozzle-axis relative-position obtaining portion operable to obtain a relative position between the fiducial mark 90 and the nozzle axis A, which portion serves as a fiducial-mark/suction-pipe relative-position obtaining portion operable to obtain a relative position between the fiducial mark 90 and the centerline of the suction pipe 84 in the nominal angular position, and that a portion of the control device 150 assigned to implement step S12 constitutes a component/nozzle-axis relative-position obtaining portion operable to obtain a relative position between the electric component 32 and the nozzle axis A, which portion serves as a component/suction-pipe relative-position obtaining portion operable to obtain a relative position between the electric component 32 and the centerline of the suction pipe 84 in the nominal angular position. It will further be understood that the portion of the control device 150 assigned to implement step S12 also constitutes a hold-position-error obtaining portion operable to obtain a positioning error of the electric component 32 as held by the suction nozzle 60. It will also be understood that a portion of the control device 150 assigned to implement steps S21 and S22 constitutes a suction-pipe-bending detecting portion operable to detect a bending of the suction pipe 84, and that a portion of the control device 150 assigned to implement step S12 constitutes a radial-projection determining portion operable to determine a partial radial projection of the lower end face 88 of the suction pipe 84 from the periphery of the electric component 32, which determining portion serves as a projection-considering type component/nozzle-axis relative-position obtaining portion operable to determine the peripheral outline of the electric component 32 beyond which the peripheral outline of the lower end face 88 partially radially projects, and obtain a relative position between the center of the electric component 32 and the nozzle axis A, by taking account of the partial radial projection of the peripheral outline of the lower end face 88. The radial0projection determining portion also serves as a projection-considering type hold-position-error obtaining portion operable to obtain the positioning error of the center position of the electric component 32 as held by the suction nozzle 60, by taking account of the partial radial projection of the lower end face 88. It will further be understood that the above-described various portions constituted by the control device 150 cooperate to constitute an image data processing device. It will also be understood that a portion of the control device 150 assigned to implement step S13 constitutes a hold-position-error compensating portion operable to compensate the position of the suction nozzle 60 for the error of the center position and the error of the angular position of the electric component 32, and that a portion of the control device 150 assigned to implement steps S11 and S13 constitutes a bending compensating portion operable to compensate the position of the suction nozzle 60 for the bending of the suction pipe 82. It will further be understood that the vertical drive device 52 provided to move the suction nozzle 60 in the vertical direction constitutes a second relative-movement device operable to move the suction nozzle 60 and the printed-wiring board 24 relative to each other, in a direction perpendicular to the surface of the printed-wiring board 24, and also a third relative-movement device operable to move the suction nozzle 60 and fiducial mark 90 relative to the image-taking device 118 relative to each other, in the axial direction of the suction pipe 84.

Figure 12:
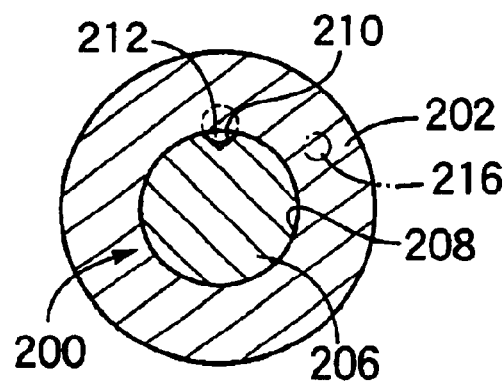
FIG. 12 is a plan view in transverse cross section schematically showing a suction nozzle as held by a holder in another embodiment of this invention.

In the first embodiment described above, the suction nozzle 60 is held by the nozzle holder 62 without positioning of the suction nozzle 60 relative to the nozzle holder 62 in the circumferential and radial directions, so that the center position and the angular position of the suction nozzle 60 relative to the nozzle holder 62 may vary when the suction nozzle 60 is removed from the nozzle holder 62 and mounted again on the nozzle holder 62. However, the suction nozzle and the nozzle holder may be arranged such that the suction nozzle is positioned in the circumferential and radial directions relative to the nozzle holder when the suction nozzle is held by the nozzle holder. An example of this modified arrangement includes a suction nozzle 200 and a nozzle holder 202, which are schematically shown in FIG. 12. The suction nozzle 200 includes an engaging protrusion 206 which extends from a central portion of its nozzle body toward the nozzle holder 202 and which is coaxial with the suction pipe. On the other hand, the nozzle holder 202 has an engaging recess 208 formed in a central portion of its lower surface. The engaging protrusion 206 is tapered such that the diameter of its outer circumferential surface continuously decreases in the direction from the proximal end toward the distal or free end on the side of the nozzle holder 202, while the inner circumferential surface of the engaging recess 208 is tapered so as to contact with the tapered outer circumferential surface of the engaging protrusion 206. The engaging protrusion 206 has a V-groove 210 formed so as to be open in its outer circumferential surface, while the engaging recess 208 is provided with a ball 210 which is disposed such that the ball 212 partially projects from its inner circumferential surface.

Figure 13:
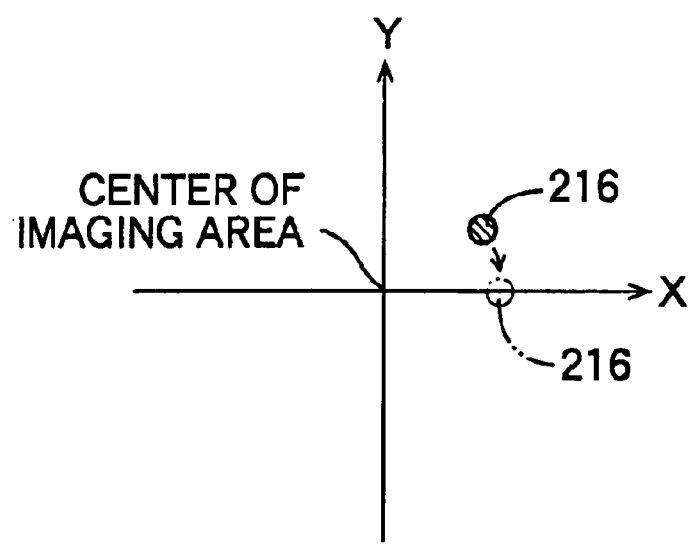
FIG. 13 is a view for explaining a manner of setting a zero-point of the holder shown in FIG. 12.

When the suction nozzle 200 is held by the nozzle holder 202, the engaging protrusion 206 is fitted in the engaging recess 208 so that the centerline of the suction nozzle 200 is aligned with the centerline or axis of rotation of the nozzle holder 202, while the ball 212 is held in contact with the surfaces of the V-groove 210 so that the suction nozzle 200 is held in a predetermined angular position relative to the nozzle holder 202. It will be understood that the engaging protrusion 206 and the engaging recess 208 constitute a radial positioning device operable to position the suction nozzle 200 relative to the nozzle holder 202 in the radial direction to establish alignment of the centerline of the suction nozzle 200 with the axis of rotation of the nozzle holder 202. It will also be understood that the ball 212 and the V-groove 210 constitute a relative-rotation inhibiting device operable to inhibit relative rotation between the suction nozzle 200 and the nozzle holder 202, and also a circumferential or angular positioning device operable to position the suction nozzle 200 relative to the nozzle holder 202 in the circumferential direction to hold the suction nozzle 200 in the predetermined angular position relative to the nozzle holder 202. The engaging protrusion 206 having the V-groove 210 and the engaging recess 208 having the ball 212 assure accurate positioning of the suction nozzle 200 relative to the nozzle holder 202 in the radial and circumferential directions, with a high level of reproducibility, even where the suction nozzle 200 is repeatedly attached and removed to and from the nozzle holder 202. Accordingly, a fiducial mark 216 (FIG. 13) provided on the suction nozzle 200 can be accurately positioned in the circumferential and radial directions of the nozzle holder 202, as if the fiducial mark 216 were fixed on the nozzle holder 202, so that a reference angular position (0-degree circumferential position) of the nozzle holder 202 can be accurately set on the basis of the position of the fiducial mark 216. It is noted that like the fiducial mark 90, the fiducial mark 216 is provided on the nozzle body of the suction nozzle 200.

The setting of the reference angular position of the nozzle holder 200 is required, for example, when the required accuracy of mounting of the electric component 32 on the printed-wiring board 24 is relatively high. If the nozzle holder 202 is rotated by a rotary drive device similar to the rotary drive device 54 used in the first embodiment of FIGS. 1–11, for instance, the nozzle holder 202 is splined to the drive gear 106. If the axis of the splined hole 112 is slightly inclined relative to the vertical axis of the driven gear 106, the axis of the nozzle holder 202 is also slightly inclined relative to the vertical axis of the driven gear 106, so that the nozzle holder 202 is vertically moved in a direction slightly inclined relative to the vertical axis. The inclination of the axis of the nozzle holder 202 causes a variation or shifting of the point of intersection between the axis of the nozzle holder 202 and the surface of the printed-wiring board 24 as the driven gear 106 and the nozzle holder 202 are rotated. That is, the point of intersection is moved depending upon the circumferential or angular position of the nozzle holder 202 which carries the suction nozzle 200 holding the electric component 32, so that the position at which the electric component 32 is mounted on the printed-wiring board 24 deviates from the predetermined component-mounting position in the direction parallel to the surface of the board 24, whereby the mounting accuracy of the electric component 32 is deteriorated due to the inclination of the axis of the nozzle holder 202. Where the electric component 32 is required to be mounted on the printed-wiring board 24 with a high degree of accuracy, it is required to compensate or adjust the position of the nozzle holder 202 (suction nozzle 200) depending upon the actual circumferential or angular position of the nozzle holder 202 with respect to the predetermined reference angular position (0-degree position), so that the actual mounting position of the electric component 32 is compensated for the deviation due to the inclination of the nozzle holder 202.

Figure 15:
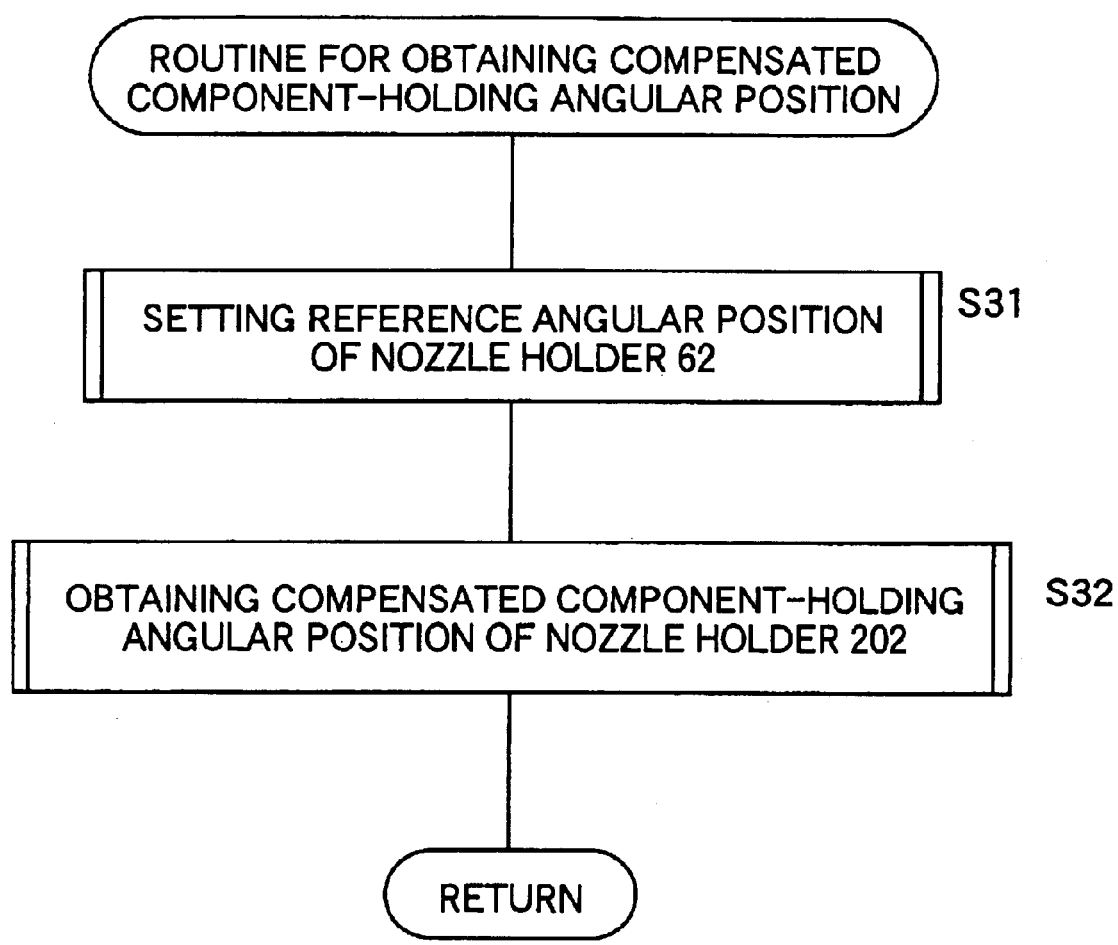
FIG. 15 is a flow chart illustrating an angular-position obtaining routine executed according to a program stored in a ROM of a computer of a control device of an electric-component mounting system which includes the suction nozzle shown in FIG. 12.

In the present second embodiment, therefore, an angular position obtaining routine illustrated in the flow chart of FIG. 15 is executed. The ROM 154 of the computer 160 of the control device 150 stores a program for executing this angular position obtaining routine, together with a program for executing an electric-component mounting routine illustrated in the flow chart of FIG. 16. The angular position obtaining routine, which is executed before the electric-component mounting routine is initiated, is initiated with step S31 to set the predetermined reference angular position of the nozzle holder 202. The reference angular position of the nozzle holder 202 is an angular position in which the fiducial mark 216 lies on the X-axis, as indicated by two-dot chain line in FIG. 13. To set the reference angular position, the nozzle holder 202 is moved to a position right above the CCD camera 120, more precisely, to a position in which the axis of rotation of the nozzle holder 202 is aligned with the center of the imaging area 126 of the CCD camera 120. In this position, an image of the fiducial mark 216 is taken by the CCD camera. On the basis of the image data representative of the image of the fiducial mark 216, the output value of the encoder 172 (for the rotary drive motor 100) which output value is to be obtained when the fiducial mark 16 lies on the X-axis is calculated, and the calculated output value is stored in the RAM 156, as 0-point data indicative of the predetermined reference angular position of the nozzle holder 202. 118

Figure 14:
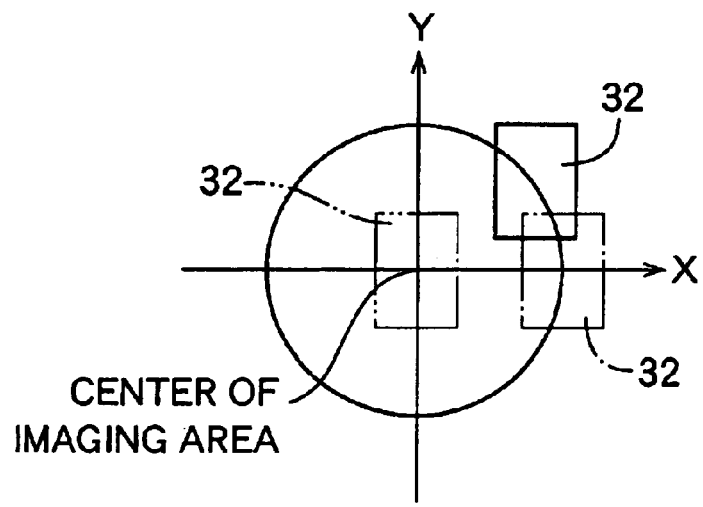
FIG. 14 is a view for explaining a manner of obtaining a deviation of the mounting position of the electric component, at the holder of FIG. 12.

Then, step S32 is implemented to obtain a compensated component-holding angular position of the nozzle holder 202 in which the electric component 32 is held by the suction nozzle 200. As described below in detail, this compensated component-holding angular position is an angular position of the nozzle holder 202 which is compensated for an inclination of the axis of the nozzle holder 202, on the basis of a difference between the actual angular position and the reference angular position. To obtain the compensated component-holding angular position, the amount and direction of deviation of the actual mounting position of the electric component 32 with respect to the predetermined nominal mounting position are obtained while the nozzle holder 202 is placed in the reference angular position. To this end, component mounting tests are performed using a plurality of test specimens of the electric component 32 and a test board similar to the printed-wiring board 24. Each specimen component held by the suction nozzle 200 is mounted on the test board while the nozzle holder 202 is placed in the reference angular position. Images of the test specimens mounted on the test board are taken. The images are taken, for example, by utilizing the CCD camera 56, which is provided for taking an image of a fiducial mark provided on each printed-wiring board 24. In this case, the CCD camera 56 is moved to a position at which the center of its imaging area is expected to lie on the center of each test specimen of the electric component mounted 32, and the image of each test specimen is taken by the CCD camera 56. Due to the inclination of the axis of the nozzle holder 202, the position of the test specimen mounted on the test board deviates from the nominal mounting position. Namely, the test specimen of the component 32 is mounted at a position which is spaced from the center of the imaging area, as indicated by solid line in FIG. 14. On the basis of the image data of each of the test specimens of the electric component 32, the amounts and directions of the deviations of the actual mounting positions with respect to the nominal mounting position are obtained for each test specimen, and average values of the deviation amount and direction of the test specimens are calculated as the deviation amount and direction in the reference angular position of the nozzle holder 202.

The deviation of the actual mounting position with respect to the nominal mounting position due to the inclination of the axis of the nozzle holder 202 relative to the vertical axis of the driven gear 106 takes place along a circular arc which has a center on the axis of the driven gear 106. That is, the amount of the deviation represented by the radius of the circular arc is constant, while the direction of the deviation changes with the angular position of the nozzle holder 202. In the present embodiment, the compensated component-holding angular position of the nozzle holder 202 is defined as an angular position in which the amount of deviation of the mounting position of the component 32 is largest in the positive X-axis direction and is zero in the Y-axis direction, as indicated by one-dot chain line in FIG. 14. The output value of the encoder 172 in this compensated component-holding angular position of the nozzle holder 202 is calculated, and the calculated output value is stored in the RAM 156. Where the component-mounting angular position of the nozzle holder 202 is different from the component-holding angular position, the electric component 32 is usually mounted on the printed-wiring board 24 with the nozzle holder 202 placed in one of 0°, 90°, 180° and 270° angular positions. It is possible to calculate the amount of deviation of the component mounting position in the X-axis or Y-axis direction for each of those angular positions, on the basis of the amount and direction of the deviation which have been obtained in the reference angular position of the nozzle holder 202. However, the amount of the deviation changes depending upon the specific one of those four angular positions of the nozzle holder 202, so that the calculation of the deviation amounts is time-consuming. In view of this drawback, the present second embodiment is arranged to set the compensated component-holding angular position of the nozzle holder 202 in which the deviation amount is largest in the positive X-axis direction and is zero in the Y-axis direction. The electric component 32 may be mounted in this compensated component-holding position, or in one of the angular positions of 90°, 180° and 270°. In the latter case, the nozzle holder 202 is rotated by the appropriate angle. In any of the four component-mounting positions, the deviation of the actual component-mounting position takes place in the X-axis or Y-axis direction, and the amount of the deviation is constant. Accordingly, the component-mounting position of the nozzle holder 202 can be easily compensated for the deviation due to the inclination of the axis of the nozzle holder 202.

Figure 16:
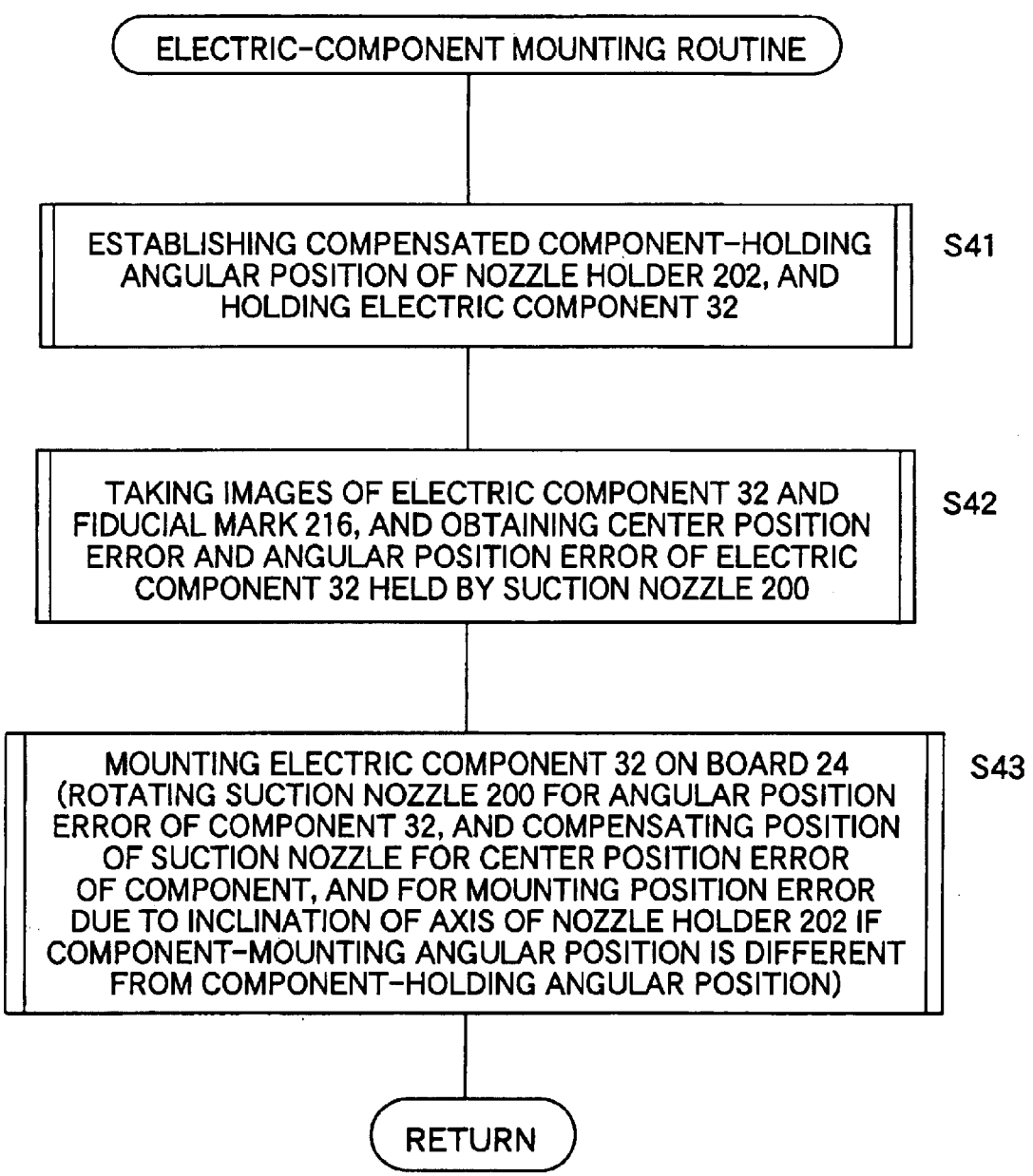
FIG. 16 is a flow chart illustrating an electric-component mounting routine executed according to a program stored in the ROM together with the program of the routine of FIG. 15.

After the deviation of the actual mounting position of the electric component 32 with respect to the nominal mounting position due to the inclination of the axis of the nozzle holder 202 has been obtained, the electric component 32 is mounted on the printed-wiring board 24 according to an electric-component mounting routine illustrated in the flow chart of FIG. 16. This routine is initiated with step S41 to first place the nozzle holder 202 in the compensated component-holding angular position, and then hold the electric component 32 on the suction nozzle 200. Thus, the angular position of the nozzle holder 202 is compensated for the deviation of the component-mounting position due to the inclination of the axis of the nozzle holder 202. After the electric component 32 is held on the suction holder 200, step S42 is implemented to take images of the electric component 32 and the fiducial mark 216, and obtain center position error and angular position error of the electric component 32 as held by the suction nozzle 200. Then, the control flow goes to step S43 to mount the electric component 32 on the printed-wiring board 24. In step S43, the angular position of the suction nozzle 200 is compensated for the angular position error of the electric component 32. If the component-mounting angular position of the nozzle holder 202 is different from the compensated component-holding angular position, the suction nozzle 200 is rotated to the appropriate component-mounting angular position. Further, the position of the suction nozzle 200 is compensated for the center position error of the electric component 32, and for the deviation of the mounting position of the electric component 32 due to the inclination of the axis of the nozzle holder 202 if the component-mounting angular position is different from the component-holding angular position (compensated component-holding angular position). The direction of compensation of the position of the suction nozzle 200 for the deviation of the component-mounting position due to the inclination differs depending upon the component-mounting angular position. However, the amount of the compensation is constant irrespective of the component-mounting angular position of the suction nozzle 200, in the absence of an angular positioning error of the electric component 32. If the electric component 32 has an angular positioning error and the angular position of the suction nozzle 200 is compensated for the angular positioning error of the electric component 32, the direction of compensation of the position of the suction nozzle 200 for the deviation of the component-mounting position is compensated by an amount corresponding to the amount of compensation of the angular position of the suction nozzle 200, so that the component-mounting position of the suction nozzle 200 is accordingly adjusted. Thus, the position of the suction nozzle 202 is compensated in the direction corresponding to the component-mounting angular position, so that the electric component 32 can be mounted at the nominal mounting position on the printed-wiring board 24, irrespective of the inclination of the axis of the nozzle holder 202.

In the present second embodiment, a plurality of suction nozzles 200 which are manufactured with high precision are selectively mounted on the nozzle holder 202, with high reproducibility in the positioning accuracy. Therefore, the reference angular position and the compensated component-holding angular position of the nozzle holder 202 are obtained by using one of the plurality of suction nozzles 200, and the amount and direction of deviation of the component mounting position in the compensated component-holding angular position of the nozzle holder 202 is obtained by using the same suction nozzle 200. These reference angular position, compensated component-holding angular position and amount and direction of deviation of the component mounting position, which are obtained for one of the suction nozzles 200 are commonly used for all of the suction nozzles 200. As described above, the reference angular position of the nozzle holder 202 is set by using the fiducial mark 216. This arrangement eliminates a reference-position switch or sensor for detecting the reference angular position of the nozzle holder 202, so that the present electric-component mounting system is available at a reduced cost.

In the present second embodiment, a portion of the control device 150 assigned to implement step S31 constitutes a reference-angular-position setting portion for setting the reference angular position of the nozzle holder 202, and an image data processing device. The reference-angular-position setting portion serves as an angular-position determining portion for determining the angular-position of the suction nozzle 200. A portion of the control device 150 assigned to implement step S32 and step S41 to establish the compensated component-holding angular position constitutes an angular-position compensating portion for compensating the component-holding angular position of the nozzle holder 202, and a portion of the control device 150 assigned to implement step S43 constitutes a mounting-position compensating portion for compensating the position of the nozzle holder 202 for the deviation of the component-mounting position due to the inclination of the axis of the nozzle holder 202.

Figure 17:
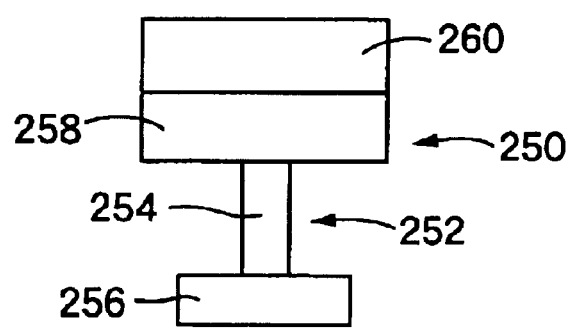
FIG. 17 is a front elevational view schematically showing a suction nozzle held by a holder, in a further embodiment of this invention.

The angular position of the suction nozzle 200 may be determined on the basis of the position of the fiducial mark 216 and the lower end face of the suction nozzle 200, where the center of the lower end face of the suction nozzle 200 is accurately aligned with the axis of the nozzle holder 202, in the absence of bending of the suction nozzle 200. In this case, the angular position of the suction nozzle 200 can be determined on the basis of the position of the lower end face of the suction nozzle 200, even if the axis of the nozzle holder 202 is not aligned with the center of the imaging area of the CCD camera 120.

Where the suction nozzle has a non-circular shape in transverse cross section, the electric component 32 can be held by the suction nozzle, in the predetermined posture, on the basis of an image of the fiducial mark. For instance, a suction nozzle 250 shown in FIGS. 17 and 18 has a suction pipe 252 consisting of a neck portion 254 having a circular cross sectional shape, and a rectangular sucking head 256 disposed at the lower end of the neck portion 254 such that the sucking head 256 extends in a direction perpendicular to the axis of the neck portion 254. The sucking head 256 is rectangular as viewed in a plane perpendicular to the axis of the neck portion 254, and is connected at a longitudinally intermediate portion thereof to the lower end of the neck portion 254 such that the axis of the neck portion 254 is perpendicular to the plane of the rectangular sucking head 256. The neck portion 254 is fixed at its proximal end to a nozzle body 258 such that the sucking head 258 is coaxial and rotatable with the nozzle body 258.

Figure 18:
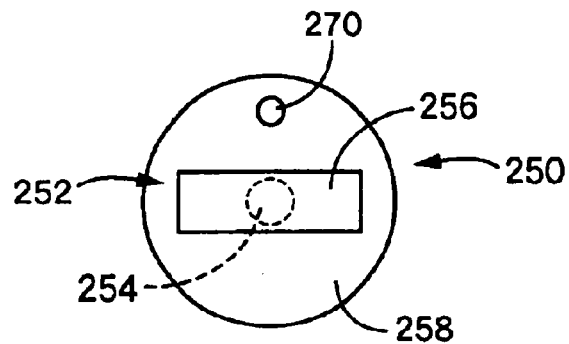
FIG. 18 is a bottom plan view schematically showing the suction nozzle of FIG. 17.

The suction nozzle 250 is held by a nozzle holder 260 such that the suction pipe 252 of the suction nozzle 250 is coaxial with the nozzle holder 260. Thus, the suction nozzle 250 is positioned relative to the nozzle holder 260 in the radial direction with high reproducibility in the radial positioning accuracy. However, the suction nozzle 250 is not positioned relative to the nozzle holder 260 in the circumferential direction. As shown in FIG. 18, the nozzle body 258 of the suction nozzle 250 is provided with a fiducial mark 270, which is offset from the nozzle axis, that is, from the axis of the nozzle holder 260 in the radial direction. The fiducial mark 270 is positioned on the nozzle body 258 such that a straight line passing the center of the fiducial mark 270 and the nozzle axis is perpendicular to the longitudinal direction of the rectangular sucking head 256.

Figure 19:
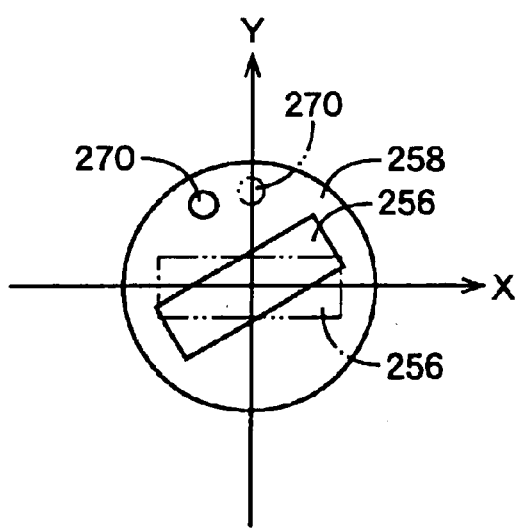
FIG. 19 is a view for explaining a manner of compensating the angular position of the suction nozzle shown in FIG. 17.

The electric component is held by the suction nozzle 250 placed in a nominal component-holding angular position. For instance, this component-holding angular position is a position in which the longitudinal direction of the sucking head 256 is parallel with the X-axis, for instance. When images of the fiducial mark 270 and the suction pipe 252 are taken when the suction nozzle 250 is placed in the nominal component-holding angular position, the fiducial mark 270 normally lies on the Y-axis, as indicated by two-dot chain line in FIG. 19. The suction nozzle 250 is not positioned relative to the nozzle holder 260 in the circumferential direction when the suction nozzle 250 is held by the nozzle holder 260. In other words, the nominal component-holding position of the suction nozzle 250 is not necessarily accurately established when the suction nozzle 250 is mounted on the nozzle holder 260. Accordingly, the sucking head 256 may be actually inclined relative to the X-axis, with the fiducial mark 270 being spaced from the Y-axis, as indicated by solid lines in FIG. 19.

Figure 20:
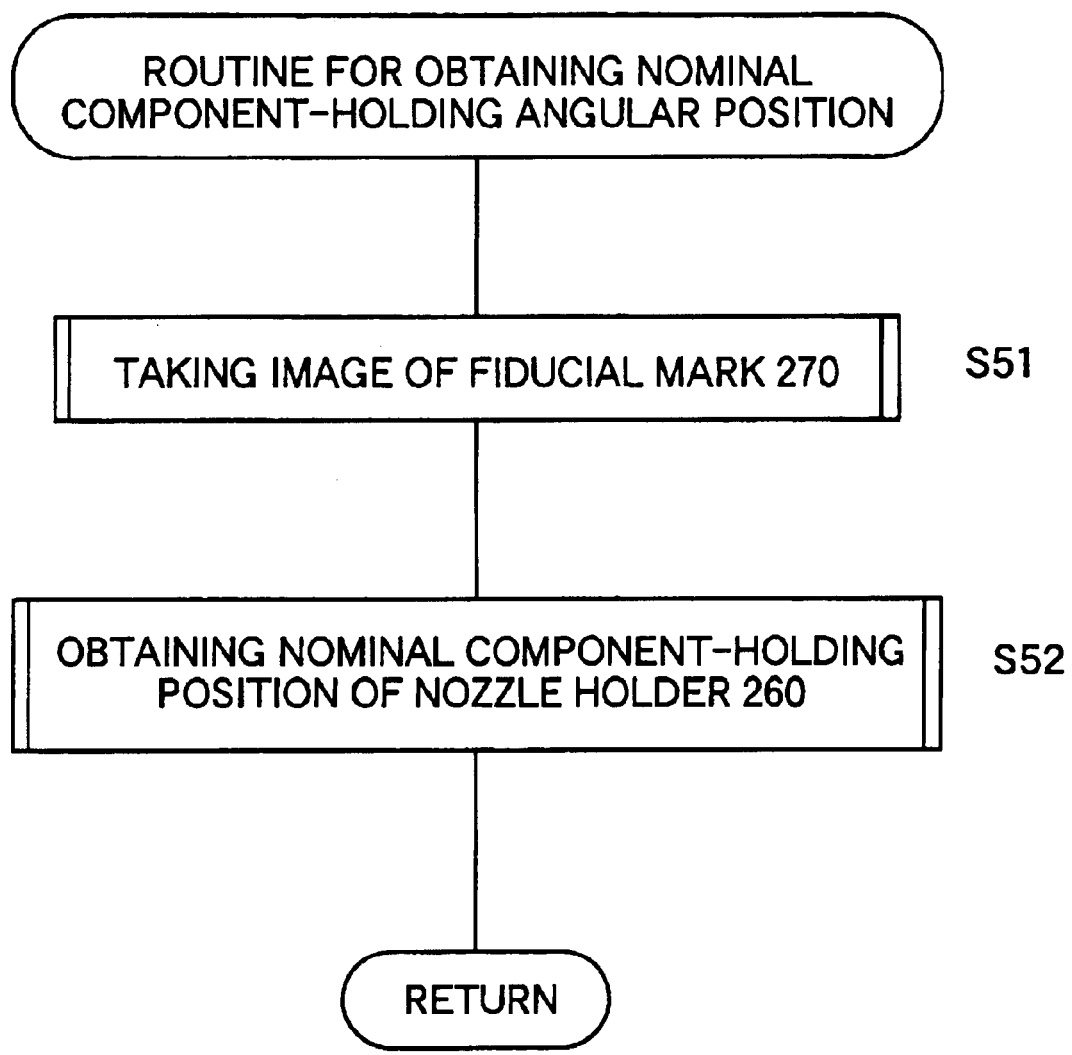
FIG. 20 is a flow chart illustrating a routine for obtaining a nominal angular position of the suction nozzle of FIG. 17, which routine is executed according to a program stored in a ROM of a computer of a control device of an electric-component mounting system including the suction nozzle of FIG. 17.

After the suction nozzle 250 is mounted on the nozzle holder 260, therefore, a routine illustrated in the flow chart of FIG. 20 is executed to obtain the nominal component-holding angular position of the nozzle holder 260, before the electric component is held by the suction nozzle 250. A program for executing this routine of FIG. 20 is stored in the ROM 154 of the computer 160 of the control device 150, together with a program for executing an electric-component mounting routine of FIG. 21. The routine of FIG. 20 is initiated with step S51 to take an image of the fiducial mark 270 to obtain the position of the mark 270 about the axis of the nozzle holder 260. Then, step S52 is implemented to set the nominal component-holding angular position of the nozzle holder 260. That is, if the fiducial mark 270 does not lie on the Y-axis, the output value of the encoder 172 which corresponds to the angle of rotation of the nozzle holder 260 to move the fiducial mark 270 to a position on the Y-axis is calculated, and the calculated output value is stored in the RAM 156. Namely, the output value of the encoder 172 corresponding to the nominal component-holding angular position of the nozzle holder 260 in which the longitudinal direction of the sucking head 256 is parallel to the X-axis is stored in the RAM 156.

Figure 21:
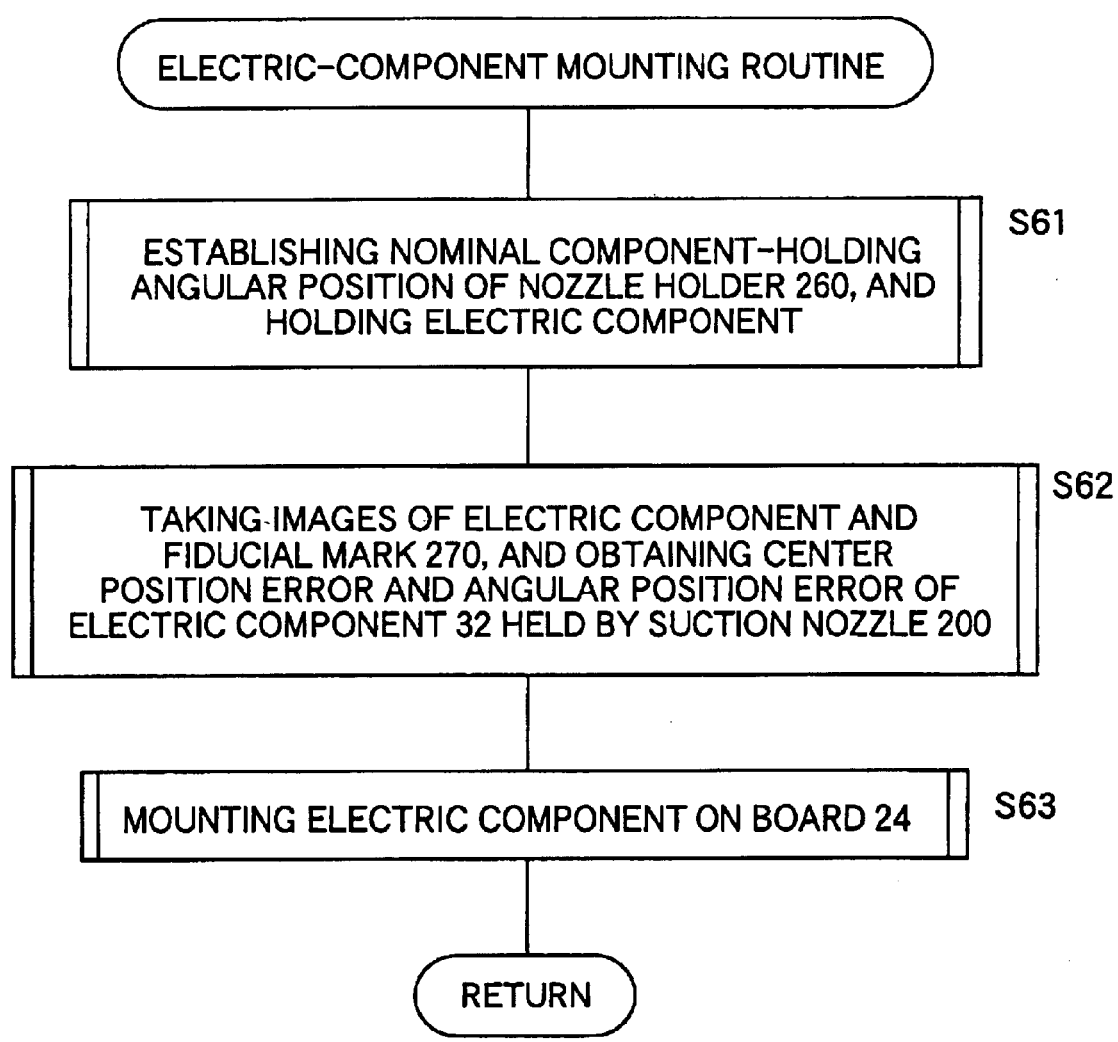
FIG. 21 is a flow chart illustrating an electric-component mounting routine executed according to a program stored in the ROM together with the program of the routine of FIG. 20.

The electric component is mounted on the printed-circuit board 24 according to the electric-component mounting routine of FIG. 21. This routine is initiated with step S61 in which the nozzle holder 250 is first rotated to establish the nominal component-holding angular position, and then the electric component 32 is held by the sucking head 256 of the suction nozzle 250 such that the longitudinal direction of the sucking head 256 is parallel to the X-axis. Thus, the suction nozzle 260 is placed in the nominal component-holding position before the electric component is held by the sucking head 256, since the suction nozzle 250 is not positioned relative to the nozzle holder 260 in the circumferential direction when the suction nozzle 250 is mounted on the nozzle holder 260. To this end, data representing the nominal component-holding position of the suction nozzle 250 are stored in the RAM 156 in the form of the output value of the encoder 172 each time the suction nozzle 250 is mounted on the nozzle holder 260, so that the nozzle holder 260 is rotated to establish the nominal component-holding angular position on the basis of the output value of the encoder 172 just before the electric component is held by the suction nozzle 250.

In the present third embodiment, a portion of the control device 150 assigned to implement step S51 constitutes an angular-position determining portion operable to determining the position of the fiducial mark 270 about the axis of the nozzle holder 260, and an image data processing device operable to process image data to determine the position of the fiducial mark 270. Further, a portion of the control device 150 assigned to implement step S52 constitutes a nominal-angular-position setting portion operable to set the nominal component-holding angular position of the suction nozzle 250, and a portion of the control device 150 assigned to implement step S61 constitutes an angular-position compensating portion operable to place the suction nozzle 250 in the nominal component-holding angular position after the suction nozzle 250 is mounted on the nozzle holder 260 and before the electric component is held by the suction nozzle 250.

While the suction nozzle 60, 250 is positioned relative to the nozzle holder 62, 260 in the circumferential direction in the embodiments described above, the suction nozzle need not be positioned in the circumferential direction. Where the suction nozzle is not positioned in the circumferential direction, the nominal position of the suction pipe relative to the fiducial mark may be obtained, for example.

For instance, the suction nozzle is positioned relative to the nozzle holder in the radial and circumferential directions, but not with high reproducibility in the positioning accuracy. In other cases, the nozzle holder and the suction nozzle do not have high dimensional accuracy, or the XY robot provided to move the suction nozzle in the XY plane does not have high positioning accuracy, due to thermal expansion, assembling errors and backlash of the ballscrews, and consequent low accuracy of feeding of the X-axis and Y-axis slides. Even in such cases, the position of the fiducial mark is obtained relative to the nominal position of the centerline of the suction nozzle, where the size of the electric component is considerably larger than the lower end face of the suction nozzle, and the electric component can be held by the suction nozzle without partial radial projection of the lower end face beyond the periphery of the electric component, for example.

Figure 22:
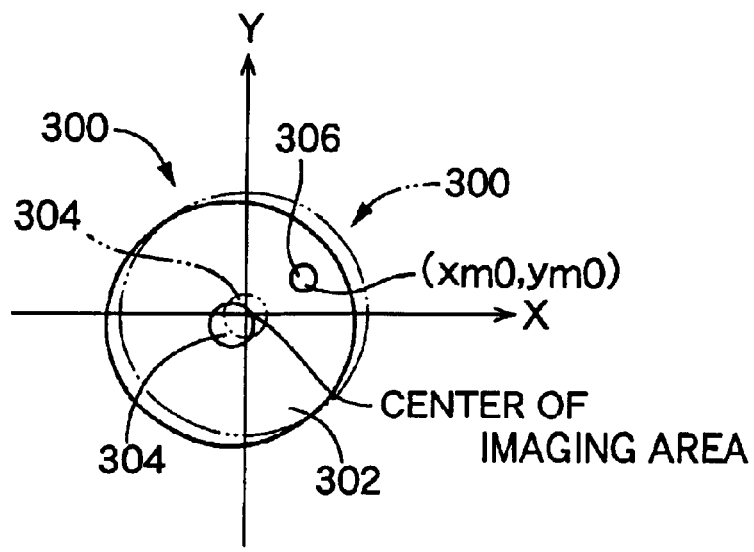
FIG. 22 is a view for explaining a manner of obtaining the relative position between a fiducial mark and the axis of a holder for a suction nozzle used in a still further embodiment of this invention.

In the cases indicated above, an image of the fiducial mark provided on the nozzle body of the suction nozzle is taken after the suction nozzle is mounted on the nozzle holder and before the electric component is held by the suction nozzle. On the basis of the obtained image of the fiducial mark, the relative position between the fiducial mark and the centerline of the suction pipe is obtained. FIG. 22 schematically shows a suction nozzle 300 whose image is taken by the image-taking device when the suction nozzle 300 is held by the nozzle holder. The suction nozzle 300 includes a nozzle body 302 having a fiducial mark 306, and a suction pipe 304 extending from the nozzle body 302. If the centerline of the suction pipe 304 is located at the nominal position, the centerline lies on the center of the imaging area of the image-taking device, as indicated by two-dot chain line in FIG. 22. Actually, however, the centerline of the suction pipe 304 does not necessarily lie on the center of the imaging area, and may deviate from the center of the imaging area, as indicated by solid line in FIG. 22. Even in the latter case, the electric component is held by the suction pipe 304, on an assumption that the centerline of the suction pipe 304 is located on the nominal position. The coordinate values xm0 and ym0 of the fiducial mark 306 are obtained on the basis of the image data of the fiducial mark 306, as if the centerline of the suction pipe 304 were located on the center of the imaging area.

When the electric component is mounted on the printed-wiring board, the electric component is first held by the suction nozzle 300, and then the images of the fiducial mark 306 and the electric component are taken. The position of the centerline of the suction pipe 306 is obtained on the basis of the image of the fiducial mark 306 and the position (xm0, ym0) of the fiducial mark 306 relative to the centerline of the suction pipe 304. Then, the error of the center position of the electric component relative to the centerline of the suction pipe 306 is obtained. The position of the fiducial mark 306 relative to the centerline of the suction pipe 304 is obtained each time the suction nozzle 300 is held by the nozzle holder.

Figure 23:
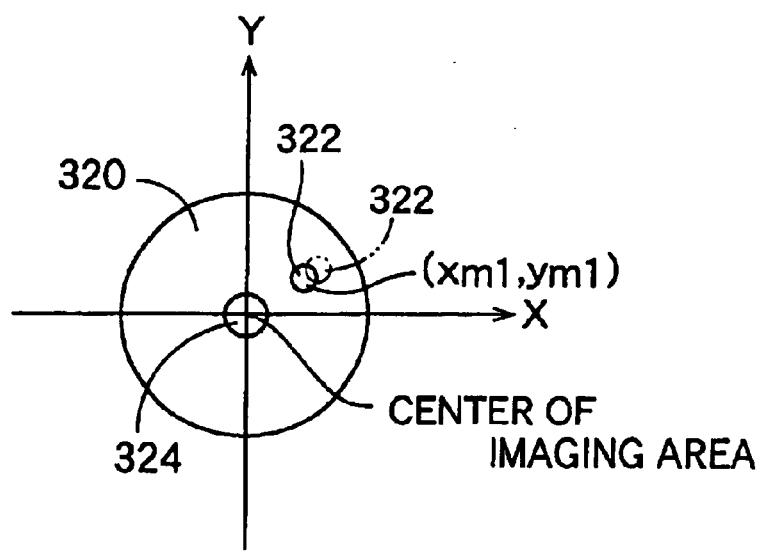
FIG. 23 is a view for explaining a manner of obtaining the relative position between the fiducial mark and the axis of a holder for a suction nozzle used in a yet further embodiment of this invention.

The suction nozzle may be held by the nozzle holder with high reproducibility in the positioning accuracy, even where the suction nozzle and the nozzle holder have relatively low dimensional accuracy due to manufacturing errors. The relative position between the fiducial mark and the centerline of the nozzle holder may be held constant for each of the different kinds of the suction nozzle which are selectively held on the nozzle body. In this case, a suitable jig may be used for each kind of the suction nozzle, to obtain the relative position of the fiducial mark and the centerline of the nozzle holder, for example, so that the position of the axis of the nozzle holder is obtained on the basis of the obtained relative position, when the electric component is mounted on the printed-wiring board.

Where the suction nozzle can be held by the nozzle holder with high accuracy of alignment between their axes, irrespective of relatively low dimensional accuracy of the fiducial mark on the suction nozzle and consequently low accuracy of relative position between the suction pipe and the fiducial mark, the nozzle holding jig may be provided with a nozzle holding portion for holding the suction nozzle in the same manner as the nozzle holder, so that the image of the fiducial mark on the suction nozzle is taken while the suction nozzle is held by the nozzle holding portion. On the basis of the obtained image of the fiducial mark, the position of the fiducial mark relative to the axis of the nozzle holding portion jig is obtained. The image of the fiducial mark is taken such that the axis of the nozzle holding portion of the jig which corresponds to the axis of the nozzle holder is aligned with the center of the imaging area of the image-taking device. If the fiducial mark 322 on the suction nozzle 320 does not actually lie on the nominal position indicated by two-dot chain line in the schematic view of FIG. 23, but is located at a position offset from the nominal position, as indicated by solid line, the coordinate values xm1 and ym1 of the actual position of the fiducial mark 322 relative to the axis of the nozzle holding portion of the jig (corresponding to the axis of the nozzle holder) are obtained on the basis of the obtained image data. After the electric component is held by the suction nozzle 320, the image of the fiducial mark 322 is taken, and the position of the axis of the nozzle holder is obtained on the basis of the image data of the fiducial mark 322 and the position (xm1, ym1) of the fiducial mark 322 relative to the axis of the nozzle holder. Thus, the hold position error of the electric component is obtained. Since the suction nozzle 320 is held by the nozzle holder with high reproducibility in the positioning accuracy, the position of the nozzle holder can be obtained on the basis of the relative position (xm1, ym1) obtained by using the nozzle holding jig for the same suction nozzle 320.

Where the suction nozzle can be held by the nozzle holder with high reproducibility in the positioning accuracy, the position of the axis of the nozzle holder can be obtained by providing the nozzle holding jig with the nozzle holding portion capable of holding the suction nozzle in the same manner as the nozzle holder, even if the centerline of the suction nozzle is not aligned with the axis of the nozzle holder due to manufacturing errors of the suction nozzle and nozzle holder. In this case, the position of the fiducial mark relative to the axis of the nozzle holding portion of the jig (corresponding to the axis of the nozzle holder) is obtained. When the electric component is held by the suction nozzle and is mounted on the printed-wiring board, the position of the axis of the nozzle holder is obtained on the basis of the obtained image data of the fiducial mark and the obtained position of the fiducial mark relative to the axis of the nozzle holding portion of the jig.

Figure 24:
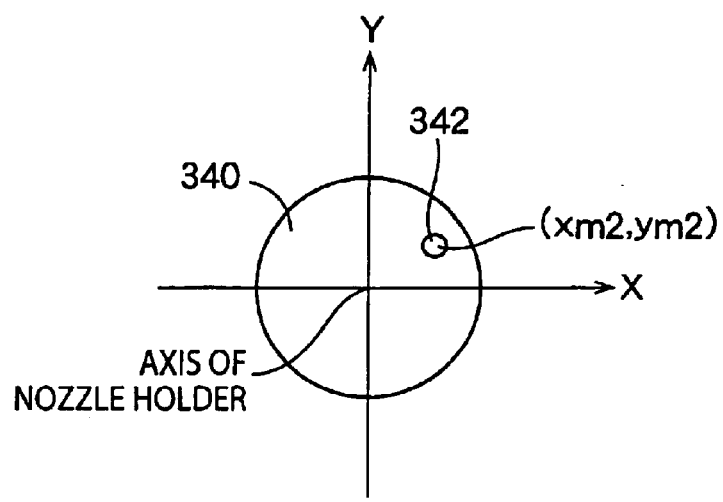
FIG. 24 is a view for explaining a manner of obtaining the relative position between the fiducial mark and the axis of a holder for a suction nozzle used in still further embodiment of this invention.

There exists a nominal relationship between the position of the fiducial mark and the position (centerline) of the suction pipe, that is, between the position of the fiducial mark and the axis of the nozzle holder, where the suction nozzle can be positioned relative to the nozzle holder in the radial and circumferential directions, with high reproducibility in the positioning accuracy, and where all of the relevant members such as the suction nozzle have high dimensional accuracy within the nominal tolerances, permitting accurate alignment between the centerline of the suction nozzle and the axis of the nozzle holder, while the reference mark is accurately positioned relative to the nozzle body of the suction nozzle. In this case, the fiducial mark 342 provided on the suction nozzle 340 is located at the nominal position (xm2, ym2) relative to the axis of the nozzle holder, as indicated in FIG. 24. Therefore, it is not necessary to obtain the relative position between the fiducial mark 342 and the axis of the nozzle holder, before the electric component is held by the suction nozzle 340. That is, the position of the axis of the nozzle holder can be obtained on the basis of an image of the fiducial mark 342 taken after the electric component is held by the suction holder 340, and the nominal position (xm2, ym2) of the fiducial mark 342 relative to the axis of the nozzle holder.

Figure 25:
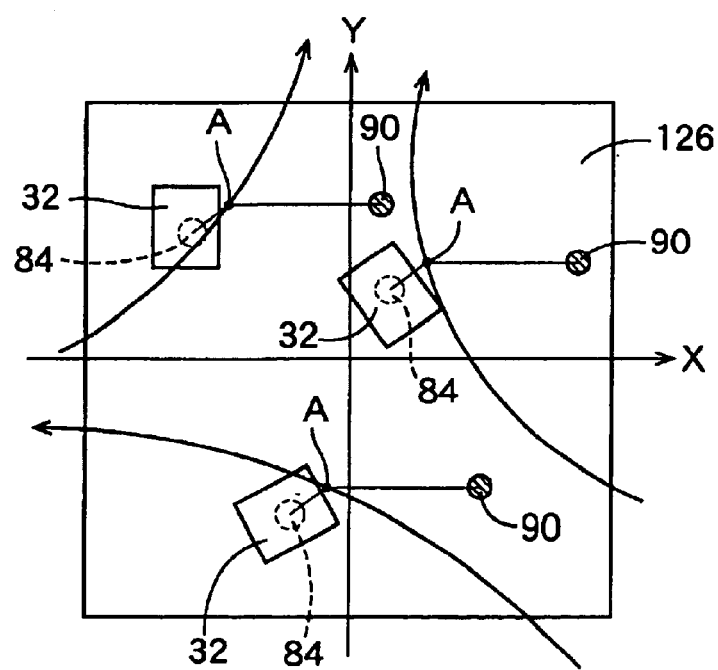
FIG. 25 is a view for explaining an effect of providing the suction nozzle with a fiducial mark in yet another embodiment of this invention.

In each of the embodiments described above, the image-taking device 118 is mounted on the X-axis slide 36, so as to be moved with the X-axis slide 36. However, the image-taking device 118 for taking the images of the electric component held by the suction nozzle 340 and the fiducial mark 342 may be fixedly disposed in the electric-component mounting system 12. For instance, the image-taking device 118 is fixedly disposed on the machine base 10 of the electric-component mounting system 12 shown in FIGS. 1–11.

Where the image-taking device 118 is fixedly disposed, the suction nozzle 60 is moved by the XY robot 48 to a position right above the image-taking device 118, for taking the images of the electric component 32 and the fiducial mark 9 simultaneously, before the suction nozzle 60 is moved by the XY robot 48 to the component mounting position on the printed-wiring board 24. Since the fiducial mark 90 is provided on the suction nozzle 60, the position of the nozzle axis A can be obtained on the basis of the image of the fiducial mark 90 and the relative position between the fiducial mark 90 and the nozzle axis A, irrespective of the position of the electric component 32 in the imaging area 126 of the CCD camera 120, so that the errors of the actual center position and angular position of the electric component 32 can be accurately obtained. FIG. 25 indicates three examples of a path of movement of the suction nozzle 60 between the position at which the electric component 32 is held by the suction nozzle 60 and the component mounting position on the printed-wiring board 24. The path of movement of the suction nozzle 60 may be selected as desired, provided that the path permits the suction nozzle 60 to pass an image-taking position at which the electric component 32 held by the suction nozzle 60 and the fiducial mark 90 are both located within the field of vision of the image-taking device 118 so as to permit the images of the electric component 32 and fiducial mark 90 to be formed simultaneously in the imaging area 126 of the CCD camera 120, at a given position along the path. The path of movement of the suction nozzle 60 is desirably determined so as to minimize the distance between the position at which the electric component 32 is held by the suction nozzle 60 and the component mounting position, in order to reduce the cycle time of the component mounting operation.

In each of the embodiments described above, only one fiducial mark is provided on the suction nozzle. However, a plurality of fiducial mark may be provided as in an embodiment of FIG. 26, which will be described. In this embodiment, a suction nozzle 360 is held by the nozzle holder such that the suction nozzle 360 is positioned relative to the nozzle holder in the radial and circumferential directions with high reproducibility in the positioning accuracy, with the centerline of a suction pipe 362 being aligned with the axis of the nozzle holder. Two fiducial marks 364 are provided on the suction nozzle 360 such that the two fiducial marks 364 lie on a straight line passing the centerline of the suction pipe 362 and are spaced apart from the centerline by the same distance.

Figure 26:
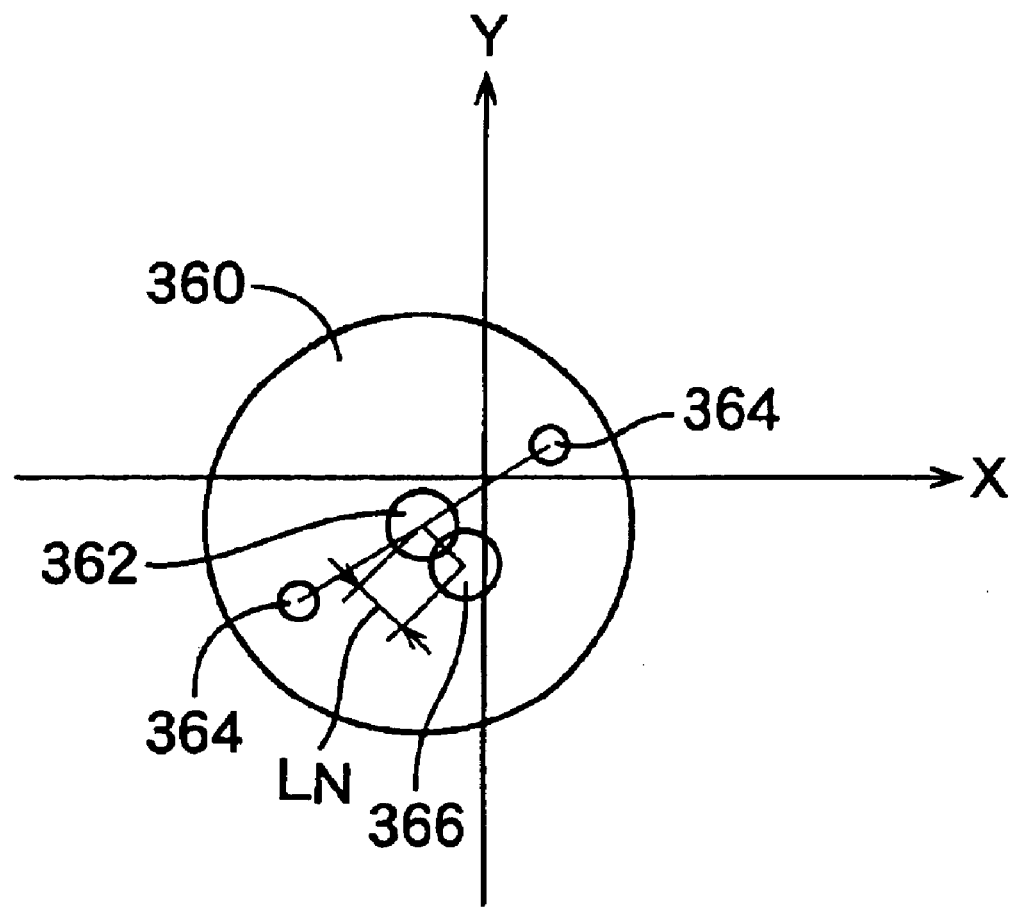
FIG. 26 is a view for explaining a manner of obtaining a bending of a suction pipe of a suction nozzle in a further embodiment of this invention.

In this embodiment, the suction nozzle 360 is moved to the image-taking position to take the images of the two fiducial marks 364 and a lower end face 366 of the suction pipe 262, as shown in FIG. 26. On the basis of the thus obtained images, the amount and direction of bending of the suction pipe 362 relative to the nozzle axis A can be detected. The axis of the suction pipe 362 is located intermediate between the two fiducial marks 364, so that a distance LN between the axis of the suction pipe 362 and the center of the lower end face 366 is obtained as the amount of the bending, while a direction of a straight line passing the axis of the suction pipe 362 and the center of the lower end face 366 with respect to the straight line passing the two fiducial marks 364 is obtained as the direction of the bending. Even if the axis of the suction pipe 362 is offset from the center of the imaging area 126, the position of the axis of the suction pipe 362, that is, the position of the nozzle axis A can be obtained, so that the amount and direction of the bending of the suction pipe 362 relative to the nozzle axis A can be detected.

In the embodiment of FIG. 26 wherein the two fiducial marks 364 are provided such that the nozzle axis A is located intermediate between the two fiducial marks 364, the position of the nozzle axis A can be obtained to detect the bending of the suction pipe 362, irrespective of the specific angular position of the suction nozzle 360, by taking only once the images of the suction pipe 362 and fiducial marks 364. It is also noted that the direction of deviation of the center of the lower end face 366 due to the bending of the suction pipe 362 is defined by the straight line passing the two fiducial marks 364, so that the direction of the bending of the suction pipe 362 and the amounts of the bending in the X-axis and Y-axis direction at any angular position of the suction nozzle 360 can be calculated irrespective of the angular position in which the bending is detected, as long as this angular position is known. Accordingly, the positions of the suction nozzle 360 at which the electric component is held by the suction nozzle 360 and mounted on the printed-wiring board 24 can be compensated for the bending of the suction pipe 362, to permit accurate holding and mounting of the electric component, even where the holding and mounting of the electric components are effected at any angular position of the suction nozzle 360 which is different from the angular position in which the bending of the suction pipe 362 was detected.

While each fiducial mark or mark is provided by the lower end face of the projection such as a pin extending from the nozzle body of the suction nozzle in the illustrated embodiments described above, the fiducial mark may be provided directly on the lower surface of the nozzle body on the side of the suction pipe. Further, the image-taking device 118 in the above embodiments is arranged to take a normal image of the electric component by illuminating the bottom or lower surface of the electric component held by the suction nozzle. However, the image-taking device may be arranged to take a projection image or a silhouette image of the electric component by illuminating the upper surface of the electric component. An embodiment incorporating these modifications will be described by reference to FIGS. 27 and 28.

Figure 27:
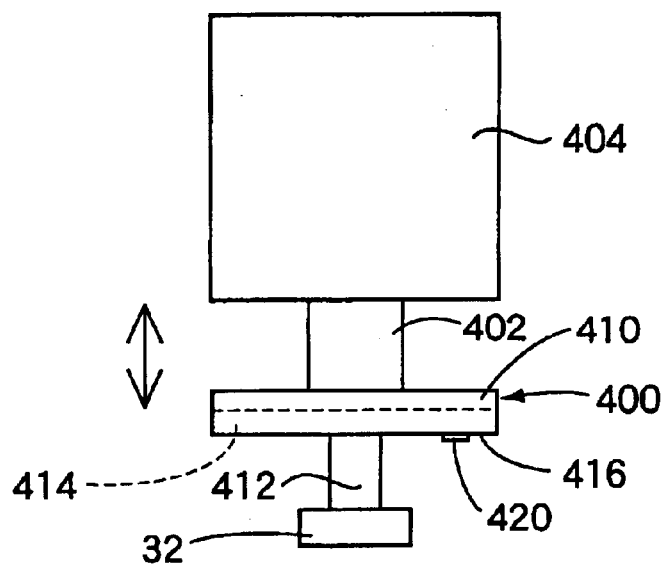
FIG. 27 is a side elevational view schematically showing a suction nozzle together with a holder and an Y-axis slide, in a yet further embodiment of this invention.
Figure 28:
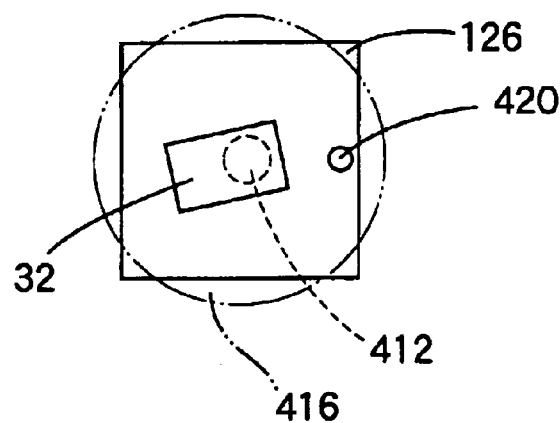
FIG. 28 is a view for explaining a manner of taking images of an electric component held by the suction nozzle of FIG. 27 and the fiducial mark.

In the embodiment of FIGS. 27 and 28, a suction nozzle 400 is held by a nozzle holder 402 mounted on a slide of an XY robot, for instance, on a Y-axis slide 404, as schematically shown in FIG. 28. The nozzle holder 402 is supported by the Y-axis slide 404, so as to be vertically movable and rotatable about its axis. The suction nozzle 400, which is rotatable about the axis of the nozzle holder 402, includes a nozzle body 410, and a suction pipe 412 extending from the nozzle body 410. In the present embodiment, the nozzle body 410 has a circular shape in cross section, and is provided with a light emitting body 414. In the present embodiment, the light emitting body 414 consists of a printed-wiring board and a multiplicity of light emitting diodes attached to the printed-wiring board. The light emitting diodes collectively define a light emitting surface 416 of the light emitting body 414 from which the suction pipe 412 extends. On the light emitting surface 416, there is printed a single fiducial mark 420 such that the fiducial mark 420 is spaced from the suction pipe 412 in the radial direction of the suction pipe 412. The fiducial mark 420 is positioned to permit an image of the fiducial mark 420 to be formed in the imaging area 126 of the image-taking device 118, together with an image of the suction pipe 412. The fiducial mark 420 in the present embodiment has a circular shape. It is noted that the thickness of the fiducial mark 420 as shown in FIG. 27 is enlarged for easier understanding. The printed fiducial mark 420 may be replaced by a circular layer bonded to the light emitting surface 416.

The image-taking device 118 is focused on the electric component 32 held by the suction nozzle 400, and the length of the suction pipe 412 is determined to prevent the nozzle body 410 from contacting the electric components 32 which have already been mounted on the printed-wiring board 24, when the next electric component 32 held by the suction nozzle 400 is mounted on the printed-wiring board. The length of the suction pipe 412 is further determined so that the fiducial mark 420 is located within the field of depth of the image-taking device 118 when the electric component 32 is imaged. When the image-taking device 118 is operated with the suction nozzle 400 placed in the predetermined image-taking position, the electric component 32 and the fiducial mark 420 are illuminated by a radiation emitted from the light emitting body 414. As schematically shown in FIG. 28, clear silhouette images of the electric component 32 and the fiducial mark 420 are formed in the imaging area 126, and the position of the nozzle axis (axis of the nozzle holder 402) can be obtained on the basis of the position of the fiducial mark 420 obtained from the silhouette image, as in the embodiments described above, so that the positioning errors of the electric component 32 can be detected. The light emitting body 414 may be replaced by a converter capable of converting a ultraviolet radiation into a visible light for irradiating the electric component 32 and the fiducial mark 420, or a light reflector capable of reflecting an incident light toward the electric component 32. After the silhouette images are obtained, the suction nozzle 400 is moved to the predetermined component mounting position, and is lowered to mount the electric component 32 on the printed-wiring board. At this time, the nozzle body 410 on which the fiducial mark 420 is provided does not interfere with the electric components 32 which have already been mounted on the board.

Although the fiducial mark 90, etc. is provided on the suction nozzle 60, etc. in the above embodiments, the fiducial mark or marks may be provided on a member other than the suction nozzle. An embodiment incorporating this modification will be described by reference to FIGS. 29 and 30.

Figure 29:
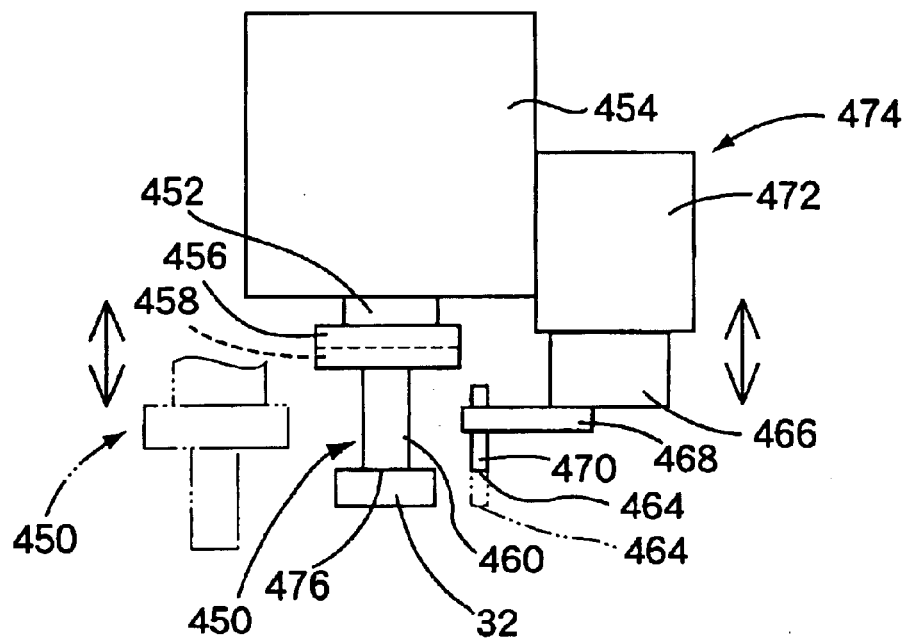
FIG. 29 is a side elevational view schematically showing a suction nozzle together with the fiducial mark, in a still further embodiment of this invention.
Figure 30:
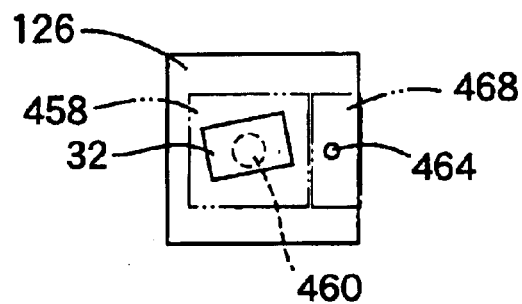
FIG. 30 is a view for explaining a manner of taking images of an electric component held by the suction nozzle of FIG. 29 and the fiducial mark.

In the embodiment of FIGS. 29 and 30, a nozzle holder 452 for holding a suction nozzle 450 is supported by a Y-axis slide 454 such that the suction nozzle 450 is vertically movable. The suction nozzle 450 includes a nozzle body 456 provided with a light emitting body 458, which is rectangular, for instance, square, in cross section, and further includes a suction pipe 460 which extends from a central portion of the light emitting body 458. The Y-axis slide 454 also supports a vertically movable member 466 such that the vertically movable member 466 is vertically movable by a vertical drive device 472 also supported by the Y-axis slide 454. In the present embodiment, the vertical drive device 472 includes an electric motor in the form of a servomotor, and cooperates with the vertically movable member 466 to serve as a fiducial-mark moving device 474 operable to move a fiducial mark 464 which will be described. The vertically moving member 466 is provided with a light emitting body 468 which has a projection 470 extending in the vertical direction, that is, in the axial direction of the suction pipe 460. The projection 470 has a lower end face which serves as the fiducial mark 464. The fiducial mark 464 is moved in the vertical direction with the vertically movable member 466 when the vertically movable member 466 is moved by the vertical drive device 472. Thus, the fiducial mark 464 can be moved to a desired position in the axial direction of the suction pipe 460.

In the present embodiment, the light emitting body 468 is rectangular in cross section, as shown in FIG. 30, and is spaced apart from the light emitting body 458 of the suction nozzle 450 in the radial direction of the suction nozzle 450, by a small clearance necessary to permit the vertical movement of the light emitting body 468 relative to the suction nozzle 450, that is, to prevent an interference between the light emitting body 468 and the suction nozzle 450 (light emitting body 458) when the suction nozzle 450 and the vertically movable member 466 are vertically moved relative to each other.

When silhouette images of the fiducial mark 464 and a lower end face 476 of the suction pipe 460 are taken to obtain the relative position between the fiducial mark 464 and the nozzle axis A (axis of the nozzle holder 452), the fiducial mark 464 and the lower end face 476 of the suction pipe 460 are located in the same plane, as indicated by solid line in FIG. 29. When the silhouette image of the electric component 32 held by the suction nozzle 450 is taken, the vertically movable member 466 is moved downwards to a position at which the fiducial mark 464 and the bottom surface of the electric component 32 (at which the component 32 is mounted on the printed-wiring board 24) are located in the same plane, as indicated by two-dot chain line in FIG. 29. Since the light emitting body 458 provided on the suction nozzle 450 and the light emitting body 468 provided with the projection 470 are located almost adjacent to each other with the above-indicated small clearance in the radial direction of the suction pipe 472, these two light emitting bodies 458, 468 cooperate to irradiate the electric component 32 and the fiducial mark 464, as if the two light emitting bodies defined a single light emitting surface, so that the silhouette images of the electric component 32 and the fiducial mark 464 are formed on the imaging area 126.

In the above arrangement wherein the fiducial mark 464 is movable in the axial direction of the suction pipe 472, the fiducial mark 464 can be moved downwards to the position (indicated by the two-dot chain line in FIG. 29) at which the image-taking device 118 is focused, when the images of the electric component 32 and the fiducial mark 464 are taken. When the electric component 32 is mounted on the printed-wiring board 24, the fiducial mark 464 remains located at the position indicated by the two-dot chain line, and the suction nozzle 450 is lowered to the component mounting position indicated by two-dot chain line, so that the fiducial mark 464 does not interfere with the electric components 32 have already been mounted on the printed-wiring board. Accordingly, the present arrangement not only permits clear silhouette images of the electric component 32 and the fiducial mark 464 to be formed in the imaging area 126, but also assures a high degree of freedom in the order of mounting the electric components 32 by the suction nozzle 450 and in the posture of the electric component 32 as held by the suction nozzle 450. In the present embodiment wherein the suction nozzle 450 and the fiducial mark 464 are movable relative each other in the axial direction of the suction pipe 472, the fiducial mark 462 is placed in the component-mounting position indicated by the two-dot-chain line in FIG. 29, when the electric component 32 is mounted on the printed-wiring board 24, with the suction nozzle 450 being located at the position indicated by the two-dot chain line in FIG. 29. At the position of the fiducial mark 464 indicated by the two-dot chain line, the fiducial mark 464 is within the field of depth of the image-taking device 118. It will be understood that the fiducial-mark moving device 474 serves as a relative-movement device operable to move the fiducial mark 464 relative to the suction nozzle 450 in the axial direction of the suction pipe 460, and also as a relative-movement device operable to move the fiducial mark 464 and the image-taking device 118 relative to each other in the axial direction of the suction pipe 460. It will also be understood that the vertical drive device 52 (FIG. 2) for moving vertically moving the suction nozzle 450 serves as a relative-movement device operable to move the suction nozzle 450 relative to the fiducial mark 464 in the axial direction of the suction pipe 460.

The fiducial mark provided on a member other than the suction nozzle need not be vertically movable. An embodiment incorporating this modification will be described by reference to FIGS. 31 and 32. The same reference signs as used in the embodiment of FIGS. 29 and 20 will be used in the embodiment of FIGS. 31 and 32, to identify the functionally corresponding elements, and no redundant description of these elements is provided.

Figure 31:
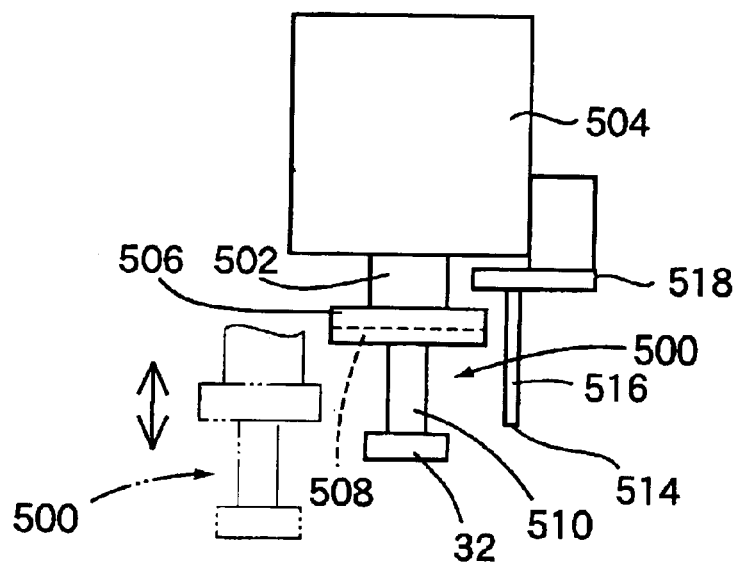
FIG. 31 is a side elevational view schematically showing a suction nozzle together the fiducial mark, in another embodiment of this invention.
Figure 32:
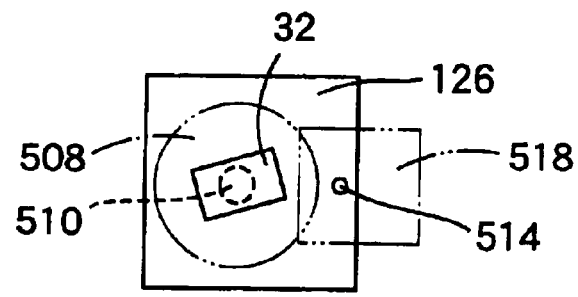
FIG. 32 is a view for explaining a manner of taking images of an electric component held by the suction nozzle of FIG. 31 and the fiducial mark.

In the present embodiment, a suction nozzle 500 is held by a nozzle holder 502 which is disposed on a Y-axis slide 504, as shown in FIGS. 31 and 32, such that the suction nozzle 500 is vertically movable and rotatable with the nozzle holder 502. The suction nozzle 500 includes a nozzle body 506 provided with a light emitting body 508 which is circular in transverse cross section. The suction nozzle 500 further includes suction pipe 510 extending from a central portion of the light emitting body 508. The Y-axis slide 504 also carries a light emitting body 518 fixed thereto. A projection 516 extends downwards from the light emitting body 518. and has a fiducial mark 514 at its lower end. As shown in FIG. 32, the light emitting body 518 is rectangular, more precisely, square, in transverse cross section, and located above the light emitting body 508 of the suction nozzle 500 in the axial direction of the suction pipe 510 when the suction nozzle 500 is placed in its uppermost position. In the radial direction of the suction pipe 510, the light emitting body 518 partially overlaps the light emitting body 508 of the suction nozzle 500. The fiducial mark 514 provided by the lower end face of the projection 516 is spaced upwards from the lower end face of the suction pipe 510 of the suction nozzle 500 placed in the uppermost position, by a distance equal to an average of the thickness values of a plurality of kinds of the electric component 32 to be mounted by the suction nozzle 500. According to this arrangement, the electric component 32 is located within the field of depth of the image-taking device 118 when the electric component 32 is imaged when the suction nozzle 500 is placed in its uppermost position, so that a clear image of the electric component 32 is taken. For holding and mounting the electric component 32, only the suction nozzle 500 is vertically moved with the fiducial mark 514 held at the same position, and the fiducial mark 514 will not interfere with the electric components 32 already mounted on the printed-wiring board 24, when the next electric component 32 is mounted.

In the present embodiment wherein the two light emitting bodies 508, 518 partially overlap each other, and do not provide a gap therebetween in the radial direction of the suction pipe 510, so that the imaging area 126 does not include a shadow which would be caused by a small gap if left between the light emitting bodies 508, 518 and which would adversely influence the accuracy of processing of image data of the electric component 32 and fiducial mark 514. Thus, the present arrangement assures highly accurate processing of the image data. Further, since the light emitting body 508 of the suction nozzle 500 is located below the light emitting body 518 for the fiducial mark 514, the electric component 32 is illuminated with a sufficient intensity of light emitted from the light emitting body 508, so that the electric component 32 can be imaged with a high degree of clarity. In addition, the suction nozzle 50 with its light emitting body 508 being located below the light emitting body 518 can be vertically moved and rotated without an interference between the light emitting bodies 508, 518, so that the angular position of the electric component 32 can be suitably compensated for the angular positioning error, by rotating the suction nozzle 500. The light emitting body 508 has a circular shape in transverse cross section, so that the attitude of the light emitting body 508 as viewed from the light emitting body 518 remains unchanged irrespective of a rotation of the suction nozzle 500.

The embodiment of FIGS. 31 and 32 may be modified such that the fiducial mark 514 is vertically movable, while the embodiment of FIGS. 29 and 30 may be modified such that the fiducial mark 464 is stationary.

Further, the embodiments of FIG. 1 through FIG. 26 may be modified such that the suction nozzle is provided with a light emitting body, to take a silhouette or projection image or images of the electric component 32 and/or the fiducial mark, as in the embodiments of FIG. 27 through FIG. 32. On the other hand, the embodiments of FIGS. 27–32 may be modified to use an illuminating device in place of the light emitting body provided on the suction nozzle, so that a normal image of the electric component is taken by the image-taking device, as in the embodiments of FIGS. 1–26.

Where the suction nozzle is vertically movable by a vertical drive device using a servomotor, for instance, in the axial direction of the suction pipe, the image of the electric component may be taken when the suction nozzle is located at a position at which the fiducial mark is flush with the bottom surface of the electric component which is imaged by the image-taking device and at which the electric component is mounted on the printed-wiring board. In this case, the vertical drive device also serves as a relative-movement device operable to move the suction nozzle and the image-taking device relative to each other in the axial direction of the suction pipe.

Where a plurality of fiducial marks, for example, two fiducial marks are provided, a relative position between one of the two fiducial marks and the nozzle axis A (axis of the nozzle holder) may be obtained to obtain the position of the nozzle Axis for detecting the positioning error of the electric component as held by the suction nozzle, as in the embodiment of FIGS. 1–11. However, the position of the axis of rotation of the suction pipe, that is, the nozzle axis can be obtained on the basis of the images of the two fiducial marks which are taken with the image of the electric component held by the suction nozzle, so that the position of the nozzle axis may be obtained on the basis of the images of the two fiducial marks taken with the image of the electric component, for detecting the positioning error of the electric component held by the suction nozzle.

Where a determination as to whether the expected service life of the suction nozzle has been reached is made on the basis of the amount of bending of the suction pipe, it is not necessary to obtain the position of the nozzle axis, since the bending of the suction pipe can be obtained on the basis of the amount of deviation of the center of the lower end face of the suction pipe relative to the centerline of the suction nozzle, for instance, relative to the centerline of the nozzle body. Where a plurality of fiducial marks, for example, two fiducial marks are provided in this case, the amount of deviation of the center of the lower end face of the suction pipe relative to the centerline of the suction nozzle can be obtained on the basis of the distances of the two fiducial marks to the center of the lower end face of the suction pipe. If the center of the lower end face of the suction pipe deviates from the centerline of the suction nozzle, the distance of at least one of the two fiducial marks to the center of the lower end face of the suction pipe changes with respect to the nominal value, so that the determination as to whether the expected service life of the suction nozzle has been reached can be made on the basis of the amount of change of the above-indicated distance.

The determination as to whether the expected service life of the suction nozzle has been reached due to the bending of the suction pipe can be made even where the suction nozzle is not rotatable, provided a plurality of fiducial marks, for example, two fiducial marks are provided. The amount and direction of the bending of the suction pipe can be detected on the basis of the images of the two or more fiducial marks and according to a known relationship between the positions of the fiducial marks and the nominal position of the centerline of the suction pipe.

Although the position of the nozzle axis A is obtained on the basis of the image of the fiducial mark 90 in the embodiment of FIGS. 1–11, the position of the nozzle axis A may be obtained on the basis of the image of the lower end face 88 of the suction pipe 84.

In the embodiment of FIGS. 1–11, the electric component is held by the suction nozzle and is imaged when the suction nozzle is placed in the nominal angular position which is set when the relative position between the fiducial mark and the nozzle axis A is obtained. It is not essential to establish the nominal angular position of the suction nozzle when the electric component is held and imaged. The position of the axis of the suction nozzle can be calculated on the basis of the image of the fiducial mark and the known relationship (in angle and direction) between the nominal angular position of the suction nozzle (which is set when the relative position of the fiducial mark and the nozzle axis A is obtained) and the actual angular position of the suction nozzle when the electric component is held by the suction nozzle and imaged.

In the embodiment of FIGS. 1–11, the operation to obtain the position of the nozzle axis A when the images of the electric component and fiducial mark are obtained is facilitated by defining the above-indicated relative position with respect to the nominal angular position of the suction nozzle at which the straight line passing the fiducial mark and the nozzle axis is parallel to the X-axis. However, this arrangement is not essential, provided the image of the suction nozzle is obtained to obtain the position of the nozzle axis, in the angular position of the suction nozzle at which the angle represented by the output of the encoder for the rotary drive device is zero. In this case, the relative position between the fiducial mark and the nozzle axis is obtained in the above-indicated angular position of the suction nozzle, when the electric component is held by the suction nozzle and imaged.

Where the suction nozzle 60 is positioned relative to the nozzle holder 62 in the radial and circumferential directions, with a high degree of reproducibility in the positioning accuracy when the suction nozzle 60 is repeatedly mounted and removed on and from the nozzle holder 62, it is not essential to detect the bending of the suction pipe each time the suction nozzle is mounted on the nozzle holder, even where only one fiducial mark is provided. In this case, the position of the nozzle holder is compensated on the basis of the amount and direction of the bending of the suction pipe detected for the electric component 32 which has been detected last. This compensation is continued until a predetermined condition for updating the detection of the bending is satisfied.

While the illustrated embodiments described above are arranged such that only one suction nozzle is held by the nozzle holder, a plurality of suction nozzles may be held by the nozzle holder. The same fiducial mark may be used commonly for all or some of the suction nozzles, or a plurality of fiducial marks may be provided for the respective suction nozzles.

In the illustrated embodiments, the different kinds of suction nozzle have the same length of the suction pipe. However, the suction pipes of the different kinds of suction nozzle have different lengths. In this case, the image-taking device may be arranged to be movable in the axial direction of the suction pipe, to move its focusing point, if necessary when the images of the electric component and the fiducial mark are taken.

While the illustrated embodiments are adapted to instantaneously take the images of the electric component and the fiducial mark, by activating the strobe light at the time when the suction nozzle has moved to the predetermined image-taking position during the movement of the suction nozzle, a shutter of the image-taking device may be opened when the suction nozzle has moved to the image-taking position, for instantaneously taking the images of the electric component and fiducial mark.

The suction nozzle may be movable by a suitable relative-movement device in only the radial direction of the suction pipe. In this case, a plurality of suction nozzles may be provided on a rotary member which is rotatable by a suitable rotary drive device about an axis, to move the suction nozzles in the rotating direction of the rotary member such that the suction nozzles are stopped at a plurality of operating positions which are arranged in the rotating direction of the rotary member. The axis of rotation of the rotary member may be parallel or inclined to the vertical direction. The rotary member may be rotated intermittently, or continuously rotated by a desired angle in the forward or reverse direction. Where the plurality of suction nozzles are provided on the rotary member, one of the operating positions is used as the image-taking position at which the image-taking device is disposed to perform an imaging operation while one of the suction nozzles is stopped at that image-taking position. Alternatively, the image-taking device may be provided between two adjacent ones of the operating positions, to perform the imaging operation during the movement of the suction nozzle between the adjacent operating positions.

The vertical drive device provided to vertically move the suction nozzle in the axial direction of the suction pipe may include a hydraulically operated actuator such as a hydraulic cylinder. Where the vertical drive device includes the hydraulic cylinder and is not capable of controlling the position of the suction nozzle as desired, and where the fiducial mark is disposed on a member other than the suction nozzle such that the fiducial mark is stationary, the position of the fiducial mark is determined on the basis of the uppermost end of the suction nozzle corresponding to the upper stroke end of the hydraulic cylinder, while taking account of a difference of the height dimensions of a plurality of kinds of electric components to be held by the suction nozzle.

Although the encoders used in the illustrated embodiments to detect the rotating angles of the various motors are of absolute type arranged to detect the absolute value of the rotating angle with respect to the nominal angular position, the encoders may be of increment type arranged to detect a change of the angle of rotation with respect to the last angular position.

The principle of the present invention is applicable to suction nozzles and method of detecting positioning errors of electric components held by the suction nozzles, in a system other than the electric-component mounting system 12, provided that the suction nozzles are used to hold and transfer the electric components.

The present invention may be embodied in any possible combination of the illustrated embodiments described above.

While some presently preferred embodiments of the present invention have been described above, for illustrative purpose only, it is to be understood that the present embodiment may be embodied with various changes and improvements, such as those described in the SUMMARY OF THE INVENTION, which may occur to those skilled in the art.

What is claimed is:

1. An electric-component handling device comprising:
   a suction nozzle including (a) a nozzle body, and (b) a suction pipe extending from said nozzle body;
   a fiducial mark disposed at a predetermined position relative to said suction pipe;
   an image-taking device operable to take an image of an electric component held by suction by said suction pipe, and an image of said fiducial mark, in a longitudinal direction of said suction pipe;
   a relative-movement device operable to move said image-taking device and said suction nozzle relative to each other, in at least a direction intersecting said longitudinal direction of said suction pipe, so as to pass a relative position therebetween at which said electric component held by said suction pipe and said fiducial mark are concurrently located within a field of vision of said image-taking device; and
   an image data processing device operable to process said images of said electric component and said fiducial mark taken by said image-taking device, for obtaining a relative position between said fiducial mark and said electric component, and to obtain a position of said electric component relative to a nominal position of said suction pipe, on the basis of the obtained relative position between said fiducial mark and said electric component, and a known relative position between said fiducial mark and said nominal position of said suction pipe.

2. The electric-component handling device according to claim 1, wherein said fiducial mark is disposed on said nozzle body such that said fiducial mark is spaced from said suction pipe in a radial direction of said suction pipe.

3. An electric-component handling device comprising:
   a suction nozzle including (a) a nozzle body, and (b) a suction pipe extending from said nozzle body and a sucking end;

a fiducial mark disposed at a predetermined position relative to said suction pipe;

an image-taking device operable to take a set of images of an end face of said sucking end of said suction pipe and said fiducial mark, and a set of images of an electric component held by said suction pipe and said fiducial mark, in a longitudinal direction of said suction pipe;

a relative-movement device operable to move said image-taking device and said suction nozzle relative to each other, in at least a direction intersecting said longitudinal direction of said suction pipe, to a relative position therebetween at which said suction nozzle and said image-taking device are opposed to each other; and an image data processing device operable to process said images of said end face of said suction pipe and said fiducial mark taken by said image-taking device, for detecting a relative position between said end face and said fiducial mark, and to process said images of said electric component and said fiducial mark, for determining a peripheral profile of said end face of said suction pipe which partially projects beyond a peripheral profile of said electric component, on the basis of the detected relative position between said end face and said fiducial mark, and obtaining a position of said electric component relative to a nominal position of said suction pipe, while taking account of the determined peripheral profile of said end face of said suction pipe.

4. The electric-component handling device according to claim 3, wherein said fiducial mark is disposed on said nozzle body such that said fiducial mark is spaced from said suction pipe in a radial direction of said suction pipe.

5. An electric-component handling device comprising:

a suction nozzle including (a) a nozzle body, and (b) a suction pipe extending from said nozzle body and a sucking end;

a fiducial mark disposed at a predetermined position relative to said suction pipe;

an image-taking device operable to take an image of an end face of said sucking end of said suction pipe and said fiducial mark, in a longitudinal direction of said suction pipe;

a relative-movement device operable to move said image-taking device and said suction nozzle relative to each other, in at least a direction intersecting said longitudinal direction of said suction pipe, to a relative position therebetween at which said suction nozzle and said image-taking device are opposed to each other; and an image data processing device operable to process said images of said end face of said suction pipe and said fiducial mark taken by said image-taking device, to obtain a relative position between said fiducial mark and said end face, and to detect a bending of said suction pipe on the basis of the obtained relative position between said fiducial mark and said end face.

6. The electric-component handling device according to claim 5, wherein said fiducial mark is disposed on said nozzle body such that said fiducial mark is spaced from said suction pipe in a radial direction of said suction pipe.

7. An electric-component handling device comprising:

a suction nozzle including (a) a nozzle body, and (b) a suction pipe extending from said nozzle body and a sucking end;

a fiducial mark disposed at a predetermined position relative to said suction pipe;

an image-taking device operable to take an image of said fiducial mark in a longitudinal direction of said suction pipe;

a relative-movement device operable to move said image-taking device and said suction nozzle relative to each other, in at least a direction intersecting said longitudinal direction of said suction pipe, to a relative position therebetween at which said suction nozzle and said image-taking device are opposed to each other; and an image data processing device operable to process said image of said fiducial mark taken by said image-taking device, to determine an angular position of said suction pipe.

8. The electric-component handling device according to claim 7, wherein said fiducial mark is disposed on said nozzle body such that said fiducial mark is spaced from said suction pipe in a radial direction of said suction pipe.

* * * * *